(12) United States Patent
Nakamizo et al.

(10) Patent No.: US 9,281,077 B2
(45) Date of Patent: *Mar. 8, 2016

(54) SHIFT REGISTER AND DISPLAY DEVICE

(75) Inventors: Masahiko Nakamizo, Osaka (JP); Masashi Yonemaru, Osaka (JP); Kenichi Ishii, Osaka (JP); Yasuaki Iwase, Osaka (JP)

(73) Assignee: SHARP KABUSHIKI KAISHA, Osaka-Shi (JP)

( * ) Notice: Subject to any disclaimer, the term of this patent is extended or adjusted under 35 U.S.C. 154(b) by 1176 days.

This patent is subject to a terminal disclaimer.

(21) Appl. No.: 13/202,950

(22) PCT Filed: Oct. 23, 2009

(86) PCT No.: PCT/JP2009/068226
§ 371 (c)(1),
(2), (4) Date: Nov. 7, 2011

(87) PCT Pub. No.: WO2010/097986
PCT Pub. Date: Sep. 2, 2010

(65) Prior Publication Data
US 2012/0044133 A1 Feb. 23, 2012

(30) Foreign Application Priority Data

Feb. 25, 2009 (JP) .................................. 2009-042945
Jun. 5, 2009 (JP) .................................. 2009-136330

(51) Int. Cl.
*G09G 3/36* (2006.01)
*G11C 19/28* (2006.01)

(52) U.S. Cl.
CPC .............. *G11C 19/28* (2013.01); *G09G 3/3674* (2013.01)

(58) Field of Classification Search
CPC .............................. G09G 3/3674; G11C 19/28
USPC .................... 345/87–100; 377/64, 69, 78, 79; 327/241

See application file for complete search history.

(56) References Cited

U.S. PATENT DOCUMENTS 4,110,664 A * 8/1978 Asars ................... G01R 13/405
345/208
4,578,597 A 3/1986 Soneda et al.
5,646,642 A 7/1997 Maekawa et al.
(Continued)

FOREIGN PATENT DOCUMENTS

JP 58-151719 9/1983
JP 02-246098 10/1990
(Continued)

OTHER PUBLICATIONS

International Search Report and Written Opinion mailed Feb. 2, 2010 directed towards counterpart application No. PCT/JP2009/068226; 6 pages.

(Continued)

*Primary Examiner* — Prabodh M Dharia
(74) *Attorney, Agent, or Firm* — Morrison & Foerster LLP

(57) ABSTRACT

A shift register includes series-connection circuits to transmit a shift pulse. The series-connection circuits include a continuous stage group with continuous stages. Each stage of the continuous stage group includes a first output transistor, a first capacitor, an input gate, a first switching element, a second switching element, a third switching element, and a fourth switching element.

4 Claims, 32 Drawing Sheets

(56) References Cited

U.S. PATENT DOCUMENTS

| | | | |
|---|---|---|---|
| 5,748,026 A | 5/1998 | Maekawa et al. | |
| 6,072,456 A * | 6/2000 | Karube et al. | 345/98 |
| 6,295,046 B1 | 9/2001 | Hebiguchi | |
| 6,426,743 B1 | 7/2002 | Yeo et al. | |
| 6,556,646 B1 | 4/2003 | Yeo et al. | |
| 7,830,352 B2 * | 11/2010 | Shi et al. | 345/100 |
| 8,106,874 B2 * | 1/2012 | Chiang et al. | 345/100 |
| 8,305,330 B2 * | 11/2012 | Fang et al. | 345/100 |
| 8,384,461 B2 * | 2/2013 | Yonemaru et al. | 327/241 |
| 8,731,135 B2 * | 5/2014 | Yonemaru et al. | 377/64 |
| 2003/0002615 A1 | 1/2003 | Morosawa et al. | |
| 2005/0008114 A1 | 1/2005 | Moon | |
| 2006/0132182 A1 | 6/2006 | Kikuchi | |
| 2006/0158409 A1 * | 7/2006 | Shi et al. | 345/87 |
| 2007/0148793 A1 * | 6/2007 | Yoshida | G09G 3/2096 438/14 |
| 2007/0248205 A1 | 10/2007 | Deane | |
| 2008/0094343 A1 * | 4/2008 | Osame | G09G 3/3275 345/99 |
| 2008/0191994 A1 * | 8/2008 | Chiang | G11C 19/28 345/100 |
| 2009/0267924 A1 * | 10/2009 | Shimizu | G09G 3/3677 345/204 |
| 2011/0001732 A1 | 1/2011 | Morii et al. | |
| 2012/0044133 A1 | 2/2012 | Nakamizo et al. | |
| 2012/0076256 A1 * | 3/2012 | Yonemaru et al. | 377/79 |
| 2012/0087459 A1 * | 4/2012 | Nakamizo et al. | 377/64 |
| 2012/0194489 A1 | 8/2012 | Iwamoto et al. | |
| 2012/0307959 A1 | 12/2012 | Furuta et al. | |
| 2012/0326955 A1 | 12/2012 | Ohara | |
| 2013/0028370 A1 | 1/2013 | Kikuchi et al. | |
| 2013/0044854 A1 * | 2/2013 | Yonemaru et al. | 377/64 |
| 2013/0170606 A1 | 7/2013 | Matsui | |

FOREIGN PATENT DOCUMENTS

| | | |
|---|---|---|
| JP | 6-216753 | 8/1994 |
| JP | 11-086586 | 3/1999 |
| JP | 2000-155550 | 6/2000 |
| JP | 2003-16794 | 1/2003 |
| JP | 2003-346492 | 12/2003 |
| JP | 2005-50502 | 2/2005 |
| JP | 2006-106320 | 4/2006 |
| JP | 2006-178165 | 7/2006 |
| JP | 2008-508654 | 3/2008 |
| WO | WO-2010/097986 | 9/2010 |

OTHER PUBLICATIONS

International Search Report and Written Opinion mailed Feb. 15, 2011, directed to International Application No. PCT/JP2010/070135; 6 pages.

Yonemaru et al., U.S. Office Action mailed Sep. 27, 2013, directed to U.S. Appl. No. 13/575,448; 7 pages.

Yonemaru et al., U.S. Requirement for Restriction/Election mailed Aug. 19, 2013, directed to U.S. Appl. No. 13/575,448; 6 pages.

\* cited by examiner

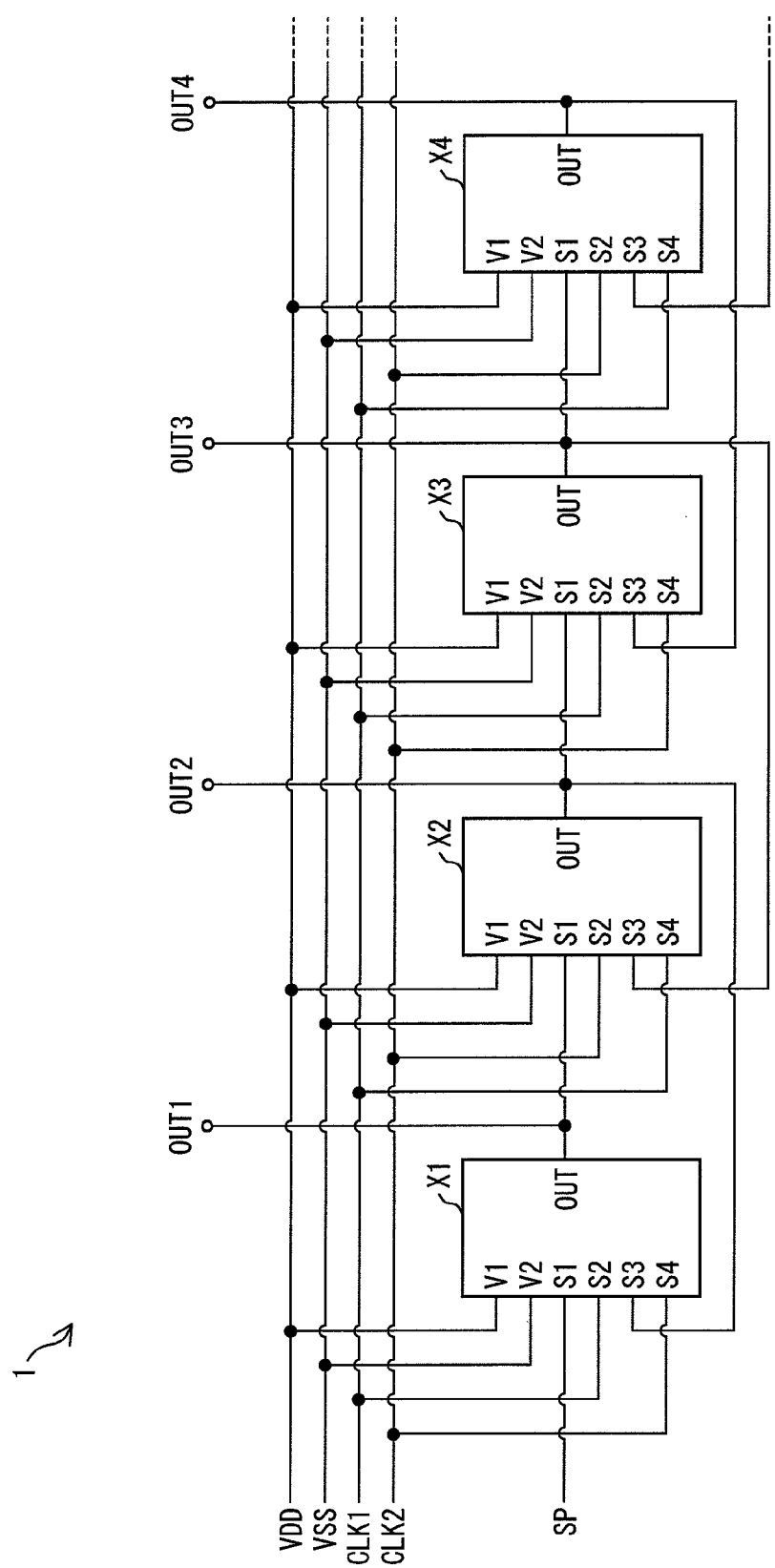
F I G. 2

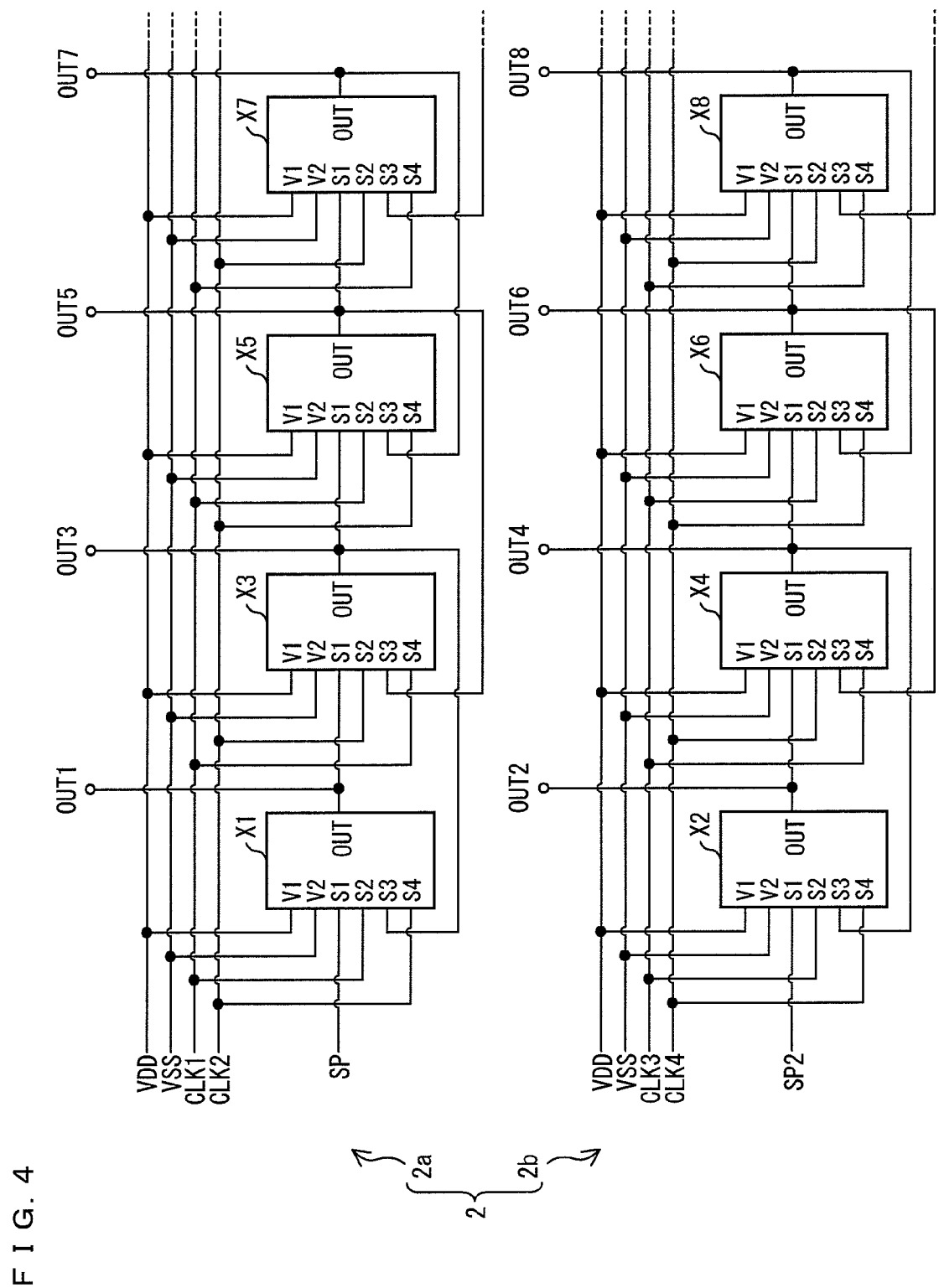
F I G. 4

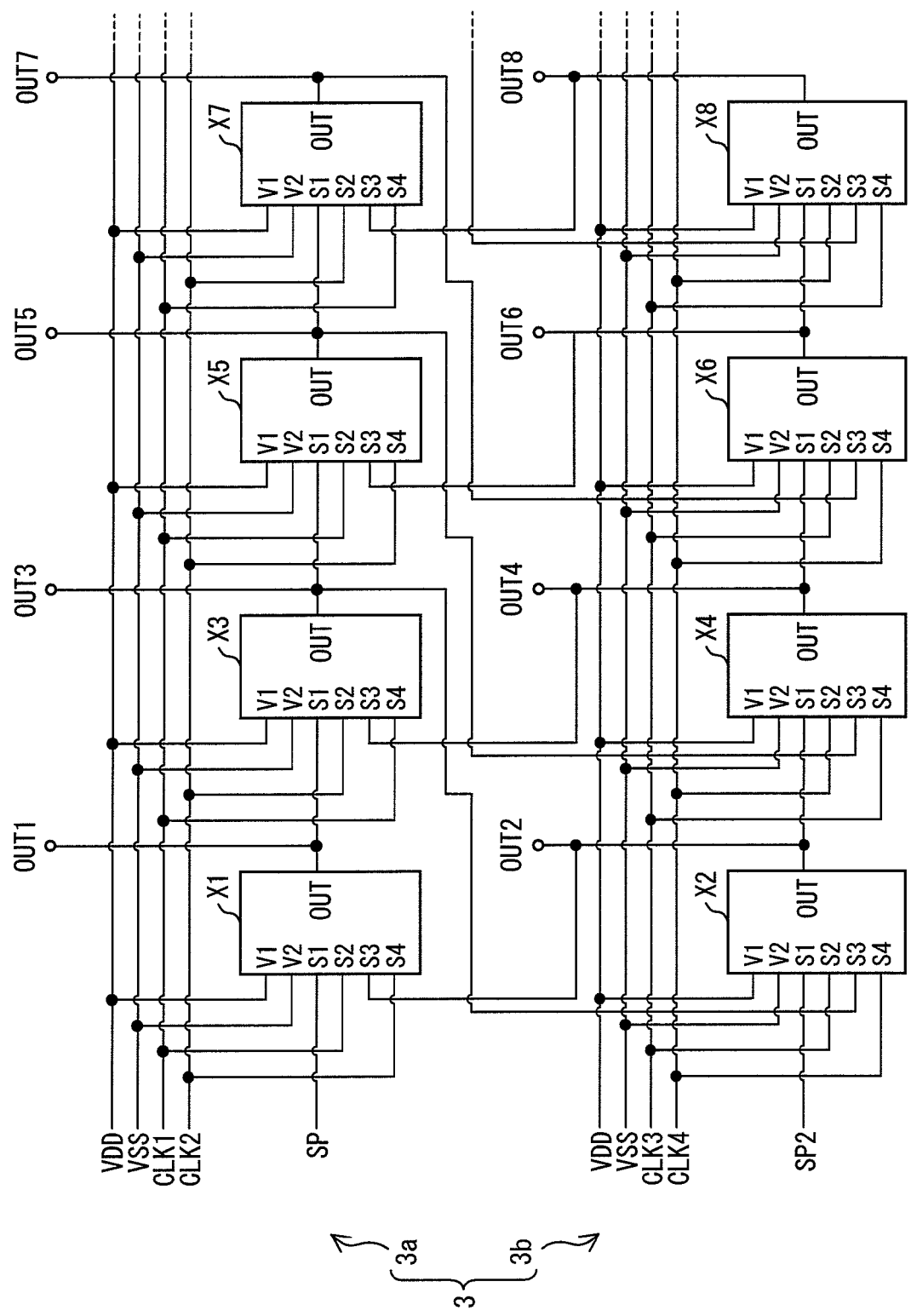
F I G . 6

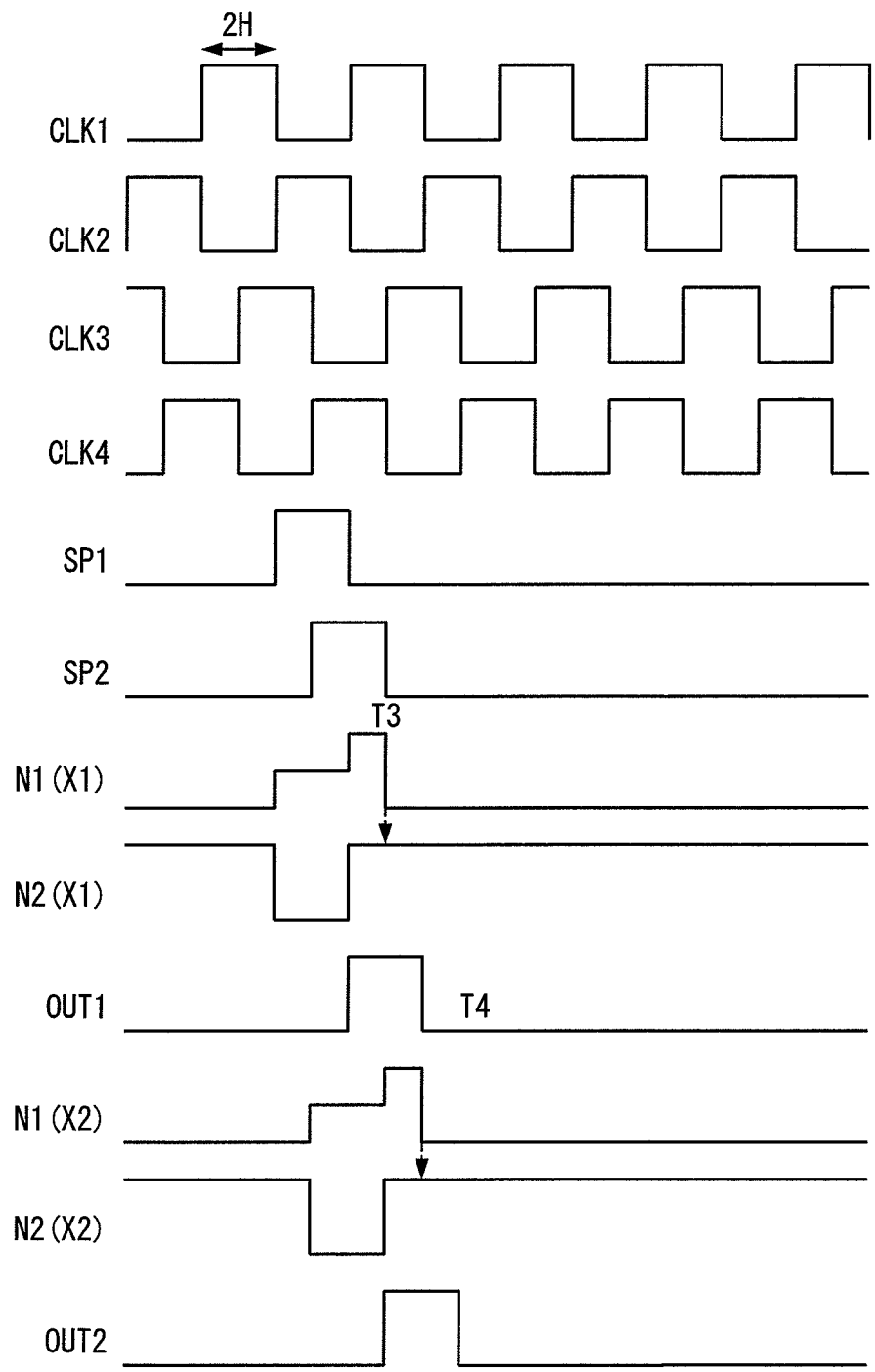
F I G. 8

F I G. 1 3
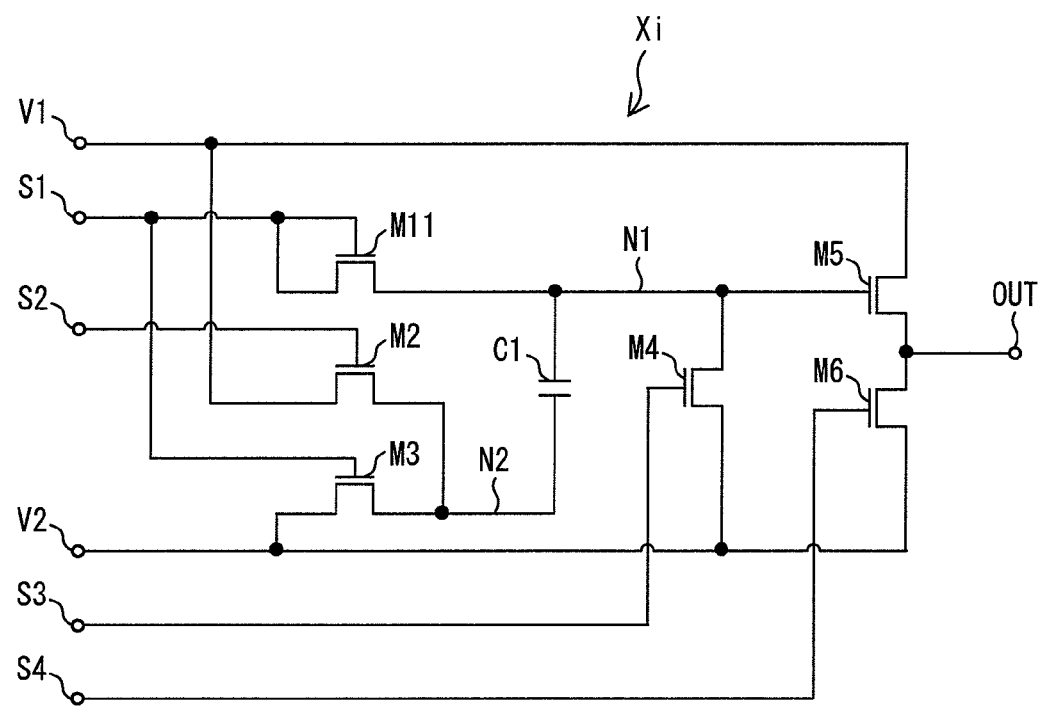

F I G. 1 9
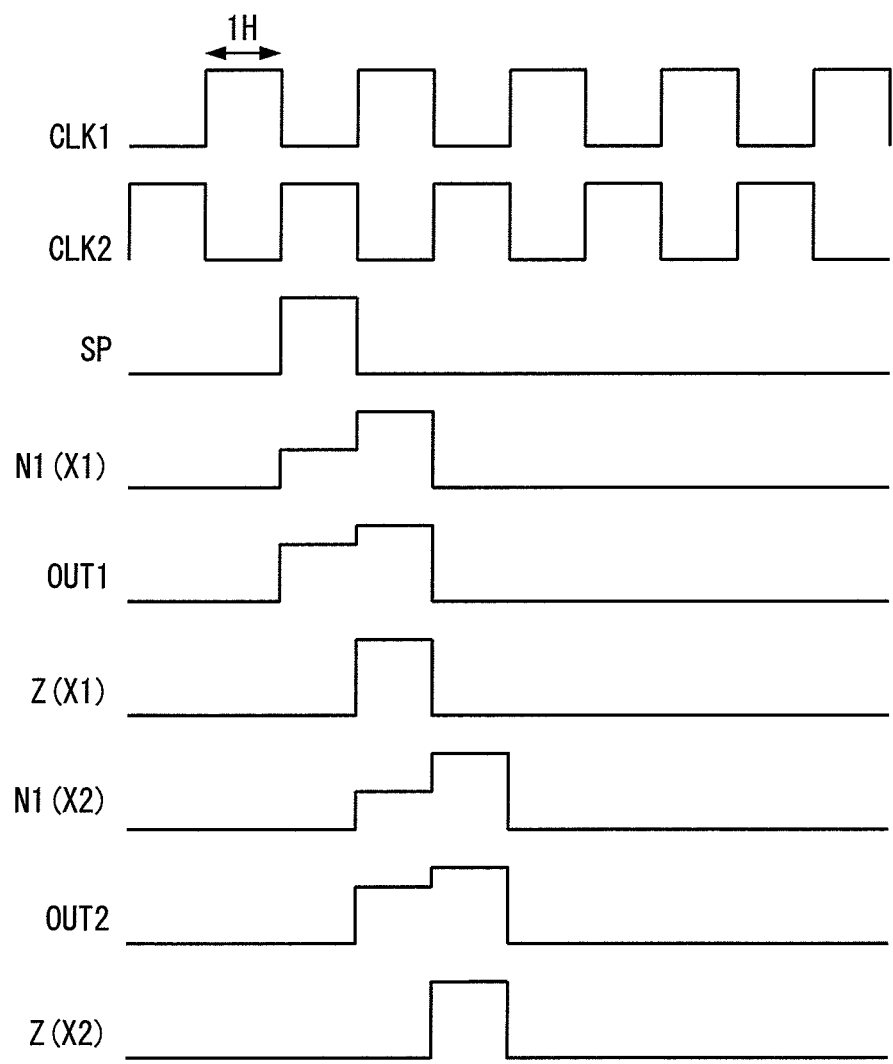

F I G. 2 0
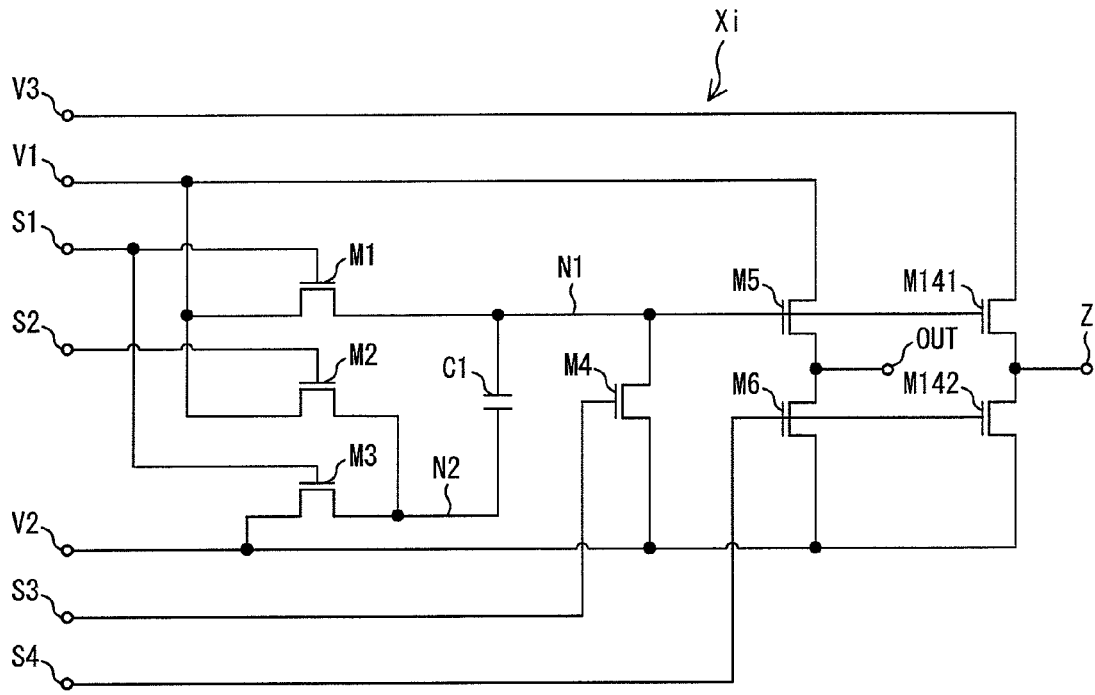
F I G. 2 1
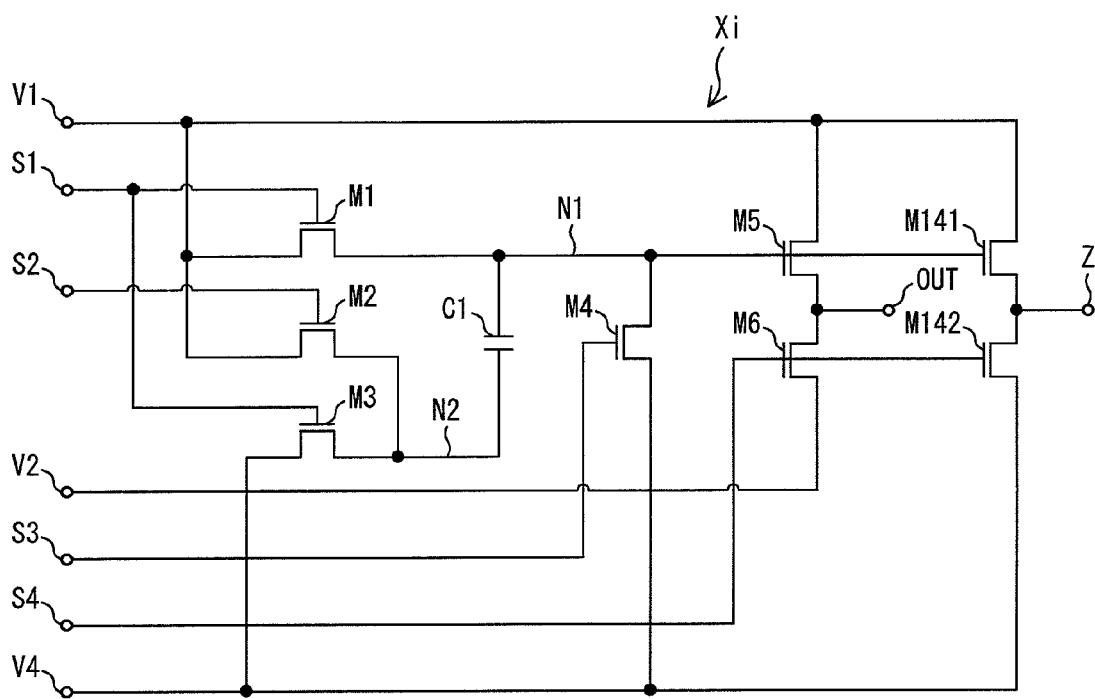

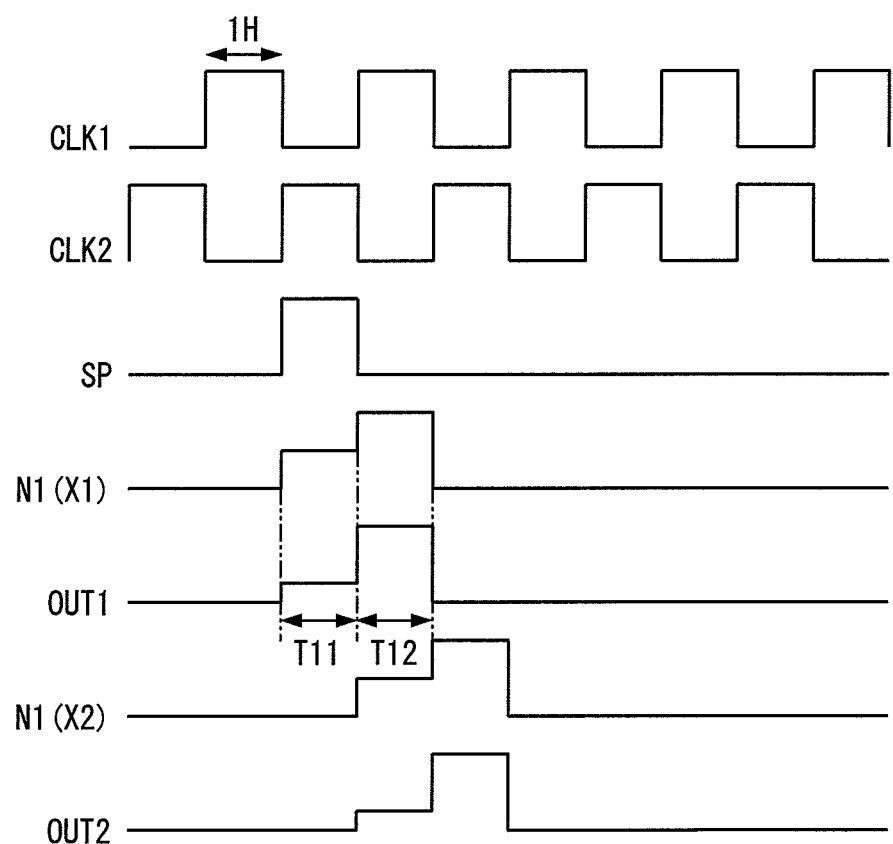
F I G. 2 4

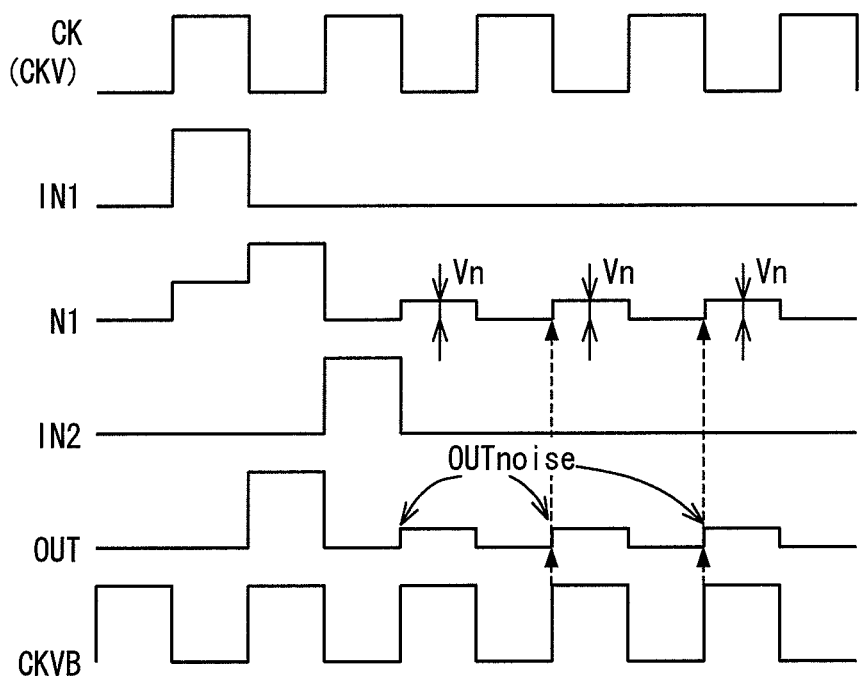
F I G. 3 0

F I G. 3 2
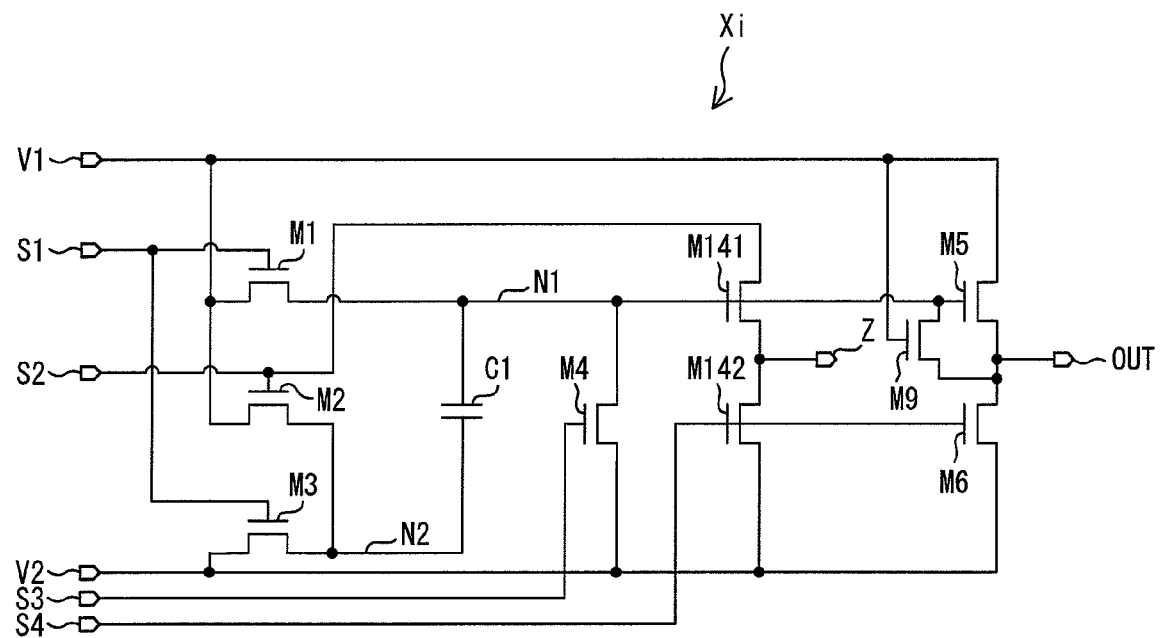

F I G. 3 4
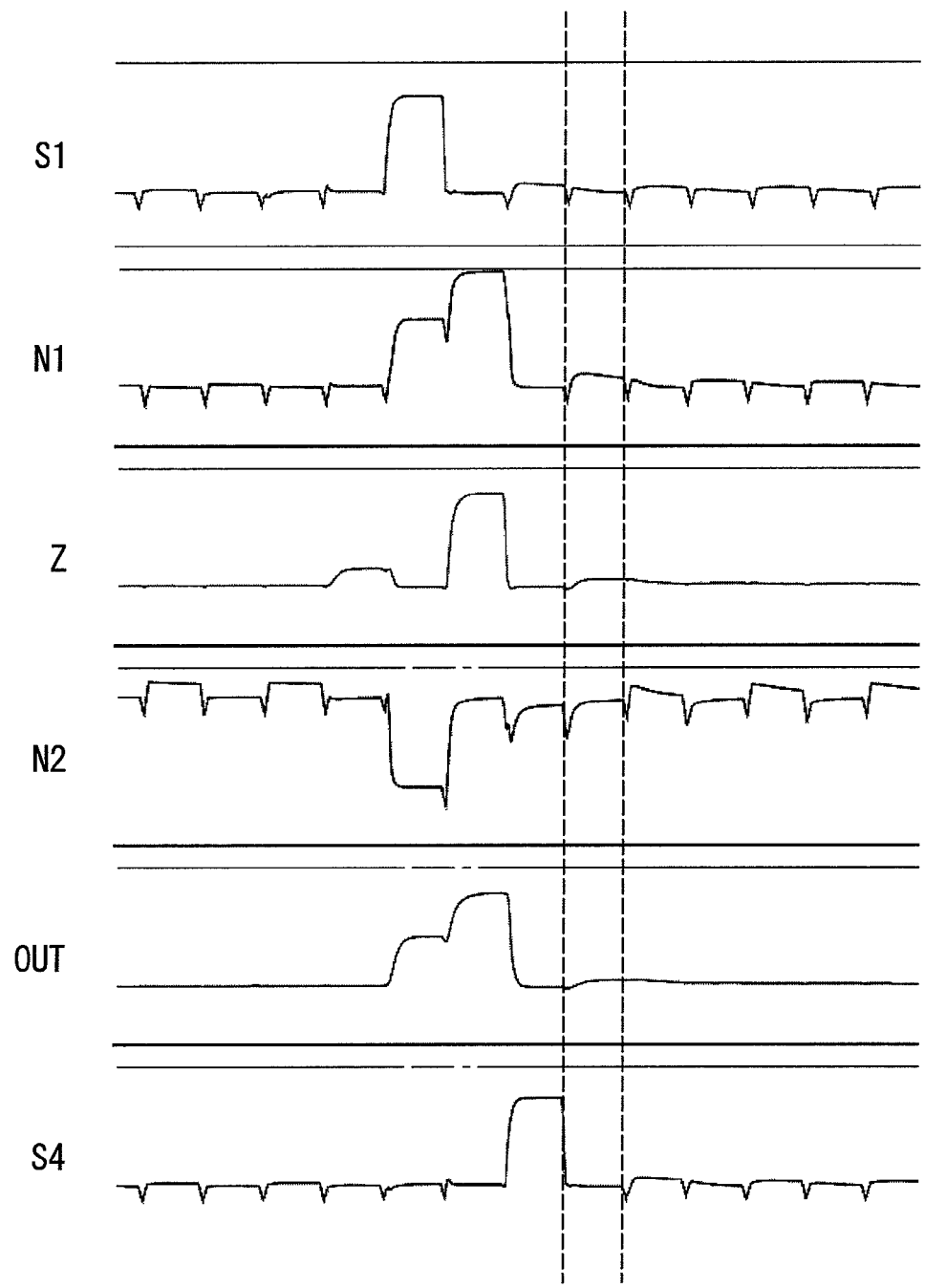

US 9,281,077 B2

SHIFT REGISTER AND DISPLAY DEVICE

REFERENCE TO RELATED APPLICATIONS

This application is a national stage application under 35 USC 371 of International Application No. PCT/JP2009/068226, filed Oct. 23, 2009, which claims the priority of Japanese Patent Application Nos. 2009-42945, filed Feb. 25, 2009, and 2009-136330, filed Jun. 5, 2009, the contents of all of which prior applications are incorporated herein by reference.

TECHNICAL FIELD

The present invention relates to a shift register used in a gate driver etc. of a display panel.

BACKGROUND ART

Recently, there has been widely employed a gate monolithic configuration in which a gate driver made of amorphous silicon is formed on a liquid crystal panel in order to reduce costs. The gate monolithic is also referred to as gate driverless, panel-built-in driver, gate-in panel etc.

FIG. 27 shows a configuration of such a gate driver (scan drive circuit) described in Patent Literature 1.

The gate driver is configured such that a plurality of unit stages SRC11, SRC12, . . . SRC1N, and SRC1D are serially connected with one another. A clock is inputted to a clock terminal CK of each unit stage in such a manner that a first clock CKV is inputted to an odd stage and a second clock CKVB is inputted to an even stage. The phase of the first clock CKV is reverse to that of the second clock CKVB. An output terminal OUT outputs a gate signal (G1, G2, . . . , GN, and GD) to be supplied to a gate bus line.

A scan start signal STV is inputted to a first input terminal IN1 of a first unit stage SRC11. To first input terminals IN1 of subsequent stages SRC12, SRC13, . . . , SRC1N, and SRC1D are inputted gate signals outputted from respectively previous stages. To second input terminals IN2 of the unit stages SRC11, SRC12, . . . , and SRC1N are inputted gate signals outputted from respectively next unit stages. Each unit stage includes a first voltage terminal VOFF.

CITATION LIST

Patent Literatures

[Patent Literature 1]
Japanese Patent Application Publication, Tokukai No. 2005-50502 (published on Feb. 24, 2005)
[Patent Literature 2]
Japanese Patent Application Publication, Tokukai No. 2000-155550 (published on Jun. 6, 2000)
[Patent Literature 3]
Japanese Patent Application Publication, Tokukai No. 2003-016794 (published on Jan. 17, 2003)
[Patent Literature 4]
Japanese Patent Application Publication, Tokukaihei No. 6-216753 (published on Aug. 5, 1994)
[Patent Literature 5]
Japanese Patent Application Publication, Tokukai No. 2003-346492 (published on Dec. 5, 2003)

SUMMARY OF INVENTION

Technical Problem

Patent Literature 1 discloses a circuit configuration of a unit stage 100 shown in FIG. 28, which is any of the unit stages SRC11, SRC12, . . . SRC1N, and SRC1D. The unit stage 100 includes a buffer section 110, a charge section 120, a drive section 130, a discharge section 140, and a holding section 150.

With respect to the operation of this circuit, assume that a first clock CKV or a second clock CKVB shown in FIG. 29, which has been set by the applicant of the present application, is inputted to the unit stage 100. That is, assume that in a case where the unit stage 100 is an odd one, the first clock CKV shown in FIG. 29 is inputted to the clock terminal CK, and in a case where the unit stage 100 is an even one, the second clock CKVB shown in FIG. 29 is inputted to the clock terminal CK. The phase of the first clock CKV is reverse to that of the second clock CKVB.

Here, the unit stage 100 in an even number is discussed as an example.

As shown in FIG. 29, when a gate pulse is inputted from a previous unit stage 100 to the first input terminal IN1, i.e. a gate and a drain of a transistor Q1 in the buffer section 110, the transistor Q1 is made ON, which charges a capacitor C of the charge section 120. This makes a transistor Q2 of the drive section 130 ON. When the gate pulse supplied from the previous stage to the first input terminal IN1 gets Low and the transistor Q1 is made OFF and then a High level of the second clock CKVB is outputted to a drain of the transistor Q2, a potential of a node N1 is raised due to a bootstrap effect of the capacitor C, the resistance of a channel of the transistor Q2 gets sufficiently low, and a gate pulse having an amplitude substantially equal to that of a clock signal is outputted from an output terminal OUT.

Further, when the gate pulse is inputted to the unit stage 100 in a next stage and is outputted from the unit stage 100 in the next stage, the gate pulse is inputted to a second input terminal IN2 of the unit stage 100 in the present stage. This puts a transistor Q3 of the drive section 130 and a transistor Q4 of the discharge section 140 in an ON state, and the output terminal OUT, the gate bus line, and the node N1 get connected with a first voltage terminal VOFF and reset to a Low level.

During a period in which other unit stage 100 operates, a transistor Q5 of the holding section 150 is put in an ON state each time the second clock CKVB inputted to the clock terminal CK gets High.

Further, the unit stage 100 in an odd stage carries out the same operation with timing shifted by 1 clock pulse from timing shown in FIG. 29.

The gate monolithic circuit configuration enables improving drive performance by sufficiently reducing the resistance of a channel of an output transistor such as the transistor Q2 due to bootstrap effect. This brings an advantage that even when a gate driver is formed on a panel monolithically using a material such as amorphous silicon from which only an n-channel TFT can be produced, it is possible to sufficiently overcome disadvantageous properties of the amorphous silicon TFT such as a high threshold voltage and low electron mobility, thereby addressing a request for dropping the voltage of a panel.

However, a conventional gate monolithic circuit has a problem that an output transistor indicated by the transistor Q2 of FIG. 28 includes a gate-drain parasitic capacitor (hereinafter drain parasitic capacitor) and a gate-source parasitic capacitor (hereinafter source parasitic capacitor), and consequently a gate output waveform is distorted.

A clock voltage from the clock terminal CK is always applied to the drain of the transistor Q2. Consequently, even during a period in which the transistor Q2 is to be made OFF, variation DN in a potential of the node N1 is generated through a drain parasitic capacitor as a result of so-called feed-through phenomenon, generating leakage in the transistor Q2. If the leakage in the transistor Q2 is generated, a leaked signal LO is outputted from the output terminal OUT during a period in which a gate output is to be made OFF.

In a case where the variation DN in the potential of the node N1 is generated through drain parasitic capacitor as a result of the feed-through phenomenon, if the potential of the node N1 exceeds a threshold potential of the transistor Q2, the transistor Q2 is put in an ON state. Consequently, as shown in FIG. 30, a clock is leaked to a source of the transistor Q2 and outputted there. This source output raises the potential of the node N1 via the capacitor C, so that the potential of the node N1 becomes higher by Vn during a clock pulse period, and a pulse OUTnoise which rises with a pulse width equal to a period of a clock pulse is outputted to the output terminal OUT.

During a period in which a gate pulse is to be outputted to the output terminal OUT, the variation DN in the potential of the node N1 through drain parasitic capacitor reduces the resistance of the channel of the transistor Q2 and increases a current, thereby improving drive performance of the transistor Q2. However, timing for outputting a gate pulse to the output terminal OUT is once in one frame, and so variation DN in potential of the node N1 outside the gate pulse output period will be a nose. For example, a panel with resolution of WXGA includes 768 gate bus lines. Rise in the potential of the node N1 in (i) the period corresponding to 767 clocks other than the period during which each stage outputs a gate pulse to a gate bus line corresponding to the stage and (ii) a vertical blanking period which is defined by a vertical sync signal Vsync and is positioned between frames becomes a noise.

Source parasitic capacitor raises the potential of the node N1 when a gate pulse is outputted, and accordingly the source parasitic capacitor is advantageous for increasing drive performance of the transistor Q2. Such effect can be yielded to some extent merely by source parasitic capacitor. Boot strap capacitor shown as a capacitor C at the transistor Q2 in FIG. 28 actively increases such effect by providing capacitor in parallel to the source parasitic capacitor. However, when this method is employed, the boot strap effect is not exerted until the potential of the output terminal OUT rises completely. This leads to a disadvantage that rise TR of a gate pulse is slow. Slowness of rise TR results in distortion of a waveform of a gate pulse.

As described above, the stage configuration shown in FIG. 28 has a problem of causing a noise in a stage output. Further, since individual stage outputs are inputted to next stages, the noise in the stage output is sequentially transmitted to later stages, which may cause malfunction of the shift register.

In order to deal with this problem, there has been conceived a configuration in which circuits are additionally provided to prevent accumulation of noises in the stage output and transmission of the noises, as shown in FIG. 31 indicating another stage configuration of Patent Literature 1.

FIG. 31 shows a configuration in which transistors Q45 and Q46 are provided, and every time a clock is raised during a period other than the gate pulse output period, the output terminal OUT and the gate bus line get connected with a first voltage terminal VOFF so that the output terminal OUT and the gate bus line are kept at a Low level. In this case, in order that the transistor Q45 operates, there is provided a control circuit made of transistors Q31-Q34. Further, in order that the output terminal OUT and the gate bus line are connected with the first voltage terminal VOFF for a longer time, a first clock terminal CK1 and a second clock terminal CK2 are provided in a unit stage 400 and clocks with opposite phases are inputted to the first clock terminal CK1 and the second clock terminal CK2, respectively, so that the transistor Q45 and the transistor Q46 are made ON alternately.

However, the configuration shown in FIG. 31 requires the above additional circuits, which leads to undesirable increase in the number of elements in a circuit and in the area of a circuit.

The present invention was made in view of the foregoing problems. An object of the present invention is to realize a shift register and a display device, each capable of satisfactorily subduing noises in individual stage outputs.

Solution to Problem

In order to solve the foregoing problems, a shift register of the present invention includes one or more series-connection circuits in each of which stages are series-connected with each other to transmit a shift pulse, at least one of said one or more series-connection circuits including, among all stages thereof, a continuous stage group consisting of a plurality of continuous stages, each stage of the continuous stage group comprising: a first output transistor, having (i) a drain to which a first direct voltage is applied and (ii) a source serving as a first output terminal which is an output terminal of said each stage; a first capacitor, having one end connected with a gate of the first output transistor; an input gate, to which a shift pulse for said each stage is input and via which a potential to be supplied to said one end of the first capacitor is transmitted during a pulse period of the shift pulse for said each stage; a first switching element, having (i) one end connected with the other end of the first capacitor, (ii) the other end to which the first direct voltage is applied, and (iii) a conduction and blocking control terminal, to which a first clock signal corresponding to said each stage is input, an active clock pulse period of the first clock signal not overlapping the pulse period of the shift pulse for said each stage; a second switching element, having (i) one end connected with the other end of the first capacitor, (ii) the other end to which a second direct voltage lower than the first direct voltage is applied, and (iii) a conduction and blocking control terminal to which a shift pulse for said each stage is input; a third switching element, having (i) one end connected with said one end of the first capacitor, (ii) the other end to which the second direct voltage is applied, and (iii) a conduction and blocking control terminal to which a pulse signal from an output terminal of a first predetermined other stage included in one of said one or more series-connection circuits is input, a phase of the pulse signal being retarded with respect to that of a shift pulse outputted from said each stage; and a fourth switching element, having (i) one end connected with the first output terminal, (ii) the other end to which the second direct voltage is applied, and (iii) a conduction and blocking control terminal to which a first conduction and blocking control signal corresponding to said each stage is input, an active period of the first conduction and blocking control signal not overlapping the active clock pulse period of the first clock signal.

With the invention, the first direct voltage is applied to the drain of the first output transistor, and the switched capacitor operation using the first switching element, the second switching element, and the first capacitor are carried out. This enables avoiding a feed-through phenomenon due to the drain parasitic capacitor and the source parasitic capacitor of the first output transistor. Consequently, it is possible to prevent (i) a variation in output voltage when a clock signal is inputted to the drain of the first output transistor and (ii) leakage of a potential from a picture element electrode caused by the variation in output voltage. Therefore, it is unnecessary to provide an additional circuit for frequently connecting the first output terminal of the stage to the Low power source.

As described above, the above configuration enables realizing a shift register capable of satisfactorily subduing noises of individual stage outputs, without increasing the area of a circuit.

Further, since the direct voltage is applied to the drain of the first output transistor, it is possible to drive a gate bus line using a direct power source. This enables greatly reducing a load on an external level shifter which generates a shift register control signal, compared with a case where a clock signal is inputted to the drain of the first output transistor so as to drive a gate bus line using the clock signal.

Since the direct voltage is applied to the drain of the first output transistor, a negative bias is applied over the gate and the drain of the first output transistor for a longer time, enabling reduction in the increase in a threshold voltage. This enables preventing performance of a shift register from being deteriorated.

In order to solve the foregoing problems, a shift register of the present invention includes one or more series-connection circuits in each of which stages are series-connected with each other to transmit a shift pulse, at least one of said one or more series-connection circuits including, among all stages thereof, a continuous stage group consisting of a plurality of continuous stages, each stage of the continuous stage group comprising: a first output transistor, having (i) a drain to which a first direct voltage is applied and (ii) a source serving as a first output terminal which is an output terminal of said each stage; a first capacitor, having one end connected with a gate of the first output transistor; an input gate, to which a shift pulse for said each stage is input and via which a potential to be supplied to said one end of the first capacitor is transmitted during a pulse period of the shift pulse for said each stage; a first switching element, having (i) one end connected with the other end of the first capacitor, (ii) the other end to which the first direct voltage is applied, and (iii) a conduction and blocking control terminal, to which a first clock signal corresponding to said each stage is input, an active clock pulse period of the first clock signal not overlapping the pulse period of the shift pulse for said each stage; a second switching element, having (i) one end connected with the other end of the first capacitor, (ii) the other end to which a fourth direct voltage lower than the first direct voltage is applied, and (iii) a conduction and blocking control terminal to which a shift pulse for said each stage is input; a third switching element, having (i) one end connected with said one end of the first capacitor, (ii) the other end to which the fourth direct voltage is applied, and (iii) a conduction and blocking control terminal to which a pulse signal from an output terminal of a first predetermined other stage included in one of said one or more series-connection circuits is input, a phase of the pulse signal being retarded with respect to that of a shift pulse outputted from said each stage; and a fourth switching element, having (i) one end connected with the first output terminal, (ii) the other end to which a second direct voltage which is lower than the first direct voltage and which is supplied independently of the fourth direct voltage is applied, and (iii) a conduction and blocking control terminal to which a first conduction and blocking control signal corresponding to said each stage is input, an active period of the first conduction and blocking control signal not overlapping the active clock pulse period of the first clock signal.

With the invention, the first direct voltage is applied to the drain of the first output transistor, and the switched capacitor operation using the first switching element, the second switching element, and the first capacitor are carried out. This enables avoiding a feed-through phenomenon due to the drain parasitic capacitor and the source parasitic capacitor of the first output transistor. Consequently, it is possible to prevent (i) a variation in output voltage when a clock signal is inputted to the drain of the first output transistor and (ii) leakage of a potential from a picture element electrode caused by the variation in output voltage. Therefore, it is unnecessary to provide an additional circuit for frequently connecting the first output terminal of the stage to the Low power source.

As described above, the above configuration enables realizing a shift register capable of satisfactorily subduing noises of individual stage outputs, without increasing the area of a circuit.

Further, since the direct voltage is applied to the drain of the first output transistor, it is possible to drive a gate bus line using a direct power source. This enables greatly reducing a load on an external level shifter which generates a shift register control signal, compared with a case where a clock signal is inputted to the drain of the first output transistor so as to drive a gate bus line using the clock signal.

Since the direct voltage is applied to the drain of the first output transistor, a negative bias is applied over the gate and the drain of the first output transistor for a longer time, enabling reduction in the increase in a threshold voltage. This enables preventing performance of a shift register from being deteriorated.

Further, since the fourth direct voltage which is supplied independently of the second direct voltage is applied to the other end of the second switching element and the other end of the third switching element, adjustment of the fourth direct voltage enables changing the amplitude of a control signal for setting/resetting a shift register in a previous/subsequent stage, thereby reducing OFF leakage of the input gate and the first output transistor. Further, by setting the fourth voltage such that a threshold voltage of a transistor is less likely to change, it is possible to subdue a change with time of the performance of the transistor.

In order to solve the foregoing problems, a shift register of the present invention includes one or more series-connection circuits in each of which stages are series-connected with each other to transmit a shift pulse, at least one of said one or more series-connection circuits including, among all stages thereof, a continuous stage group consisting of a plurality of continuous stages, each stage of the continuous stage group comprising: a first output transistor, having (i) a drain to which a first clock signal corresponding to said each stage is applied and (ii) a source serving as a first output terminal which is an output terminal of said each stage, an active clock pulse period of the first clock signal not overlapping a pulse period of a shift pulse for said each stage; a first capacitor, having one end connected with a gate of the first output transistor; an input gate, to which a shift pulse for said each stage is input and via which a potential to be supplied to said one end of the first capacitor is transmitted during a pulse period of the shift pulse for said each stage; a first switching element, having (i) one end connected with the other end of the first capacitor, (ii) the other end to which a first direct voltage is applied, and (iii) a conduction and blocking control terminal, to which the first clock signal is input; a second switching element, having (i) one end connected with the other end of the first capacitor, (ii) the other end to which a second direct voltage lower than the first direct voltage is applied, and (iii) a conduction and blocking control terminal to which a shift pulse for said each stage is input; a third switching element, having (i) one end connected with said one end of the first capacitor, (ii) the other end to which the second direct voltage is applied, and (iii) a conduction and blocking control terminal to which a pulse signal from an output terminal of a first predetermined other stage included in one of said one or more series-connection circuits is input, a phase of the pulse signal being retarded with respect to that of a shift pulse outputted from said each stage; and a fourth switching element, having (i) one end connected with the first output terminal, (ii) the other end to which the second direct voltage is applied, and (iii) a conduction and blocking control terminal to which a first conduction and blocking control signal corresponding to said each stage is input, an active period of the first conduction and blocking control signal not overlapping the active clock pulse period of the first clock signal.

With the invention, the first clock signal is inputted to the drain of the first output transistor, and a switched capacitor operation using the first switching element, the second switching element, and the first capacitor is carried out. Thus, in the case where the first clock signal is in a Low level, a variation in Low level signal from the first output terminal due to a noise, coupling etc. at one end of the first capacitor is less likely to appear.

Consequently, it is possible to prevent the increase in potential of the first output terminal due to variation in signal or leakage of signal when the output of the first output terminal is in a Low level. This prevents leakage of a potential from a picture element electrode and malfunction of a shift register due to the variation in signal or the increase in potential.

In order to solve the foregoing problems, a shift register of the present invention includes one or more series-connection circuits in each of which stages are series-connected with each other to transmit a shift pulse, at least one of said one or more series-connection circuits including, among all stages thereof, a continuous stage group consisting of a plurality of continuous stages, each stage of the continuous stage group comprising: a first output transistor, having (i) a drain to which a first clock signal corresponding to said each stage is applied and (ii) a source serving as a first output terminal which is an output terminal of said each stage, an active clock pulse period of the first clock signal not overlapping a pulse period of a shift pulse for said each stage; a first capacitor, having one end connected with a gate of the first output transistor; an input gate, to which a shift pulse for said each stage is input and via which a potential to be supplied to said one end of the first capacitor is transmitted during a pulse period of the shift pulse for said each stage; a first switching element, having (i) one end connected with the other end of the first capacitor, (ii) the other end to which a first direct voltage is applied, and (iii) a conduction and blocking control terminal, to which the first clock signal is input; a second switching element, having (i) one end connected with the other end of the first capacitor, (ii) the other end to which a fourth direct voltage lower than the first direct voltage is applied, and (iii) a conduction and blocking control terminal to which a shift pulse for said each stage is input; a third switching element, having (i) one end connected with said one end of the first capacitor, (ii) the other end to which the fourth direct voltage is applied, and (iii) a conduction and blocking control terminal to which a pulse signal from an output terminal of a first predetermined other stage included in one of said one or more series-connection circuits is input, a phase of the pulse signal being retarded with respect to that of a shift pulse outputted, from said each stage; and a fourth switching element, having (i) one end connected with the first output terminal, (ii) the other end to which a second direct voltage which is lower than the first direct voltage and which is supplied independently of the fourth direct voltage is applied, and (iii) a conduction and blocking control terminal to which a first conduction and blocking control signal corresponding to said each stage is input, an active period of the first conduction and blocking control signal not overlapping the active clock pulse period of the first clock signal.

With the invention, the first clock signal is inputted to the drain of the first output transistor, and a switched capacitor operation using the first switching element, the second switching element, and the first capacitor is carried out. Thus, in the case where the first clock signal is in a Low level, a variation in Low level signal from the first output terminal due to a noise, coupling etc. at one end of the first capacitor is less likely to appear.

Consequently, it is possible to prevent the increase in potential of the first output terminal due to variation in signal or leakage of signal when the output of the first output terminal is in a Low level. This prevents leakage of a potential from a picture element electrode and malfunction of a shift register due to the variation in signal or the increase in potential.

Further, since the fourth direct voltage which is supplied independently of the second direct voltage is applied to the other end of the second switching element and the other end of the third switching element, adjustment of the fourth direct voltage enables changing the amplitude of a control signal for setting/resetting a shift register in a previous/subsequent stage, thereby reducing OFF leakage of the input gate and the first output transistor. Further, by setting the fourth voltage such that a threshold voltage of a transistor is less likely to change, it is possible to subdue a change with time of the performance of the transistor.

In order to solve the foregoing problems, a shift register of the present invention includes one or more series-connection circuits in each of which stages are series-connected with each other to transmit a shift pulse, at least one of said one or more series-connection circuits including, among all stages thereof, a continuous stage group consisting of a plurality of continuous stages, each stage of the continuous stage group comprising: a first output transistor, having (i) a drain to which a first clock signal corresponding to said each stage is applied, an active clock pulse period of the first clock signal not overlapping a period of a shift pulse of said each stage, and (ii) a source serving as a first output terminal which is an output terminal of said each stage; a first capacitor, having one end connected with a gate of the first output transistor; an input gate, to which a shift pulse for said each stage is input and via which a potential to be supplied to said one end of the first capacitor is transmitted during a pulse period of the shift pulse for said each stage; a first switching element, having (i) one end connected with the other end of the first capacitor, (ii) the other end to which the first direct voltage is applied, and (iii) a conduction and blocking control terminal to which the first clock signal is input; a second switching element, having (i) one end connected with the other end of the first capacitor, (ii) the other end to which a second direct voltage lower than the first direct voltage is applied, and (iii) a conduction and blocking control terminal to which a shift pulse for said each stage is input; and a third switching element, having (i) one end connected with said one end of the first capacitor, (ii) the other end to which the second direct voltage is applied, and (iii) a conduction and blocking control terminal to which a pulse signal from an output terminal of a first predetermined other stage included in one of said one or more series-connection circuits is input, a phase of the pulse signal being retarded with respect to that of a shift pulse outputted from said each stage.

With the invention, it is possible to reduce the number of switching elements. This enables reducing the area of a circuit.

In order to solve the foregoing problems, a shift register of the present invention includes one or more series-connection circuits in each of which stages are series-connected with each other to transmit a shift pulse, at least one of said one or more series-connection circuits including, among all stages thereof, a continuous stage group consisting of a plurality of continuous stages, each stage of the continuous stage group comprising: a first output transistor, having (i) a drain to which a first clock signal corresponding to said each stage is applied, an active clock pulse period of the first clock signal not overlapping a period of a shift pulse of said each stage, and (ii) a source serving as a first output terminal which is an output terminal of said each stage; a first capacitor, having one end connected with a gate of the first output transistor; an input gate, to which a shift pulse for said each stage is input and via which a potential to be supplied to said one end of the first capacitor is transmitted during a pulse period of the shift pulse for said each stage; a first switching element, having (i) one end connected with the other end of the first capacitor, (ii) the other end to which the first direct voltage is applied, and (iii) a conduction and blocking control terminal to which the first clock signal is input; a second switching element, having (i) one end connected with the other end of the first capacitor, (ii) the other end to which a fourth direct voltage lower than the first direct voltage is applied, and (iii) a conduction and blocking control terminal to which a shift pulse for said each stage is input; and a third switching element, having (i) one end connected with said one end of the first capacitor, (ii) the other end to which the fourth direct voltage is applied, and (iii) a conduction and blocking control terminal to which a pulse signal from an output terminal of a first predetermined other stage included in one of said one or more series-connection circuits is input, a phase of the pulse signal being retarded with respect to that of a shift pulse outputted from said each stage.

With the invention, it is possible to reduce the number of switching elements. This enables reducing the area of a circuit.

In order to solve the foregoing problems, a display device of the present invention includes the shift register.

With the invention, it is possible to realize a display device capable of satisfactorily subduing noises in outputs from individual stages, without increasing the area of a circuit.

In order to solve the foregoing problems, a display device of the present invention includes the shift register.

With the invention, it is possible to realize a display device capable of satisfactorily subduing noises in outputs from individual stages, without increasing the area of a circuit.

Advantageous Effects of Invention

As described above, the shift register of the present invention includes one or more series-connection circuits in each of which stages are series-connected with each other to transmit a shift pulse, at least one of said one or more series-connection circuits including, among all stages thereof, a continuous stage group consisting of a plurality of continuous stages, each stage of the continuous stage group comprising: a first output transistor, having (i) a drain to which a first direct voltage is applied and (ii) a source serving as a first output terminal which is an output terminal of said each stage; a first capacitor, having one end connected with a gate of the first output transistor; an input gate, to which a shift pulse for said each stage is input and via which a potential to be supplied to said one end of the first capacitor is transmitted during a pulse period of the shift pulse for said each stage; a first switching element, having (i) one end connected with the other end of the first capacitor, (ii) the other end to which the first direct voltage is applied, and (iii) a conduction and blocking control terminal, to which a first clock signal corresponding to said each stage is input, an active clock pulse period of the first clock signal not overlapping the pulse period of the shift pulse for said each stage; a second switching element, having (i) one end connected with the other end of the first capacitor, (ii) the other end to which a second direct voltage lower than the first direct voltage is applied, and (iii) a conduction and blocking control terminal to which a shift pulse for said each stage is input; a third switching element, having (i) one end connected with said one end of the first capacitor, (ii) the other end to which the second direct voltage is applied, and (iii) a conduction and blocking control terminal to which a pulse signal from an output terminal of a first predetermined other stage included in one of said one or more series-connection circuits is input, a phase of the pulse signal being retarded with respect to that of a shift pulse outputted from said each stage; and a fourth switching element, having (i) one end connected with the first output terminal, (ii) the other end to which the second direct voltage is applied, and (iii) a conduction and blocking control terminal to which a first conduction and blocking control signal corresponding to said each stage is input, an active period of the first conduction and blocking control signal not overlapping the active clock pulse period of the first clock signal.

Consequently, it is possible to realize a shift register and a display device each capable of satisfactorily subduing noises in outputs from individual stages, without increasing the area of a circuit.

BRIEF DESCRIPTION OF DRAWINGS

FIG. 2 is a block diagram showing a configuration of the shift register in accordance with First Embodiment.

FIG. 4 is a block diagram showing a configuration of a shift register in accordance with Second Embodiment.

FIG. 6 is a block diagram showing a configuration of a shift register in accordance with Third Embodiment.

FIG. 8 is a waveform chart showing an operation of the shift register in accordance with Third Embodiment.

FIG. 13 is a circuit diagram showing a configuration of a stage included in a shift register in accordance with Eighth Embodiment of the present invention.

FIG. 19 is a waveform chart showing an operation of the second configuration example of the shift register in accordance with Tenth Embodiment.

FIG. 20 is a circuit diagram showing a configuration of a stage included in a shift register in accordance with Eleventh Embodiment of the present invention.

FIG. 21 is a circuit diagram showing a configuration of a stage included in a shift register in accordance with Twelfth Embodiment of the present invention.

FIG. 24 is a circuit diagram showing a configuration of a stage included in a shift register in accordance with Fifteenth Embodiment of the present invention.

FIG. 30 is a second waveform chart explaining a problem of a conventional shift register.

FIG. 32 is a circuit diagram showing a configuration of a stage included in a shift register in accordance with Sixth Embodiment of the present invention.

FIG. 34 is a waveform chart showing an operation waveform of the stage shown in FIG. 32.

DESCRIPTION OF EMBODIMENTS

The following explains an embodiment of the present invention with reference to FIGS. 1-26 and 32-40.

Figure 25:
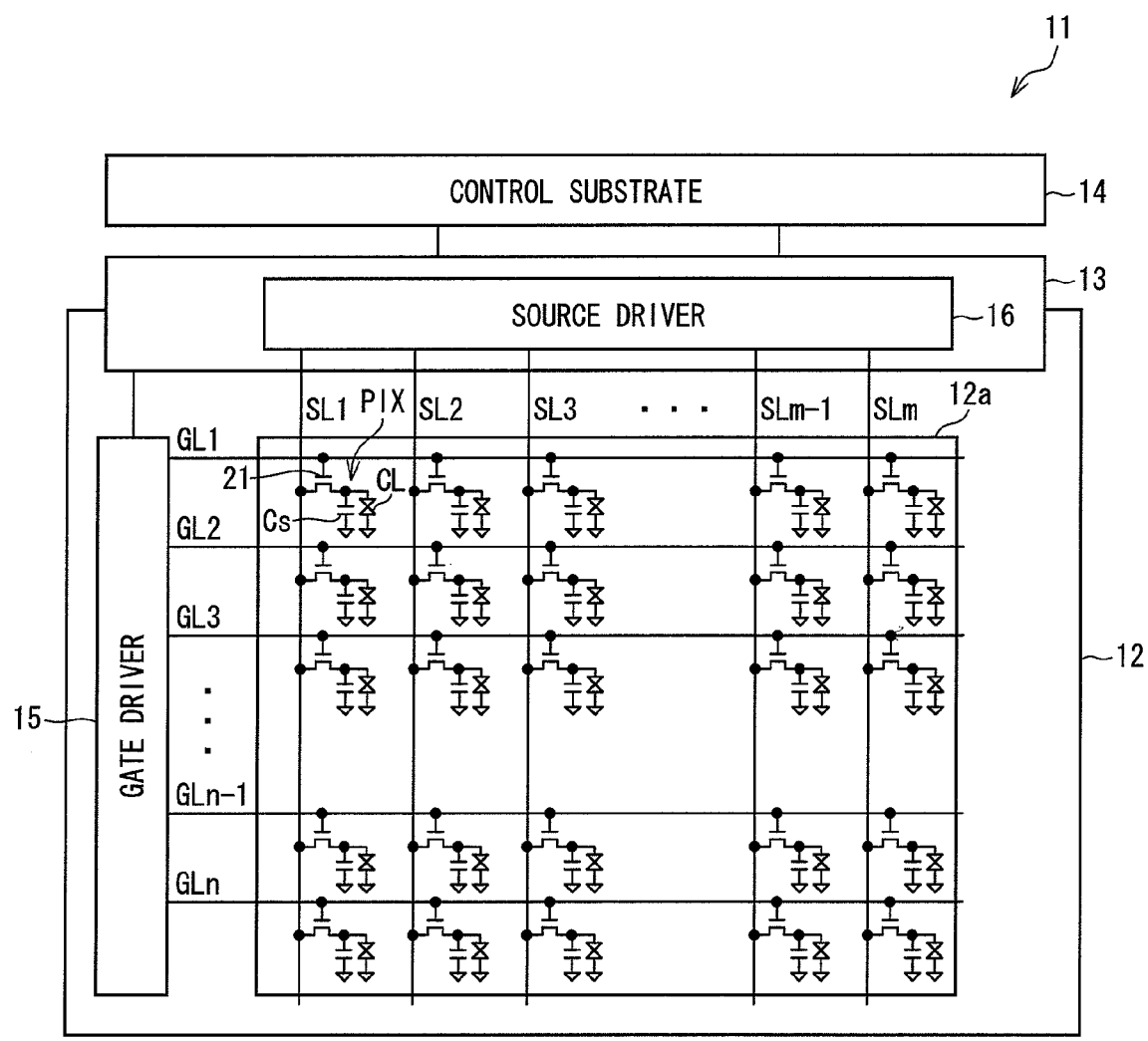
FIG. 25 is a block diagram showing a configuration of a display device in accordance with an embodiment of the present invention.

FIG. 25 shows a configuration of a liquid crystal display device 11 which is a display device in accordance with the present embodiment.

The liquid crystal display device 11 includes a display panel 12, a flexible print substrate 13, and a control substrate 14.

The display panel 12 is an active matrix display panel obtained by forming, on a glass substrate, a display region 12*a*, a plurality of gate bus lines (scanning signal lines) GL, a plurality of source bus lines (data signal lines) SL, and a gate driver (scanning signal line drive circuit) 15, each of which is made of amorphous silicon. The display panel 12 may be made of polycrystalline silicon, CG silicon, microcrystalline silicon etc. In the display region 12*a*, a plurality of picture elements PIX are disposed in a matrix manner. Each picture element PIX includes a TFT 21 serving as a selecting element for a picture element, a liquid crystal capacitor CL, and an auxiliary capacitor Cs. A gate of the TFT 21 is connected with a gate bus line GL, and a source of the TFT 21 is connected with a source bus line SL. The liquid crystal capacitor CL and the auxiliary capacitor Cs are connected with a drain of the TFT 21.

The plurality of gate bus lines GL include gate bus lines GL1, GL2, GL3, . . . and GLn, which are connected with individual outputs of the gate driver (scanning signal line drive circuit) 15. The plurality of source bus lines SL include source bus lines SL1, SL2, SL3, . . . and SLm, which are connected with individual outputs of a source driver 16 which will be mentioned later. Further, although not shown, auxiliary capacitor lines for supplying an auxiliary capacitor voltage to the auxiliary capacitors Cs of the picture elements PIX are provided.

The gate driver 15 is provided in a region adjacent in an extending direction of the gate bus lines GL to one side of the display region 12*a* on the display panel 12. The gate driver 15 sequentially supplies gate pulses (scanning pulses) to the gate bus lines GL. Further, other gate driver may be provided in a region adjacent in the extending direction of the gate bus lines GL to the other side of the display region 12*a* on the display panel 12 and may scan gate bus lines GL other than the gate bus lines GL scanned by the gate driver 15. Further, a gate driver provided in a region adjacent in an extending direction of the gate bus lines GL to one side of the display region 12*a* and a gate driver provided in a region adjacent in the extending direction of the gate bus lines GL to the other side of the display region 12a may scan the same gate bus line GL. These gate drivers are formed on the display panel 12 monolithically with the display region 12a. Gate drivers called a gate monolithic, a gate driverless, a panel built-in gate driver, a gate-in panel etc. are all encompassed in the gate driver 15.

The flexible print substrate 13 includes the source driver 16. The source driver 16 supplies a data signal to each of the source bus lines SL. The source driver 16 may be formed on the display panel 12 monolithically with the display region 12a. The control substrate 14 is connected with the flexible print substrate 13, and supplies a signal and a power necessary for the gate driver 15 and the source driver 16. A signal and a power which are outputted from the control substrate 14 and are supplied to the gate driver 15 are supplied to the gate driver 15 via the flexible print substrate 13 from the display panel 12.

The following explains a configuration of a shift register included in the gate driver 15, with reference to Embodiments.

First Embodiment

Figure 1:
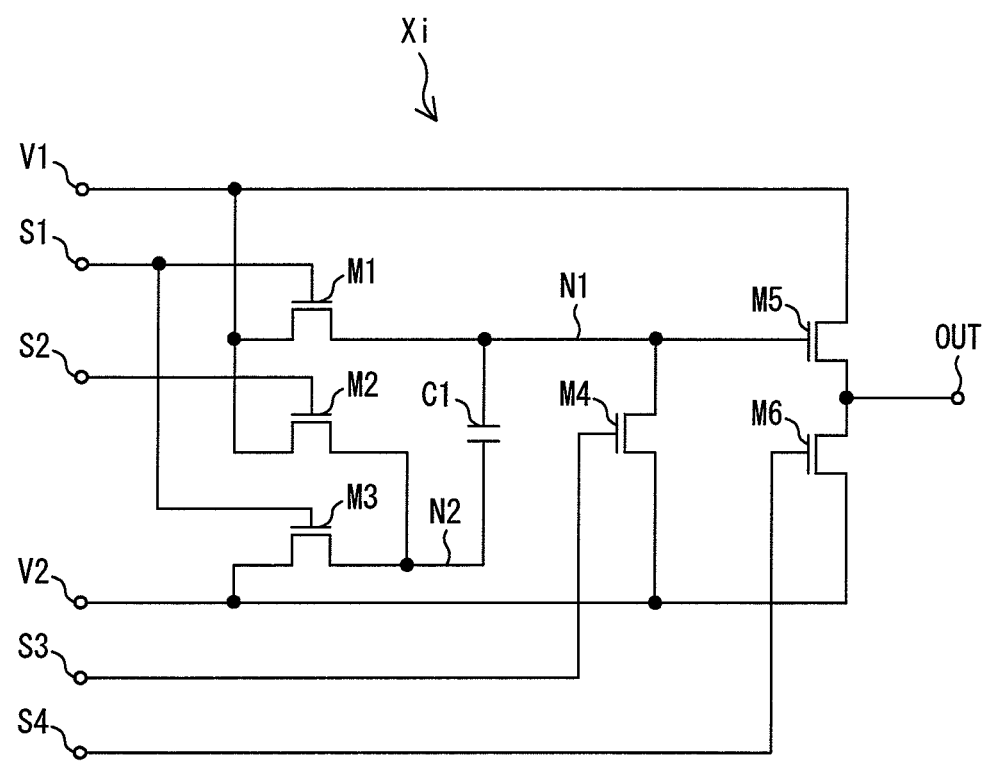
FIG. 1 is a circuit diagram showing a configuration of a stage included in a shift register in accordance with First Embodiment of the present invention.
Figure 3:
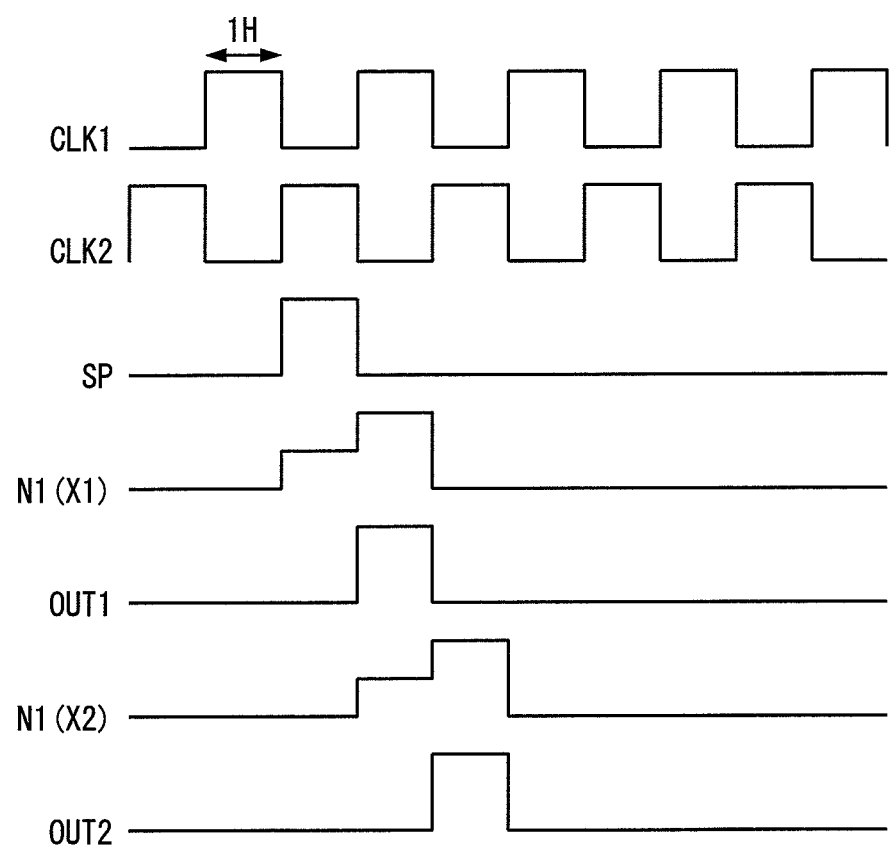
FIG. 3 is a waveform chart showing an operation of the shift register in accordance with First Embodiment.

An explanation is made to First Embodiment of a shift register with reference to FIGS. 1-3.

FIG. 2 shows a configuration of a shift register 1 in accordance with the present Embodiment.

The shift register 1 has a configuration in which a plurality of stages Xi (i is a natural number) corresponding to the gate bus lines GL, respectively, are series-connected with each other. In the present Embodiment and subsequent Embodiments, a circuit in which the stages Xi are series-connected is referred to as a series-connection circuit. Each stage Xi has terminals V1, V2, S1, S2, S3, S4, and OUT.

In each odd-numbered stage Xi (i=1, 3, 5, . . . ), a power source voltage (first direct voltage) VDD which is a High level (i.e. gate pulse level) of a gate drive voltage is inputted to the terminal V1, a power source voltage (second direct voltage) VSS which is a Low level of the gate drive voltage is inputted to the terminal V2, an output signal OUTi−1 from a terminal OUT of a previous stage Xi−1 is inputted to the terminal S1, a clock signal (first clock signal) CLK1 is inputted to the terminal S2, an output signal OUTi+1 from a terminal OUT of a next stage X is inputted to the terminal S3, and a clock signal (first conduction and blocking control signal, second clock signal) CLK2 is inputted to the terminal S4. An output signal OUTi of the stage Xi is outputted from the terminal (first output terminal) OUT. However, a gate start pulse SP instead of the output signal OUTi−1 is inputted to the terminal S1 of the stage X1.

To the terminal S3 of the last stage Xn (n is the largest number of i) is inputted an output pulse signal which comes from other stage in the series-connection circuit and whose phase is retarded by 1 pulse with respect to the output signal OUTi−1 of the stage Xi. An example of such output pulse signal is an output pulse signal outputted from an output terminal of a dummy stage which is positioned next to the last stage Xn, which has the same configuration as the stage Xi, and which does not output a signal to the gate bus line GL. The output pulse from the dummy stage is referred to as a gate end pulse EP. The gate end pulse EP has the same waveform as a pulse of the output signal OUTi except for its phase. As such, to the terminal S3 of each stage Xi, an output pulse signal whose phase is retarded (here, by 1 pulse) with respect to the output signal OUTi of that stage Xi is required to be inputted from an output terminal of a predetermined other stage of the series-connection circuit. Further, the first stage X1 may be arranged such that a dummy stage having the same configuration is provided as a previous stage of the first stage X1, a gate start pulse is inputted to the dummy stage, and an output pulse signal from the dummy stage is inputted to the stage X1. These dummy stages are provided in order that the first stage X1 and the last stage Xn operate under the same condition as a condition for other stage Xi. Configurations of these dummy stages are also applied to other Embodiments.

In each even-numbered stage Xi (i=2, 4, 6, . . . ), a power source voltage (first direct voltage) VDD which is a High level (i.e. gate pulse level) of a gate drive voltage is inputted to the terminal V1, a power source voltage (second direct voltage) VSS which is a Low level of the gate drive voltage is inputted to the terminal V2, an output signal OUTi−1 from a terminal OUT of a previous stage Xi−1 is inputted to the terminal S1, a clock signal (first clock signal) CLK2 is inputted to the terminal S2, an output signal OUTi+1 from a terminal OUT of a next stage Xi+1 is inputted to the terminal S3, and a clock signal (first conduction and blocking control signal, second clock signal) CLK1 is inputted to the terminal S4. An output signal OUTi of the stage Xi is outputted from the terminal OUT.

The second direct voltage is lower than the first direct voltage.

FIG. 1 shows a configuration of each stage Xi.

The stage Xi includes transistors M1, M2, M3, M4, M5, and M6 and a capacitor C1. All of the transistors M1, M2, M3, M4, M5, and M6 are N-channel TFTs, but they may be P-channel TFTs. The same can be said about all transistors in all Embodiments. A gate of each switching element explained below is a control terminal for conduction and blocking in the switching element.

A gate of the transistor (input gate, fifth switching element, first transistor) M1 is connected with the terminal S1, a drain of the transistor M1 is connected with the terminal V1, and a source of the transistor M1 is connected with a node N1 connected with a gate of the transistor M5. One end of the capacitor (first capacitor) C1 is connected with the node N1.

A gate of the transistor (first switching element) M2 is connected with the terminal S2, a drain of the transistor M2 is connected with the terminal V1, and a source of the transistor M2 is connected with the other end of the capacitor C1 which end is farther from the node N1. The other end of the capacitor C1 is connected with the node N2.

A gate of the transistor (second switching element) M3 is connected with the terminal S1, a drain of the transistor M3 is connected with the node N2, and a source of the transistor M3 is connected with the terminal V2.

A gate of the transistor (third switching element) M4 is connected with the terminal S3, a drain of the transistor M4 is connected with the node N1, and a source of the transistor M4 is connected with the terminal V2.

A drain of the transistor (first output transistor) M5 is connected with the terminal V1, and a source of the transistor M5 is connected with the terminal OUT. That is, the power source voltage VDD which is a direct voltage is applied to the drain of the transistor M5, and the source of the transistor M5 serves as a first output terminal which is an output terminal of the stage Xi.

A gate of the transistor (fourth switching element) M6 is connected with the terminal S4, a drain of the transistor M6 is connected with the terminal OUT, and a source of the transistor M6 is connected with the terminal V2.

An explanation is made as to an operation of the shift register 1 including the stage Xi having the above configuration.

An active period is not common between the clock signal CLK1 and the clock signal CLK2. For example, in the present case, the clock signal CLK1 and the clock signal CLK2 have opposite phases. In the present case, the High level of the clock signals CLK1 and CLK2 is VDD and the Low level thereof is VSS. However, the High level thereof may be VDD or more and the Low level thereof may be VSS or less. The pulse width of the clock signals CLK1 and CLK2 and the gate start pulse SP corresponds to 1 horizontal period (1H). The phase of the gate start pulse SP is shifted by one-second cycle with respect to the clock signal CK1. In the present Embodiment, a clock signal inputted to the terminal S2 is regarded as the first clock signal. In the case of the odd-numbered stage Xi, the clock signal CLK1 is the first clock signal. In the case of the even-numbered stage Xi, the clock signal CLK2 is the first clock signal. Further, in the present Embodiment, a clock signal inputted to the terminal S4 is regarded as the first conduction and blocking control signal and the second clock signal. In the case of the odd-numbered stage Xi, the clock signal CLK2 is the first conduction and blocking control signal and the second clock signal. In the case of the even-numbered stage Xi, the clock signal CLK1 is the first conduction and blocking control signal and the second clock signal. A period during which a clock pulse is active (High level period in the present Embodiment) is not common between a shift pulse inputted to the stage Xi and the first clock signal.

Initially, when a gate start pulse SP which is a shift pulse is inputted to the terminal S1 of the stage X1, the transistors M1 and M3 are put in an ON state and the stage X1 starts to operate. Consequently, a voltage is applied from the terminal V1 via the transistor M1 on a terminal of the capacitor C1 which terminal is closer to the node N1, and a power source voltage VSS is applied from the terminal V2 via the transistor M3 on a terminal of the capacitor C1 which terminal is closer to the node N2. When the capacitor C1 is charged until the potential of the node N1 is (power source voltage VDD)−(threshold voltage Vth of transistor M1), the transistor M1 is put in an OFF state. Consequently, potential difference between both ends of the capacitor C1 is (power source voltage VDD)−(threshold voltage Vth of transistor M1)−(power source voltage VSS), increasing the potential of the node N1 and this potential is maintained. It should be noted that the power source voltage VDD is set such that a voltage which is to be inputted to the terminal S1 of the next stage X2 and which is set depending on the potential of the node N1 at this time (i.e. voltage of the terminal OUT) is not more than a threshold voltage Vth of the transistor M1 of the next stage X2. As described above, the transistor M1 serves as an input gate to which a shift pulse for the stage Xi is input and via which a voltage to be applied to the node N1 is transmitted during a pulse period of the shift pulse. In the case of the stage X1, the shift pulse is a gate start pulse SP, and in the case of other stage Xi, the shift pulse is a gate pulse included in an output signal OUTi−1 of the pervious stage Xi−1.

Subsequently, the gate start pulse SP falls, which puts the transistor M3 in an OFF state.

Subsequently, the clock signal CLK1 which is a first clock signal inputted via the terminal S2 rises to a High level, which puts the transistor M2 in an ON state, and application of a voltage via the terminal V1 makes the potential of the node N2 equal to a value of (power source voltage VDD)−(threshold voltage Vth). Consequently, the potential of the node N1 rises via the capacitor C1, which makes the transistor M5 in an ON state. At that time, a potential difference of VDD−Vth−VSS is maintained at both ends of the capacitor C1, and accordingly the potential V (N1) of the node N1 is as follows.

$$V(N1) = (VDD - Vth - VSS) + (VDD - Vth)$$
$$= 2 \times VDD - (VSS + 2 \times Vth)$$

Consequently, the gate of the transistor M5 has a potential V (N1) which is sufficiently higher than VDD, and the transistor M5 is put in an ON state so that the transistor M5 has a sufficiently small channel resistance. Consequently, the power source voltage VDD is outputted from the terminal V1 to the terminal OUT via the transistor M5. An output signal OUT1 from the terminal OUT is a gate pulse having amplitude of VDD−VSS.

The gate pulse is inputted to a terminal S1 of the next stage X2, so that a capacitor C1 of the stage X2 is charged. The potential of a node N1 of the stage X2 rises due to input of a High level of the clock signal CLK2 which is a first clock signal to a terminal S2, so that the transistor M5 is put in an ON state. Consequently, the power source voltage VDD is outputted as an output signal OUT2 from a terminal OUT via the transistor M5 and serves as a gate pulse. The gate pulse of the output signal OUT2 is inputted to the terminal S3 of the stage X1, a transistor M4 is put in an ON state, so that the potential of the node N1 drops to the power source voltage VSS. This causes an output signal OUT1 which is a gate pulse to fall, thereby resetting the stage X1.

Thus, gate pulses of the output signals OUTi are sequentially outputted to individual gate bus lines GL.

In each stage Xi, every time the first conduction and blocking control signal or the second clock signal inputted to the terminal S4 is put in a High level, the transistor M6 is put in an ON state and the output terminal OUT is put in a Low level.

As described above, in the present Embodiment, the power source voltage VDD which is the first direct voltage is applied to the drain of the transistor M5 which outputs a gate pulse (i.e. to one end of the transistor M5 which end is opposite to an end via which a gate drive pulse is outputted), and a switched capacitor operation using the transistors M2 and M3 and the capacitor C1 is carried out. This enables preventing (i) a variation in an output voltage which is generated when a clock signal is inputted to the drain of the transistor M5 and (ii) leakage of a potential from a picture element electrode for liquid crystals which is generated do to the variation in an output voltage.

Further, since the direct voltage is applied to the drain of the transistor M5, it is possible to drive a gate bus line using a direct power source. This enables greatly reducing a load on an external level shifter which generates a shift register control signal, compared with a case where a clock signal is inputted to the drain of the transistor M5 so as to drive a gate bus line using the clock signal.

Since the direct voltage is applied to the drain of the transistor M5, a negative bias is applied over the gate and the drain of the transistor M5 for a longer time, enabling reduction in the increase in a threshold voltage. Since gate bus lines are not driven using a clock signal, it is possible to set the amplitude of the clock signal to have any range with its Low level being VSS or less and its High level being VDD or more. When the High level is higher than VDD, ON-current of a transistor to a gate of which the High level is inputted increases, thereby increasing operation velocity. When the Low level is lower than VSS, an OFF-current of a transistor to a gate of which the Low level is inputted drops, thereby preventing malfunction of a level shifter due to leakage of a current.

Further, when the Low level is lower than VSS, it is possible to set a gate potential to be lower than a source potential and a drain potential. This enables reducing a change with time in the threshold voltage Vth caused by a direct current component applied to a gate. Thus, it is possible to prevent deterioration in the performance of a shift register.

In the present embodiment, the first conduction and blocking control signal may be an output from a later stage (second predetermined other stage).

The case where the first conduction and blocking control signal is the second clock signal as above is advantageous in that the terminal OUT is put in a Low level every time the second clock signal is in an active period. However, a clock feed through is generated via a drain parasitic capacitor from the gate of the transistor M6 which is a fourth switching element, so that a noise is more likely to be outputted from the terminal OUT. Further, in the transistor M6 to a gate of which a clock signal is inputted, a High level is inputted to the gate for a longer time, which accelerates deterioration of the threshold voltage Vth. Increase in the threshold voltage Vth increases a voltage to make the transistor M6 conduct, so that feed-through is worsened. This gradually deteriorates noise performance of the transistor M6.

Figure 28:
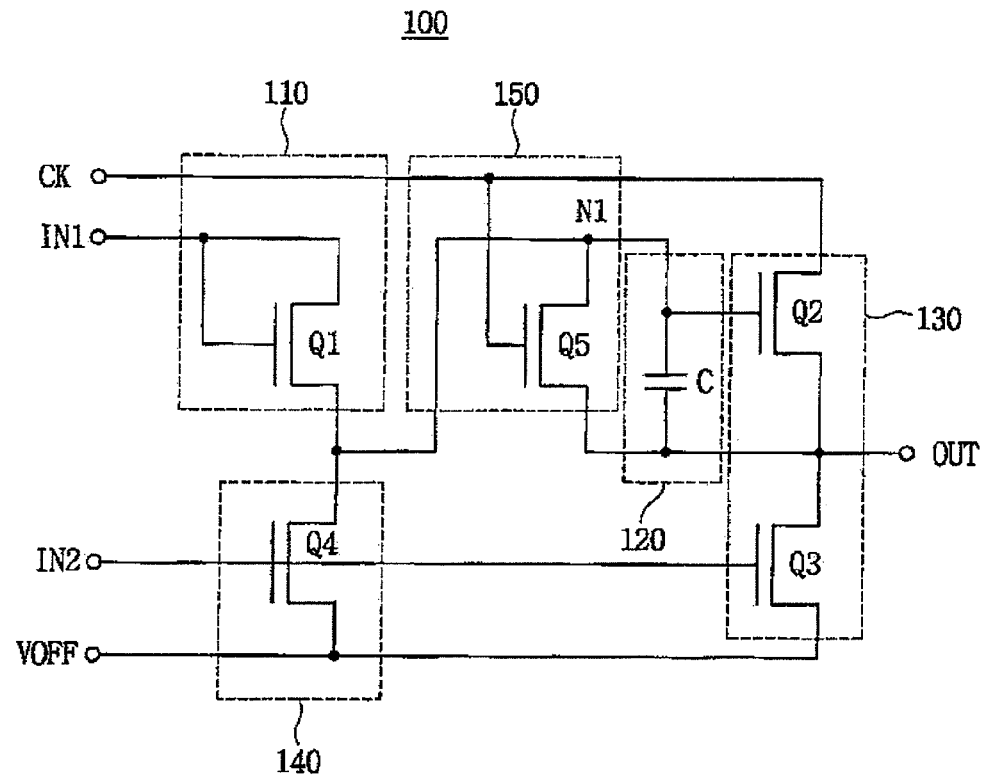
FIG. 28 is a circuit diagram showing a first configuration example of a stage included in a shift register of a conventional art.
Figure 29:
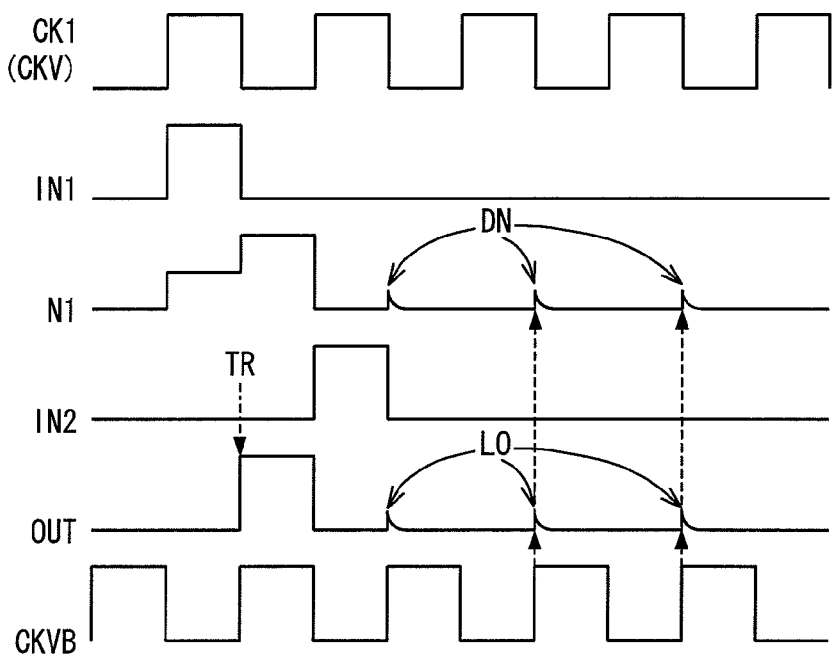
FIG. 29 is a first waveform chart explaining a problem of a conventional shift register.
Figure 31:
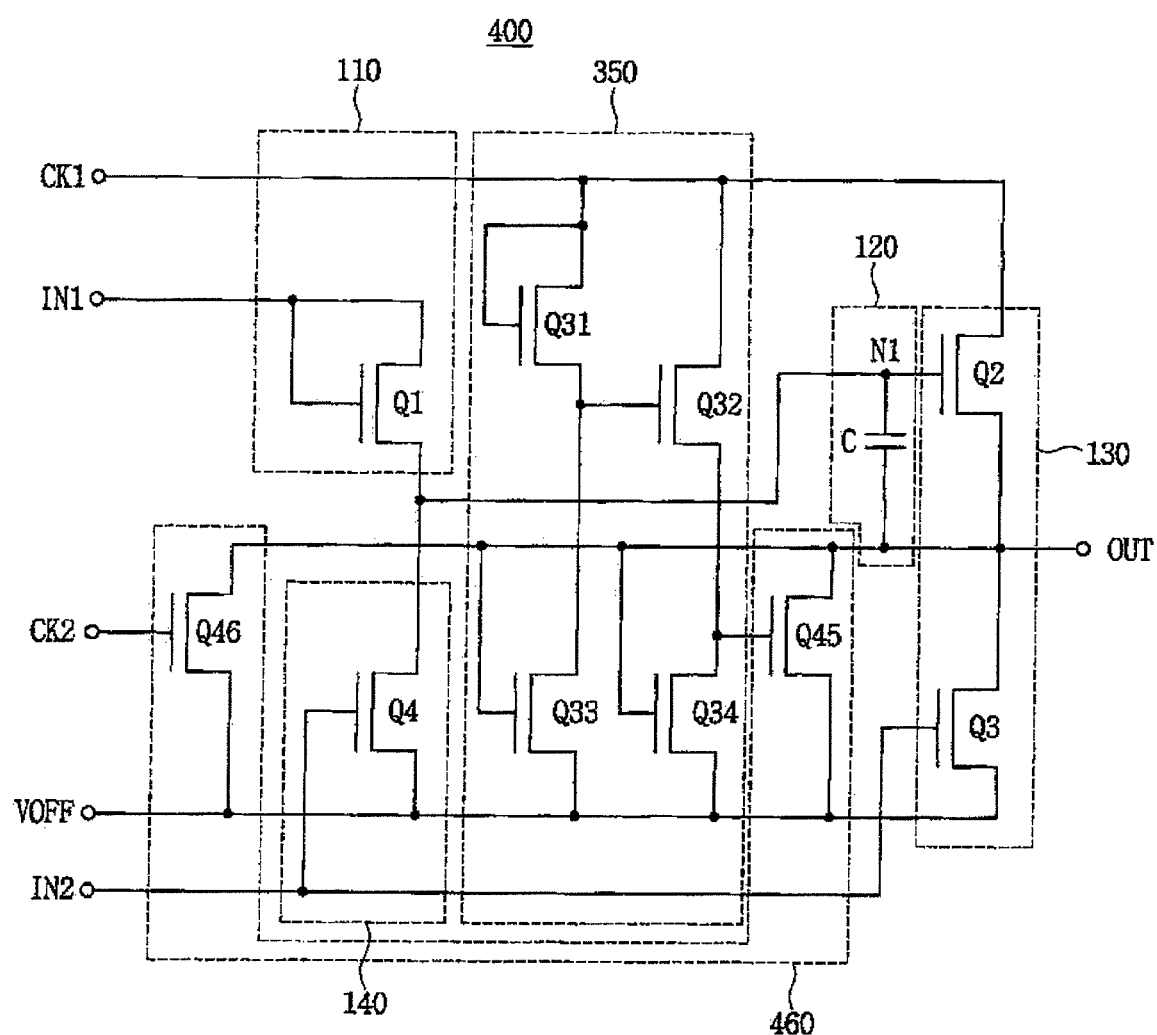
FIG. 31 is a circuit diagram showing a second configuration example of a stage included in a shift register of a conventional art.

In the circuit configuration of Patent Literature 1, a clock signal is inputted to the drain of the output transistor Q2 shown in FIGS. 28 and 30, and consequently a variation in an output occurs with respect to each clock due to clock feed-through. In order to subdue the variation in the output, a control signal for the transistor Q3 is required to be a clock signal.

In contrast thereto, in the case where a direct voltage is input to the drain of the transistor M5 as in the present Embodiment, no noise is generated at the terminal OUT with respect to each clock. Therefore, it is possible to input an output pulse from a later stage as a control pulse to the gate of the transistor M6 and cause the terminal OUT to maintain a Low level until a gate driver outputs in a next frame.

As described above, by inputting an output from a later stage into the gate of the transistor M6, it is possible to avoid clock feed-through and shift of a threshold voltage due to input of a clock signal to the gate, thereby satisfactorily preventing a variation in potential of the terminal OUT until a time when a next output of a stage is made from the terminal OUT.

A part where a plurality of stages Xi are continuously series-connected with each other in FIG. 2 is referred to as a continuous stage group. In the Embodiment of FIG. 2, the series-connection circuit is exactly equal to the continuous stage group. However, the present invention is not limited to this case. Alternatively, in the present invention, the series-connection circuit may include, as a part thereof, the continuous stage group, such as a case where the series-connection circuit includes the continuous stage group and the dummy stage. In a case where a dummy stage has the same configuration as the configuration of a stage Xi defined in claims of the present invention, a stage Xi series-connected with the dummy stage may be regarded as a continuous stage group. Further, a plurality of continuous stage groups may be included in one series-connection circuit in such a manner that at least one stage other than the stage Xi is positioned between the plurality of continuous stage groups. Such a configuration can be preferably used in a case where each group of the plurality of continuous stage groups drives a plurality of gate bus lines GL which constitute a unit corresponding to that group. The same can be said about other Embodiments.

Further, a fifth direct voltage different from the first direct voltage may be applied to the gate of the transistor M1. This prevents a charge potential of the node N1 from being restricted by the power source voltage VDD.

Second Embodiment

Figure 5:
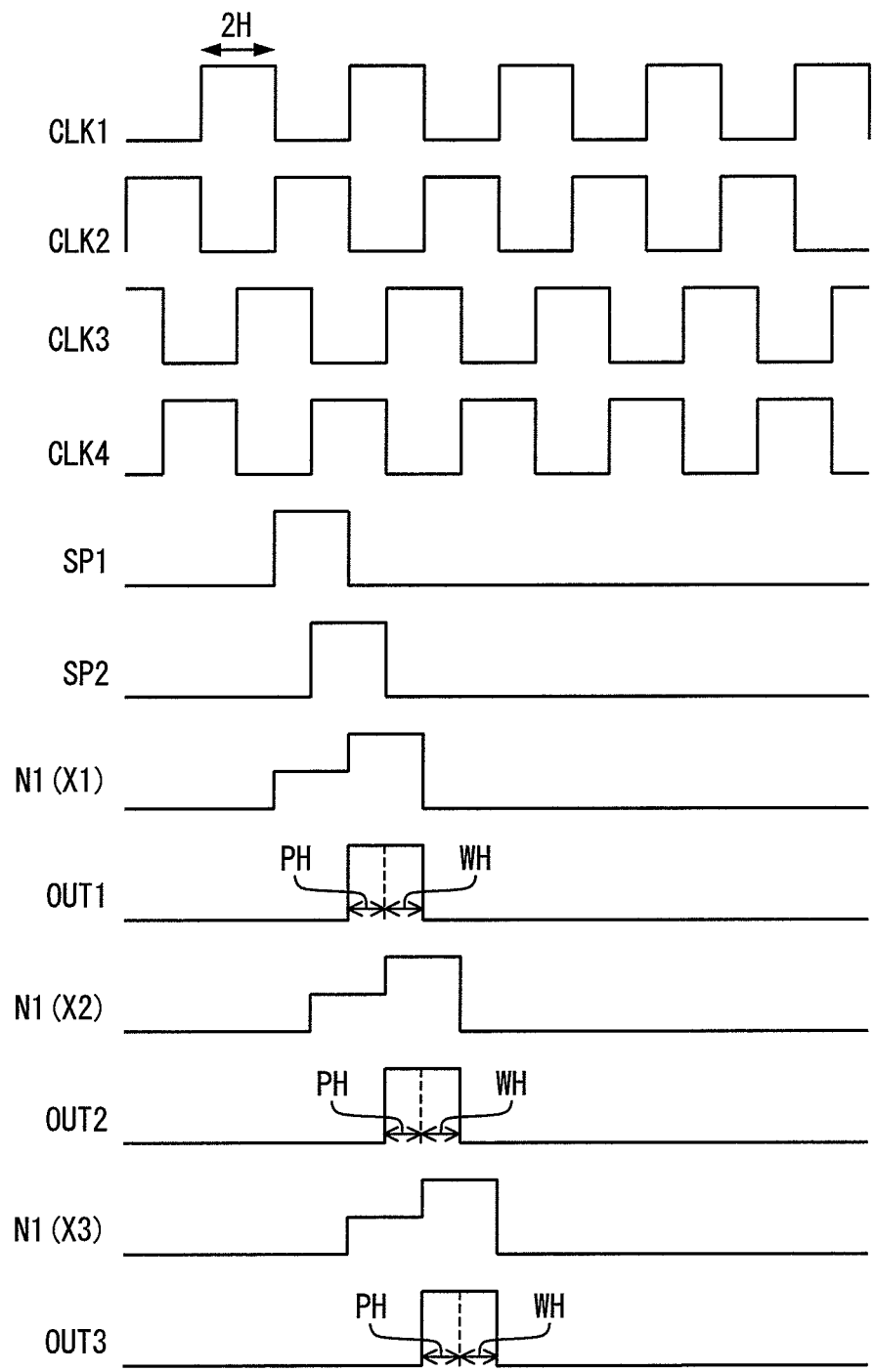
FIG. 5 is a waveform chart showing an operation of the shift register in accordance with Second Embodiment.

The following explains a second Embodiment of a shift register with reference to FIGS. 4 and 5.

FIG. 4 shows a configuration of a shift register 2 in accordance with the present Embodiment.

The shift register 2 includes a shift register 2a and a shift register 2b. The shift register 2a includes one series-connection circuit in which stages Xi (X1, X3, X5, X(2j−1), j is a natural number) for driving odd-numbered gate bus lines GL, respectively, of all gate bus lines GL are series-connected with each other. In this Embodiment, the series-connection circuit of the shift register 2a is one continuous stage group (first continuous stage group). The shift register 2b includes one series-connection circuit in which stages X1 (X2, X4, X6, . . . , X(2k), k is a natural number) for driving even-numbered gate bus lines GL, respectively, of all gate bus lines GL are series-connected with each other. In this Embodiment, the series-connection circuit of the shift register 2b is one continuous stage group (second continuous stage group). The shift register 2a and the shift register 2b have the same configurations as the configuration of the shift register 1 in FIG. 2 except that Xi is replaced with Xj and Xk, respectively.

It should be noted that the shift register 2a is different from the shift register 1 in that a gate start pulse SP1 in FIG. 5 is inputted to the terminal S1 of the stage X1, a clock signal CLK1 in FIG. 5 is inputted to the terminal S2 of the stage Xj (j is an odd number), a clock signal CLK2 in FIG. 5 is inputted to the terminal S4 of the stage Xj (j is an odd number), a clock signal CLK2 in FIG. 5 is inputted to the terminal S2 of the stage Xj (j is an even number), and a clock signal CLK2 in FIG. 5 is inputted to the terminal S4 of the stage Xj (j is an even number). Further, the shift register 2b is different from the shift register 1 in that a gate start pulse SP2 in FIG. 5 is inputted to the terminal S1 of the stage X2, a clock signal CLK3 in FIG. 5 is inputted to the terminal S2 of the stage Xk (k is an odd number), a clock signal CLK4 in FIG. 5 is inputted to the terminal S4 of the stage Xk (k is an odd number), a clock signal CLK4 in FIG. 5 is inputted to the terminal S2 of the stage Xk (k is an even number), and a clock signal CLK3 in FIG. 5 is inputted to the terminal S4 of the stage Xj (k is an even number).

Similarly with above, the series-connection circuit of the shift register 2a and the shift register 2b may include the dummy stage. As described above, the shift register 2 includes a plurality of series-connection circuits. The shift register 2a may include a plurality of continuous stage groups, a part of or all of which are the first continuous stage group. Similarly, the shift register 2b may include a plurality of continuous stage groups, a part of or all of which are the second continuous stage group. The first continuous stage group and the second continuous stage group have the connection relationship in FIG. 4 and the stage configuration in FIG. 1. A continuous stage group which has the stage configuration in FIG. 1 or other drawings but does not have the stage configuration in FIG. 4 is a continuous stage group other than the first continuous stage group or a continuous stage group other than the second continuous stage group. The same is applied to other Embodiments.

Further, an output pulse signal from any stage in the series-connection circuit of the shift registers 2a and 2b (any stage as well as Xj and Xk) may be used as a pulse signal to be inputted to the terminal S3 of the stage Xj of the shift register 2a, and an output pulse signal from any stage in the series-connection circuit of the shift registers 2a and 2b (any stage as well as Xj and Xk) may be used as a pulse signal to be inputted to the terminal S3 of the stage Xk of the shift register 2b, provided that the phase of such an output pulse signal is the same as that of the pulse signal to be inputted to the terminal S3.

The following explains the operation of the shift register 1 including the stage Xi having the above configuration.

In FIG. 5, the High level of the clock signals CLK1, CLK2, CLK3, and CLK4 is set to be VDD and the Low level thereof is set to be VSS. Alternatively, the High level of the clock signals CLK1, CLK2, CLK3, and CLK4 may be set to be VDD or more and the Low level thereof may be set to be VSS or less. The pulse width of the clock signals CLK1, CLK2, CLK3, and CLK4 and the gate start pulses SP1 and SP2 corresponds to 2 horizontal periods (2H).

The clock signal CLK1 and the clock signal CLK2 have opposite phases. The clock signal CLK3 and the clock signal CLK4 have opposite phases. A phase of the clock signal CLK3 is retarded by one-fourth cycle with respect to a phase of the clock signal CLK1, and a phase of the clock signal CLK4 is retarded by one-fourth cycle with respect to a phase of the clock signal CLK2. A phase of the gate start pulse SP1 is retarded by one-second cycle with respect to a phase of the clock signal CLK1, and a phase of the gate start pulse SP2 is retarded by one-fourth cycle with respect to a phase of the clock signals CLK1 to CLK4.

In the present Embodiment, the clock signal inputted to the terminal S2 is regarded as a first clock signal. In the case of the stage Xj (j is an odd number), the clock signal CLK1 corresponds to the first clock signal. In the case of the stage Xj (j is an even number), the clock signal CLK2 corresponds to the first clock signal. In the case of the stage Xk (k is an odd number), the clock signal CLK3 corresponds to the first clock signal. In the case of the stage Xk (k is an even number), the clock signal CLK4 corresponds to the first clock signal. Further, in the present Embodiment, the clock signal inputted to the terminal S4 is regarded as a first conduction and blocking control signal and a second clock signal. In the case of the stage Xj (j is an odd number), the clock signal CLK2 corresponds to the first conduction and blocking control signal and the second clock signal. In the case of the stage Xj (j is an even number), the clock signal CLK1 corresponds to the first conduction and blocking control signal and the second clock signal. In the case of the stage Xk (k is an odd number), the clock signal CLK4 corresponds to the first conduction and blocking control signal and the second clock signal. In the case of the stage Xk (k is an even number), the clock signal CLK3 corresponds to the first conduction and blocking control signal and the second clock signal. A period during which a clock pulse is active (High level period in the present Embodiment) is not common between the shift pulse to be inputted to the stage Xi and the first clock signal.

By inputting the gate start pulse SP1 into the shift register 2a and inputting the gate start pulse SP2 into the shift register 2b, the shift registers 2a and 2b operate similarly with the shift register 2 in FIG. 2. Here, assume that a gate bus line driven by the shift register 2a is indicated by GLj and a gate bus line driven by the shift register 2b is indicated by GLk. In this case, when a gate bus line GLj and a gate bus line GLk which are adjacent to each other are observed, it is found that a gate pulse of an output signal OUTj from the stage Xj which drives the gate bus line GLj overlaps, by one-fourth cycle of the clock signals CLK1 to CLK4, a gate pulse of an output signal OUTk from the stage Xk which drives the gate bus line GLk.

Consequently, a picture element PIX connected with a gate bus line GL can be precharged during a horizontal period PH right before a horizontal period WH during which the gate bus line GL is selected for writing a data signal and by using a data signal for the horizontal period PH.

Consequently, in a case of source line reversal driving in which the polarity of a data signal in one data signal line is maintained during one frame period, it is possible to sufficiently charge liquid crystal picture elements to have a desired voltage by charging the liquid crystal picture elements for a long time. This increases a charging ratio of the liquid crystal picture elements, thereby improving display quality.

Third Embodiment

Figure 7:
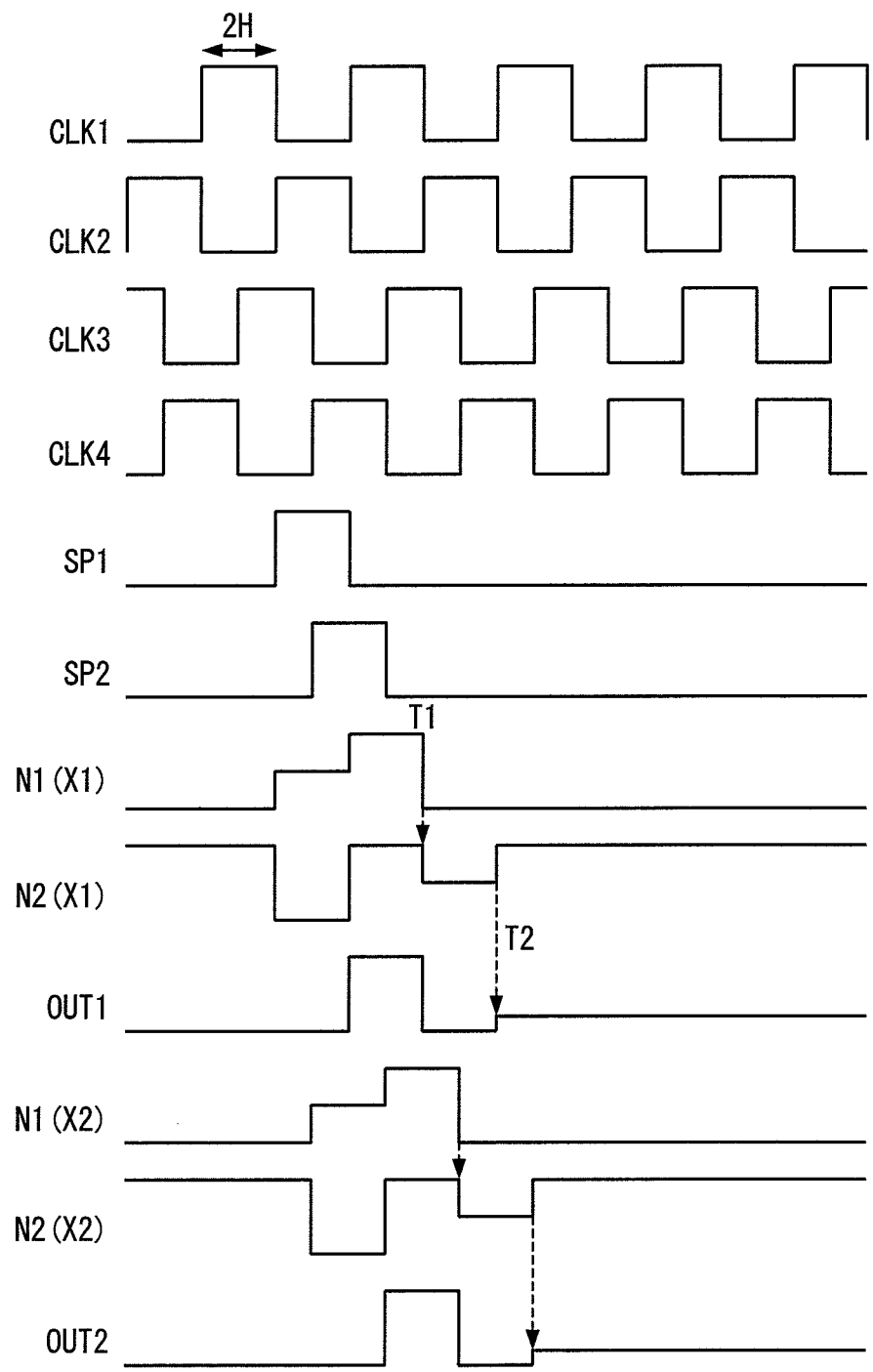
FIG. 7 is a waveform chart showing an operation of a shift register in accordance with a Comparative Embodiment for the Third Embodiment.

An explanation is made to Third Embodiment of a shift register with reference to FIGS. 6-8.

FIG. 6 shows a configuration of a shift register 3 in accordance with the present Embodiment.

The shift register 3 includes a shift register 3a and a shift register 3b. The shift register 3a is configured to input the output signal OUTk of the stage Xk (k=j) of the shift register 2b to the terminal S3 of the stage Xj of the shift register 2a in the shift register 2 of FIG. 4. The shift register 3b is configured to input the output signal OUTj of the stage Xj (j=k+1) of the shift register 2a to the terminal S3 of the stage Xj of the shift register 2b in the shift register 2 of FIG. 4. That is, to the terminals S3 of both of the stages Xj and Xk, the output signal OUTi of the stage Xi that drives the gate bus line GL of the next stage is inputted.

First, FIG. 7 shows operating waveforms of the shift register of FIG. 4 with the voltage of the node N2 as obtained in a case of occurrence of a phenomenon that was not taken into consideration in Second Embodiment.

When, at the stage X1, the transistor M4 is put in an ON state at a point of time T1 and the potential of the node N1 is reset, the transistors M1, M2, and M3 are in an OFF state, so that the node N2 is floating. Therefore, the capacitor C1 retain charges at the node N2, so that the potential V (N2) of the node N2 falls by ΔV (N2) due to capacitive coupling. It should be noted here that ΔV (N2) is as follows:

$$\Delta V(N2)=(C1/(C1+Cm2s+Cm3s))\times(2\times VDD-(VSS+2\times Vth)-VSS),$$

where Cm2s is the gate-source capacitance of the transistor M2 and Cm3s is the gate-source capacitance of the transistor M3. Next, when, at a point of time T2, the transistor M4 is put in an OFF state and the transistor M2 is put in an ON state, the potential V (N2) of the node N2 becomes VDD−Vth. At this point of time, the node N1 is in a floating state, so that the potential V (N1) of the node N1 is raised due to capacitive coupling ΔV (N1) by the capacitor C1. It should be noted here that ΔV (N1) is as follows:

$$\Delta V(N1)=(C1/(C1+Cm1s+Cm4d+Cm5s+Cm5d))\times \Delta V(N2),$$

where Cm1s is the gate-source capacitance of the transistor M1, Cm4d is the gate-drain capacitance of the transistor M4, Cm5s is the gate-source capacitance of the transistor M5, and Cm5d is the gate-drain capacitance of the transistor M5. If this rise causes a rise in the gate potential of the transistor M5 and, accordingly, a leakage in the transistor M5 to some extent, which was not taken into consideration in Second Embodiment, then the potential of the terminal OUT rises. Such a rise in potential may cause leakage of charges from a liquid crystal picture element electrode and malfunction of a shift register.

Next, FIG. 8 shows operating waveforms of the shift register of FIG. 6. If, at a point of time T3, the potential of the node N1 of the stage X1 is reset by a gate pulse that is outputted from the terminal OUT2 of the stage X2 that drives the gate bus line GL of the next stage, the transistor M2 is in an ON state, so that the node N2 is not floating and therefore does not fall due to the potential from the node N1. For this reason, at any point of time T4 after completion of output of the gate pulse from the terminal OUT1, the potential of the node N1 of the stage X1 can be prevented from being raised to cause a rise in the potential of the terminal OUT.

This makes it possible to prevent a rise in the potential of the terminal OUT from occurring due to the variation in the potential V (N1) of the node N1 through capacitive coupling and to suppress leakage of charges from a liquid crystal picture element electrode and malfunction of a shift register.

Fourth Embodiment

Figure 9:
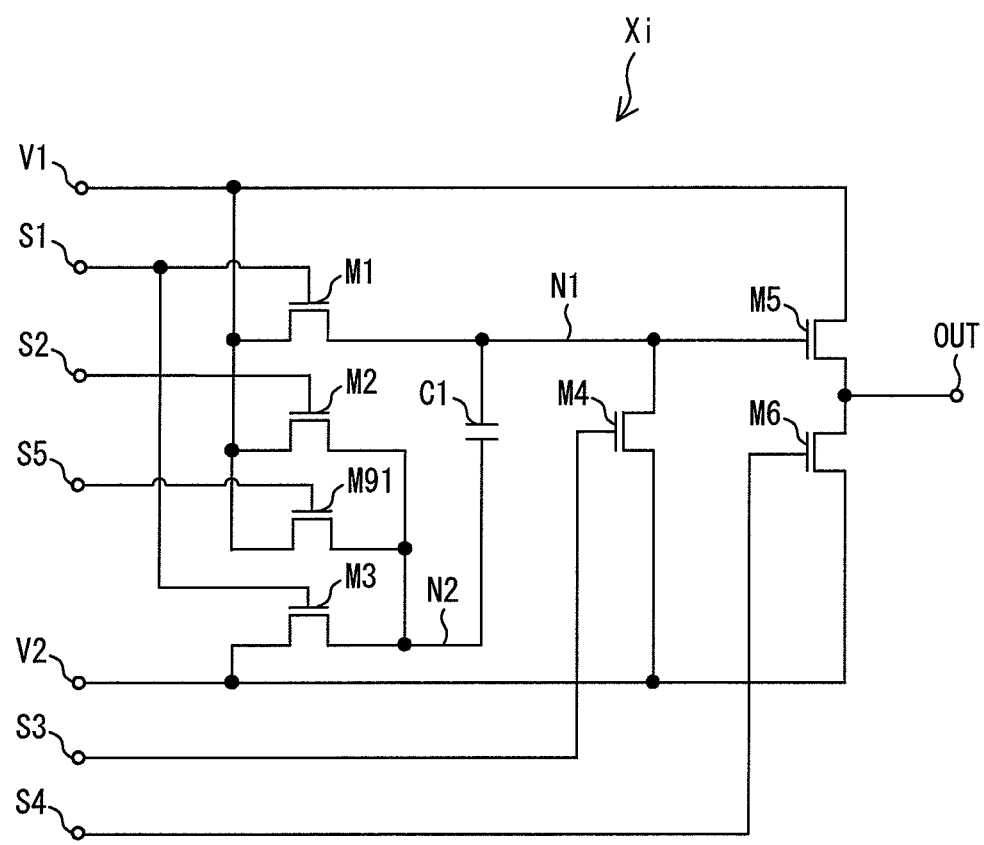
FIG. 9 is a circuit diagram showing a configuration of a stage included in a shift register in accordance with Fourth Embodiment of the present invention.

An explanation is made to Fourth Embodiment of a shift register with reference to FIG. 9.

FIG. 9 shows a configuration of each stage Xi provided in a shift register in accordance with the present Embodiment.

The stage Xi of FIG. 9 is configured by adding a transistor M91 (sixth switching element) to the stage Xi of FIG. 1. A gate of the transistor M91 is connected with the terminal S5, a drain of the transistor M91 is connected with the terminal V1, and a source of the transistor M91 is connected with the node N2. To the terminal S5, a same signal is inputted as that which is inputted to the terminal S3.

The stage Xi of FIG. 9 can be used in any one of the following: the shift register 1 of FIG. 2, the shift register 2 of FIG. 4, and the shift register 3 of FIG. 6. In each of the shift register 1 and 3, an output signal OUTi+1 of the stage Xi+1 coming immediately after the stage Xi is inputted to the terminal S5, and in the shift register 2, an output signal OUTi+2 of the stage Xi+2 coming next but one after the stage Xi is inputted to the terminal S5.

This causes the transistor M91 to be put in an ON state at the same time as the transistor M4 is put in an ON state and the potential of the node N1 is reset. Therefore, the potential of the node N2 is kept at a constant value of VDD−Vth, so that the potential of the node N2 can be prevented from falling due to capacitive coupling through the capacitor C1. Therefore, as in Third Embodiment, it is possible to prevent a rise in the potential of the terminal OUT from occurring due to the variation in the potential V (N1) of the node N1 through capacitive coupling and to suppress leakage of charges from a liquid crystal picture element electrode and malfunction of the shift register.

The transistor M91 can be used in a stage of another Embodiment.

Fifth Embodiment

Figure 10:
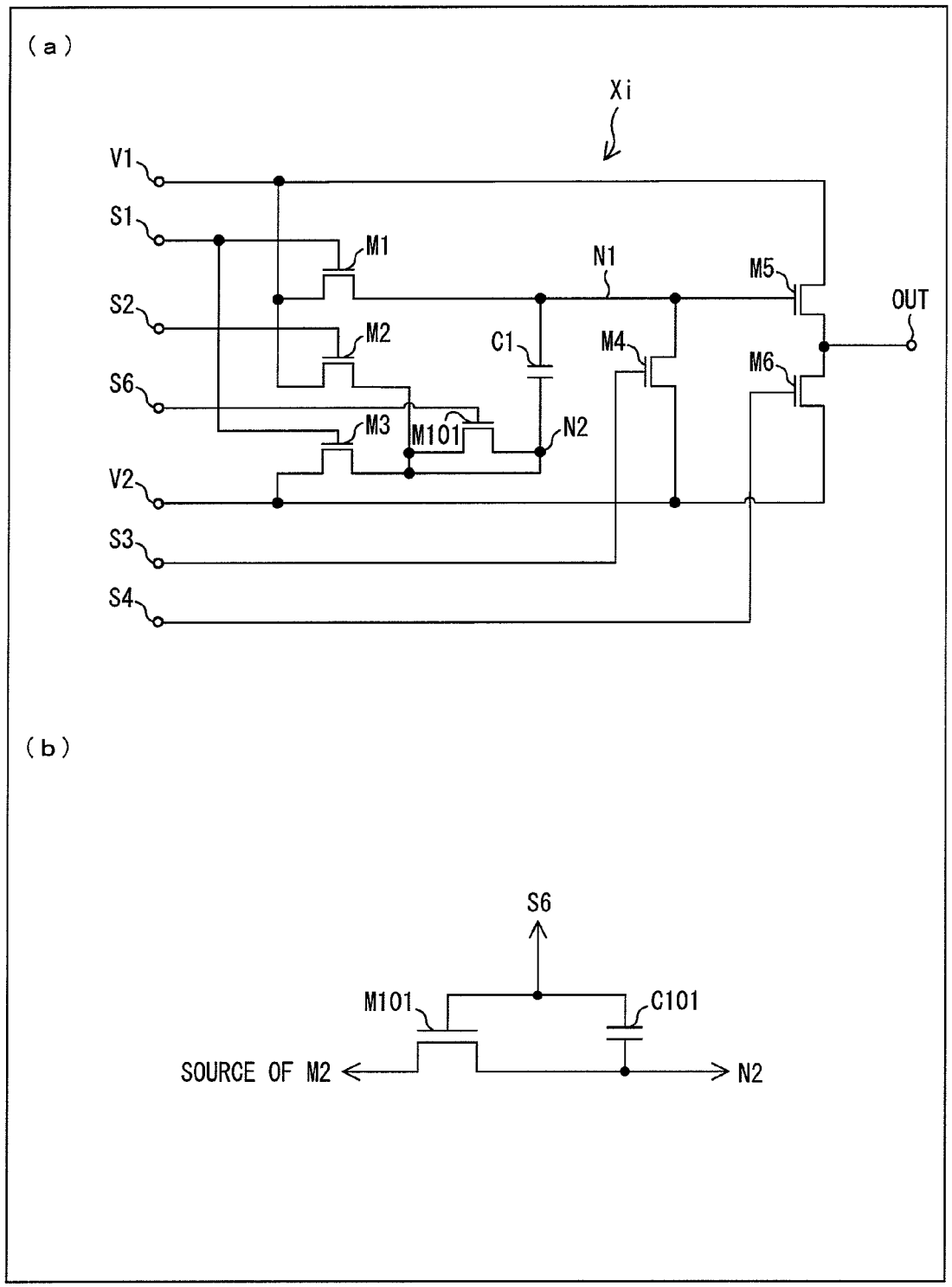
FIG. 10 is a diagram showing a configuration of a shift register in accordance with Fifth Embodiment of the present invention. (a) of FIG. 10 is a circuit diagram showing a configuration of a stage included in the shift register in accordance with Fifth Embodiment. (b) of FIG. 10 is a circuit diagram showing a configuration of a modification of the stage shown in (a) of FIG. 10.

An explanation is made to Fifth Embodiment of a shift register with reference to FIG. 10.

(a) of FIG. 10 shows a configuration of each stage Xi provided in a shift register in accordance with the present Embodiment.

The stage Xi of (a) of FIG. 10 is configured by adding a transistor (third transistor) M101 to the stage Xi of FIG. 1. It is assumed here that the transistor M2 serves as a second transistor. A gate of the transistor M101 is connected with the terminal S6, and a drain and a source of the transistor M101 is connected with the node N2. To the terminal S6, a signal opposite in phase to that which is inputted to the terminal S2 is inputted.

As the transistor M2 is put alternately in an ON state and an OFF state, the charges of the gate-source and gate-drain capacitances of the transistor M2 are taken in and sent out. Therefore, when the node N2 becomes floating, there can be a variation in the potential of the node N2 due to the charges of the gate-source capacitance of the transistor M2 thus taken in and sent out. If this variation is capacitively coupled to the node N1 through the capacitor C1 to affect the gate pulse waveform, there may occur leakage of charges from a liquid crystal picture element electrode and malfunction of the shift register. However, by disposing the transistor M101, whose source and drain are connected with the node N2, and inputting a signal to the gate of the transistor M101 opposite in phase to that which is inputted to the gate of the transistor M2, the influence of charges that flows into the node N2 due to the gate-source capacitance of the transistor M2 can be offset by the charges of the gate-source and gate-drain capacitances of the transistor M101 thus taken in and sent out. Since charging and discharging of the gate-source capacitance of the transistor M2 is offset by charging and discharging of the gate-source and gate-drain capacitances of the transistor M101, the channel width of the transistor M101 may be one-second of the channel width of the transistor M2.

Further, as shown in (b) of FIG. 10, a capacitor (second capacitor) C101 connected between the gate of the transistor M101 and the node N2 may be further provided. This allows the potential of the node N2 to fall through the capacitor C101 and, further, the potential of the node N1 to fall through the capacitor C1 when the signal that is inputted to the terminal S6 falls to a Low level. This makes it possible to surely put the transistor M5 in an OFF state when the terminal OUT is to be kept at a Low level and to satisfactorily suppress a threshold-voltage shift phenomenon by reducing a direct-current voltage component that is applied to the gate of the transistor M5.

Thus, the present Embodiment makes it possible to prevent a rise in the potential of the terminal OUT from occurring due to the variation in the potential V (N2) of the node N2 through charge injection from the transistor M2 and to suppress leakage of charges from a liquid crystal picture element electrode and malfunction of the shift register.

The transistor M101 can be used in a stage of another Embodiment. For example, the transistor M101 can be used in combination with the stage Xi of (a) and (b) of FIG. 10.

Sixth Embodiment

Figure 11:
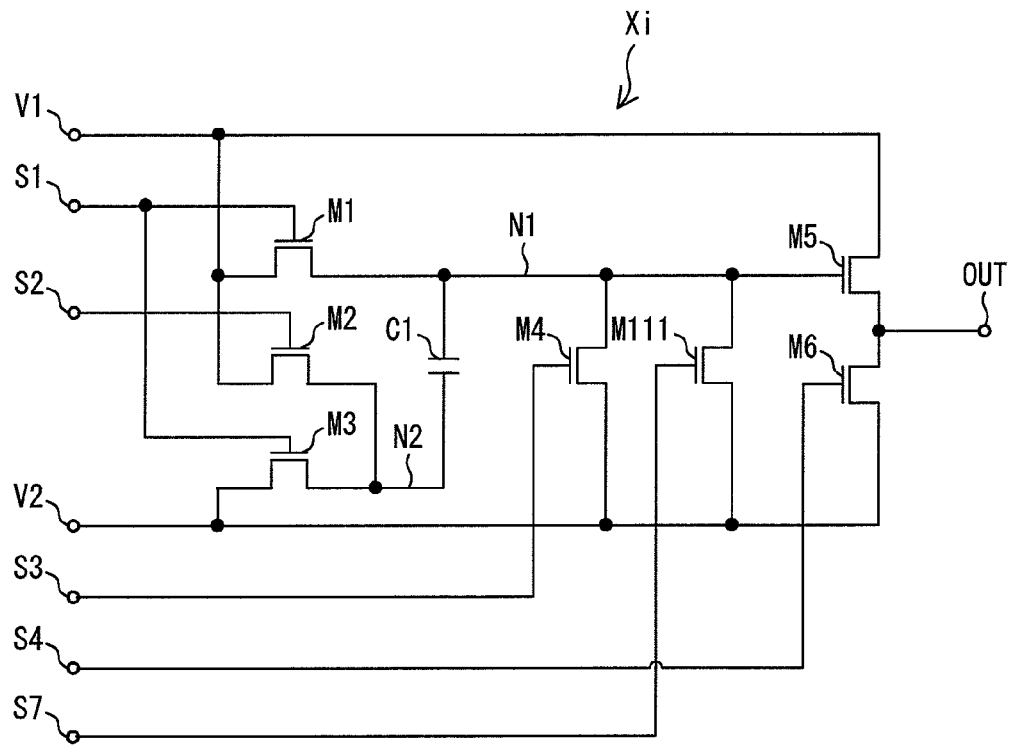
FIG. 11 is a circuit diagram showing a configuration of a stage included in a shift register in accordance with Sixth Embodiment of the present invention.

An explanation is made to Sixth Embodiment of a shift register with reference to FIG. 11.

FIG. 11 shows a configuration of each stage Xi provided in a shift register in accordance with the present Embodiment.

The stage Xi of FIG. 11 is configured by adding a transistor (seventh switching element) M111 to the stage Xi of FIG. 1. A gate of the transistor M111 is connected with the terminal S7, a drain of the transistor M111 is connected with the node N1, and a source of the transistor M111 is connected with the terminal V2.

The stage Xi of FIG. 11 can be used in any one of the following: the shift register 1 of FIG. 2, the shift register 2 of FIG. 4, and the shift register 3 of FIG. 6. However, in the shift register 1, the output signal OUTi+2 of the stage Xi+2 coming next but one after the stage Xi is inputted to the terminal S7, and in each of the shift registers 2 and 3, an output signal OUTi+3 of the stage Xi+3 coming next but two after the stage Xi or an output signal OUTi+4 of the stage Xi+3 coming next but three after the stage Xi is inputted to the terminal S7. That is, to the terminal S7, there is inputted a signal having a High level period within a second active clock pulse period of the first clock signal after input of a shift pulse into the stage Xi.

Thus, while, after the stage Xi has been reset by a signal inputted from the terminal S3, the potential of the node N1 is being raised by the potential of the node N2 becoming VDD−Vth due to a clock pulse coming after a clock signal CK1 (odd-numbered stage Xi) or CK2 (even-numbered stage Xi)

that is inputted from the terminal S2, the transistor M111 is put in an ON state, so that the node N1 is connected with the terminal V2.

This makes it possible to prevent a rise in the potential of the terminal OUT from occurring due to the variation in the potential V (N1) of the node N1 through capacitive coupling and to suppress leakage of charges from a liquid crystal picture element electrode and malfunction of the shift register.

The transistor M111 can be used in a stage of another Embodiment. For example, the transistor M111 can be used in combination with the stage Xi of FIG. 9 and (a) and (b) of FIG. 10.

Seventh Embodiment

Figure 12:
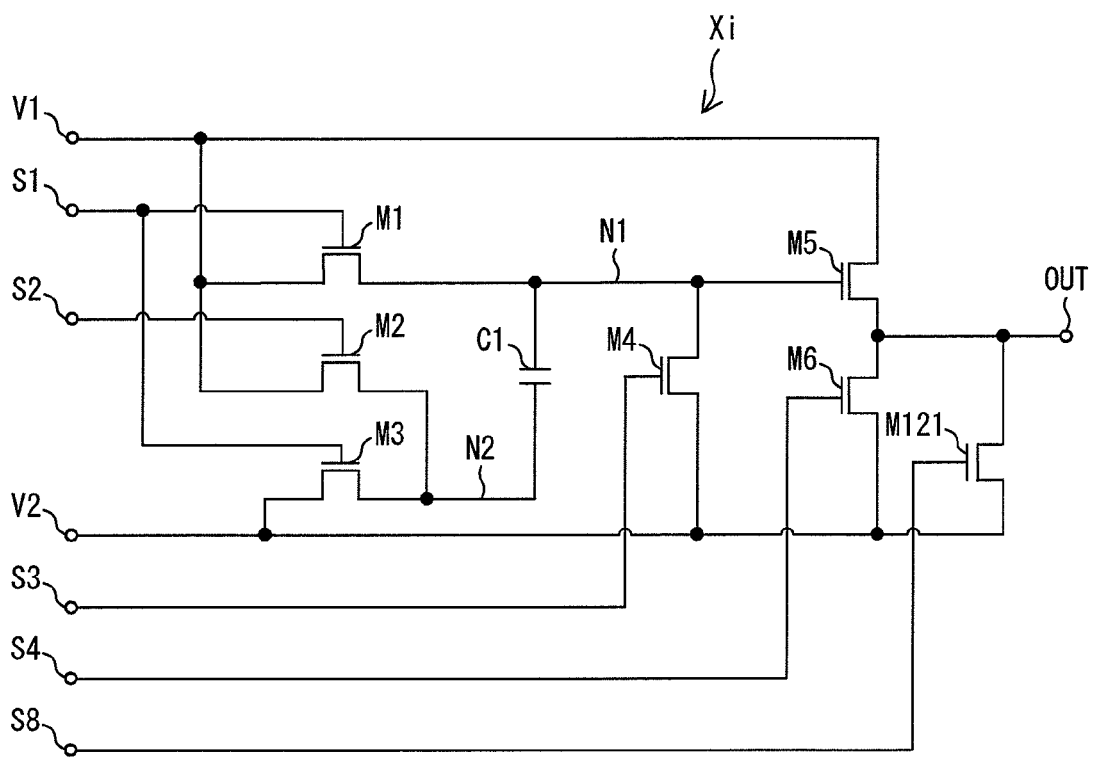
FIG. 12 is a circuit diagram showing a configuration of a stage included in a shift register in accordance with Seventh Embodiment of the present invention.

An explanation is made to Seventh Embodiment of a shift register with reference to FIG. 12.

FIG. 12 shows a configuration of each stage Xi provided in a shift register in accordance with the present Embodiment.

The stage Xi of FIG. 12 is configured by adding a transistor (fifth transistor) M121 to the stage Xi of FIG. 1. It is assumed here that the transistor M6 serves as a fourth transistor. A gate of the transistor M121 is connected with the terminal S8, a drain of the transistor M121 is connected with the terminal OUT, and a source of the transistor M121 is connected with the terminal V2.

The stage Xi of FIG. 12 can be used in any one of the following: the shift register 1 of FIG. 2, the shift register 2 of FIG. 4, and the shift register 3 of FIG. 6. However, in the shift register 1, a same signal is inputted to the terminal S8 as that which is inputted to the terminal S3, and in each of the shift registers 2 and 3, the output signal OUTi+2 of the stage Xi+2 coming next but one after the stage Xi is inputted to the terminal S8. That is, to the terminal S8 is inputted a gate pulse outputted from a stage Xi different from the stage Xi firstly after the stage Xi has completely output the shift pulse.

When the transistor M6, to which the first conduction and blocking control signal or the second clock signal is inputted, is an amorphous silicon TFT, the transistor M6 gradually increases in threshold voltage Vth due to a shift phenomenon as it is used. This makes it hard for the transistor M6 to be put in an ON state, thus making it difficult to quickly lower the terminal OUT to a Low level. This causes a distortion in rising waveform of the gate pulse. Such a distortion may cause data that is supposed to be written into a picture element connected to the gate bus line GL of the next stage to be written into a picture element connected to the gate bus line GL of the present stage and thus cause deterioration in display quality. However, since the potential of the terminal OUT can be reset by the transistors M6 and M121 by disposing the transistor M121 as described above, a sharp rise in waveform of the gate pulse can be achieved.

Since, as described above, the present Embodiment can achieve a sharp fall in waveform of the gate pulse, the present Embodiment can prevent an unnecessary lengthening of the charging time from causing data that is supposed to be written into a picture element connected to the gate bus line GL of the next stage to be written into a picture element connected to the gate bus line GL of the present stage and thereby improve display quality.

The transistor M121 can be used in a stage of another Embodiment. For example, the transistor M121 can be used in combination with the stage Xi of FIG. 9, (a) and (b) of FIG. 10, and FIG. 11.

Eighth Embodiment

An explanation is made to Eighth Embodiment of a shift register with reference to FIG. 13.

FIG. 13 shows a configuration of each stage Xi provided in a shift register in accordance with the present Embodiment.

The stage Xi of FIG. 13 is configured by replacing the transistor M1 of the stage Xi of FIG. 1 with a transistor (input gate, fifth switching element, first transistor) M11. A gate and a drain of the transistor M11 are connected with each other and then with the terminal S1, and a source of the transistor M11 is connected with the node N1.

The stage Xi of FIG. 13 can be used in any one of the following: the shift register 1 of FIG. 2, the shift register 2 of FIG. 4, and the shift register 3 of FIG. 6.

By changing from connecting the drain of the first transistor to the terminal V1 as in the Embodiments above to connecting the drain of the first transistor to the terminal S1 as in the transistor M11, a leakage into the node N1 through the first transistor can be reduced.

Further, in a case where the first transistor is an amorphous silicon TFT, when the gate potential is lower than the source-drain potential, the threshold value Vth gradually decreases due to a shift phenomenon, so that there is an increase in leak current from the first transistor. The occurrence of such a leak causes a rise in the potential V (N1) of the node N1, thus inviting leakage of charges from a liquid crystal picture element and malfunction of the shift register. However, since the drain of the transistor M11 is connected with the terminal S1, the gate potential can be prevented from becoming lower than the drain potential. This makes it possible to suppress a decrease in the threshold voltage Vth of the transistor M11.

Thus, the present Embodiment can suppress a leak current from the first transistor and thereby prevent leakage of charges from a liquid crystal picture element and malfunction of the shift register.

The transistor M11 can be used in a stage of another Embodiment. For example, the transistor M11 can be used in combination with the stage Xi of FIG. 9, (a) and (b) of FIG. 10, FIG. 11, and FIG. 12.

Ninth Embodiment

Figure 14:
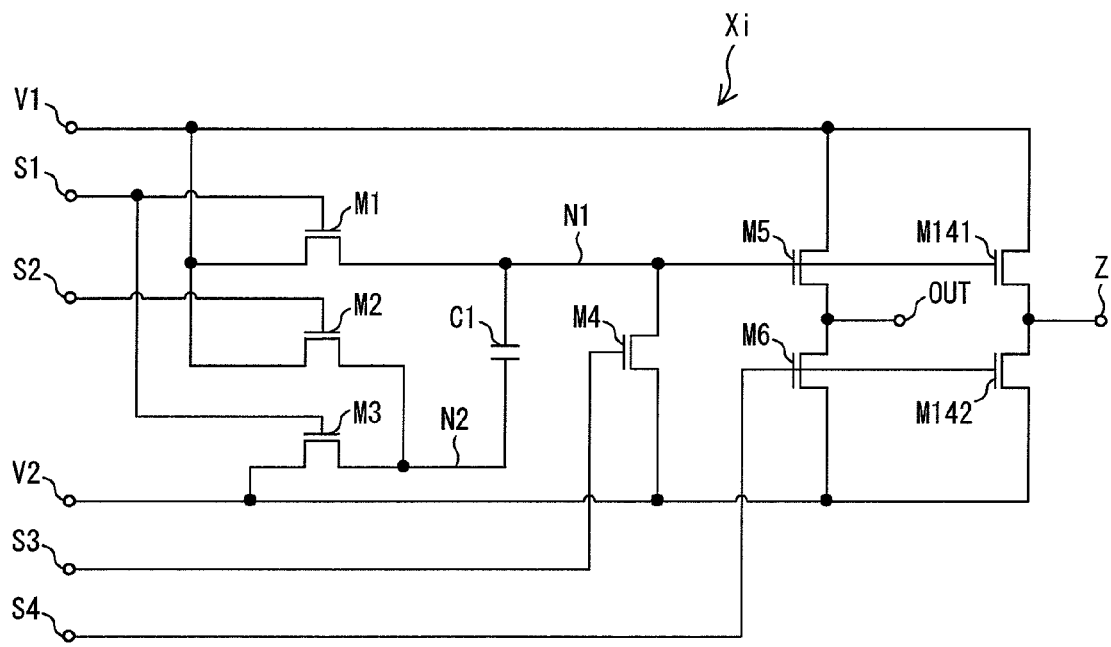
FIG. 14 is a circuit diagram showing a configuration of a stage included in a shift register in accordance with Ninth Embodiment of the present invention.

The following describes Ninth Embodiment of a shift register with reference to FIG. 14.

FIG. 14 shows a configuration of a stage Xi included in a shift register of the present embodiment.

The stage Xi of FIG. 14 has a configuration obtained by adding, to the stage Xi of FIG. 1, a transistor (second output transistor) M141 and a transistor (eighth switching element) M142.

A gate of the transistor M141 is connected with a node N1, a drain of the transistor M141 is connected with a terminal V1, and a source of the transistor M141 is connected with a terminal (second output terminal) Z. That is, a direct voltage which is a power source voltage VDD is applied to the drain of the transistor M141, and the source of the transistor M141 serves as a second output terminal which is an output terminal of the stage Xi that is different from a first output terminal. A continuous stage group including another output terminal in addition to the first output terminal as above is referred to as a plural output continuous stage group. A gate of the transistor M142 is connected with a terminal S4, a drain of the transistor M142 is connected with the terminal Z, and a source of the transistor M142 is connected with a terminal V2.

A signal inputted to the gate of the transistor M142 is a second conduction and blocking control signal. The second conduction and blocking control signal is a signal whose active period does not overlap that of the first clock signal. In the present embodiment, the second conduction and blocking control signal is identical to a first conduction and blocking control signal inputted to a gate of a transistor M6. Further, in the present embodiment, the second conduction and blocking control signal is a clock signal whose phase is reverse to that of the first clock signal (i.e., a clock signal identical to a second clock signal). The second conduction and blocking control signal is not necessarily identical to the first conduction and blocking control signal.

The terminal OUT is connected with a gate bus line GL driven by the stage Xi, and a transistor M5 outputs a gate pulse. The transistor M6 resets the terminal OUT to a Low level. The terminal Z is connected with a terminal S1 of another stage X1 to which a shift pulse from the stage X1 is inputted, and the transistor M141 outputs the shift pulse. The transistor M142 resets the terminal Z to a Low level.

As described earlier, in the present embodiment, a stage which outputs a gate pulse and a stage which outputs control signals such as a set signal (shift pulse) and a reset signal for setting/resetting another stage Xi are separate from each other. Note that any number of stages which are similarly separate from each other may be further provided.

The stage Xi of FIG. 14 can be applied to any of the shift register 1 of FIG. 2, the shift register 2 of FIG. 4, and the shift register 3 of FIG. 6.

According to the arrangement, output of a gate pulse and output of control signals for setting/resetting another stage Xi (previous stage Xi or next stage Xi) are separate from each other. This makes it possible to avoid interference between these outputs.

In a case where the stage which outputs the control signals is further separated into a stage which outputs the set signal (shift pulse) for the another stage and a stage which outputs the reset signal for the another stage, it is possible to avoid an interference between the output of the set signal and the output of the reset signal and to cause the shift register to operate more stably. In this case, for example, a third output transistor which is similar to the transistor M141 and a ninth switching element which is similar to the transistor M142 are added to the configuration of FIG. 14. A source of the third output transistor is a third output terminal which is an output terminal of the stage Xi that is different from each of the first output terminal and the second output terminal. For example, the second output terminal (terminal Z) outputs the set signal (shift pulse), and the third output terminal outputs the reset signal.

A signal inputted to a conduction and blocking control terminal of the ninth switching element is a third conduction and blocking control signal. The third conduction and blocking control signal is a signal whose active period does not overlap that of the first clock signal. In the present embodiment, the third conduction and blocking control signal is identical to the first conduction and blocking control signal inputted to the gate of the transistor M6. Further, in the present embodiment, the second conduction and blocking control signal is a clock signal whose phase is reverse to that of the first clock signal (i.e. a clock signal identical to the second clock signal). The third conduction and blocking control signal is not necessarily identical to each of the first conduction and blocking control signal and the second conduction and blocking control signal.

Note that the transistors M141 and M142 can be applied to a stage of another embodiment. For example, the transistors M141 and M142 can be used in combination with the stage Xi of FIG. 9, (a) and (b) of FIG. 10, FIG. 11, FIG. 12, and FIG. 13. Note also that any number of stages which are similarly separate from each other may be further provided.

As described above, according to the present embodiment, it is possible to prevent malfunction and performance degradation of a shift register that are caused by interference between output of a gate pulse and output of control signals for setting/resetting another stage Xi.

Tenth Embodiment

Figure 15:
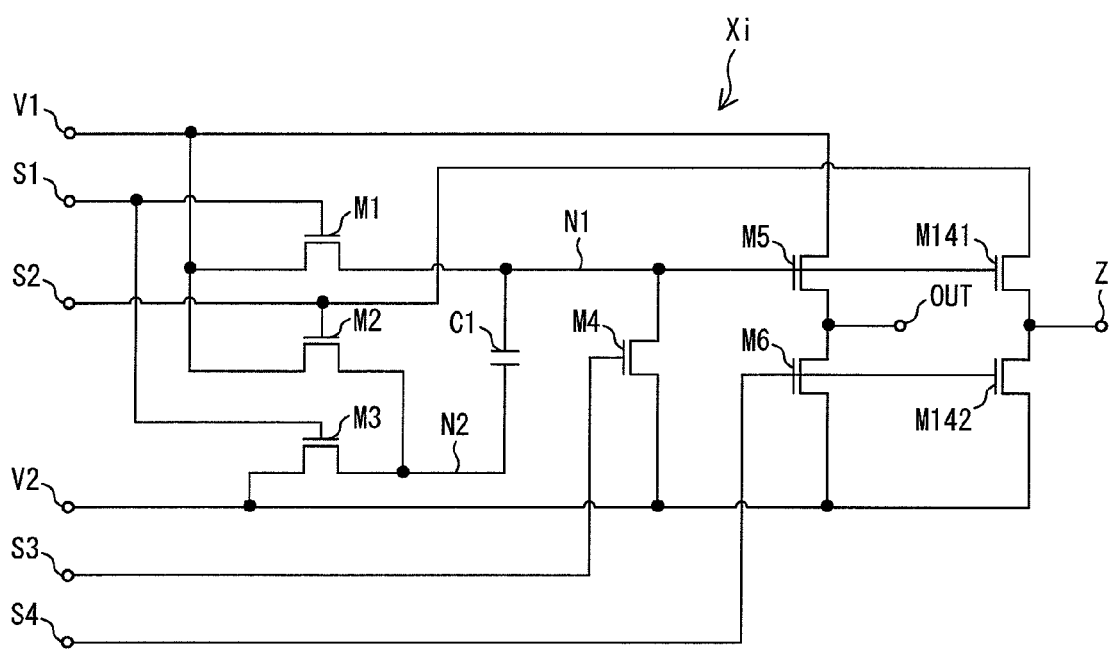
FIG. 15 is a circuit diagram showing a configuration of a stage included in a shift register in accordance with Tenth Embodiment of the present invention.

The following describes Tenth Embodiment of a shift register with reference to FIG. 15.

FIG. 15 shows a configuration of a stage Xi included in a shift register of the present embodiment.

The stage Xi of FIG. 15 has a configuration obtained by adding, to the stage Xi of FIG. 1, a transistor (second output transistor) M141 and a transistor (eighth switching element) M142. In the present embodiment, a transistor M4 serves as a third switching element.

A gate of the transistor M141 is connected with a node N1, a drain of the transistor M141 is connected with a terminal S2, and a source of the transistor M141 is connected with a terminal (second output terminal) Z. That is, a first clock signal is inputted to the drain of the transistor M141, and the source of the transistor M141 serves as a second output terminal which is an output terminal of the stage Xi that is different from a first output terminal. A continuous stage group including another output terminal in addition to the first output terminal as above is referred to as a plural output continuous stage group. A gate of the transistor M142 is connected with a terminal S4, a drain of the transistor M142 is connected with the terminal Z, and a source of the transistor M142 is connected with a terminal V2.

A signal inputted to the gate of the transistor M142 is a second conduction and blocking control signal. The second conduction and blocking control signal is a signal whose active period does not overlap that of the first clock signal. In the present embodiment, the second conduction and blocking control signal is identical to a first conduction and blocking control signal inputted to a gate of a transistor M6. Further, in the present embodiment, the second conduction and blocking control signal is a clock signal whose phase is reverse to that of the first clock signal (i.e., a clock signal identical to a second clock signal). The second conduction and blocking control signal is not necessarily identical to the first conduction and blocking control signal.

The terminal Z is connected with a terminal S1 of another stage X1 to which a shift pulse from the stage X1 is inputted, and the transistor M141 outputs the shift pulse. The transistor M142 resets the terminal Z to a Low level.

As described earlier, in the present embodiment, a stage which outputs a gate pulse and a stage which outputs control signals such as a set signal (shift pulse) and a reset signal for setting/resetting another stage Xi are separate from each other. Note that any number of stages which are similarly separate from each other may be further provided.

In a case where the stage which outputs the control signals is further separated into a stage which outputs the set signal (shift pulse) for the another stage and a stage which outputs the reset signal for the another stage, it is possible to avoid an interference between the output of the set signal and the output of the reset signal and to cause the shift register to operate more stably. In this case, for example, a third output transistor which is similar to the transistor M141 and a ninth switching element which is similar to the transistor M142 are added to the configuration of FIG. 15. A source of the third output transistor is a third output terminal which is an output terminal of the stage Xi that is different from each of the first output terminal and the second output terminal. For example, the second output terminal (terminal Z) outputs the set signal (shift pulse), and the third output terminal outputs the reset signal.

A signal inputted to a conduction and blocking control terminal of the ninth switching element is a third conduction and blocking control signal. The third conduction and blocking control signal is a signal whose active period does not overlap that of the first clock signal. In the present embodiment, the third conduction and blocking control signal is identical to the first conduction and blocking control signal inputted to the gate of the transistor M6. Further, in the present embodiment, the second conduction and blocking control signal is a clock signal whose phase is reverse to that of the first clock signal (i.e., a clock signal identical to the second clock signal). The third conduction and blocking control signal is not necessarily identical to each of the first conduction and blocking control signal and the second conduction and blocking control signal.

As described earlier, since the drain of the transistor M141 which outputs the control signals for setting/resetting a previous stage Xi or a next stage Xi is connected with the terminal S2, it is possible to prevent a rise in the potential V (N1) of the node N1 due to capacitive coupling, thereby preventing a rise in potential of the terminal Z.

The stage Xi of FIG. 15 can be used for any of the shift register 1 of FIG. 2, the shift register 2 of FIG. 4, the shift register 3 of FIG. 6, a shift register 4 of FIG. 16 (described below), and a shift register 5 of FIG. 18 (described later).

Figure 16:
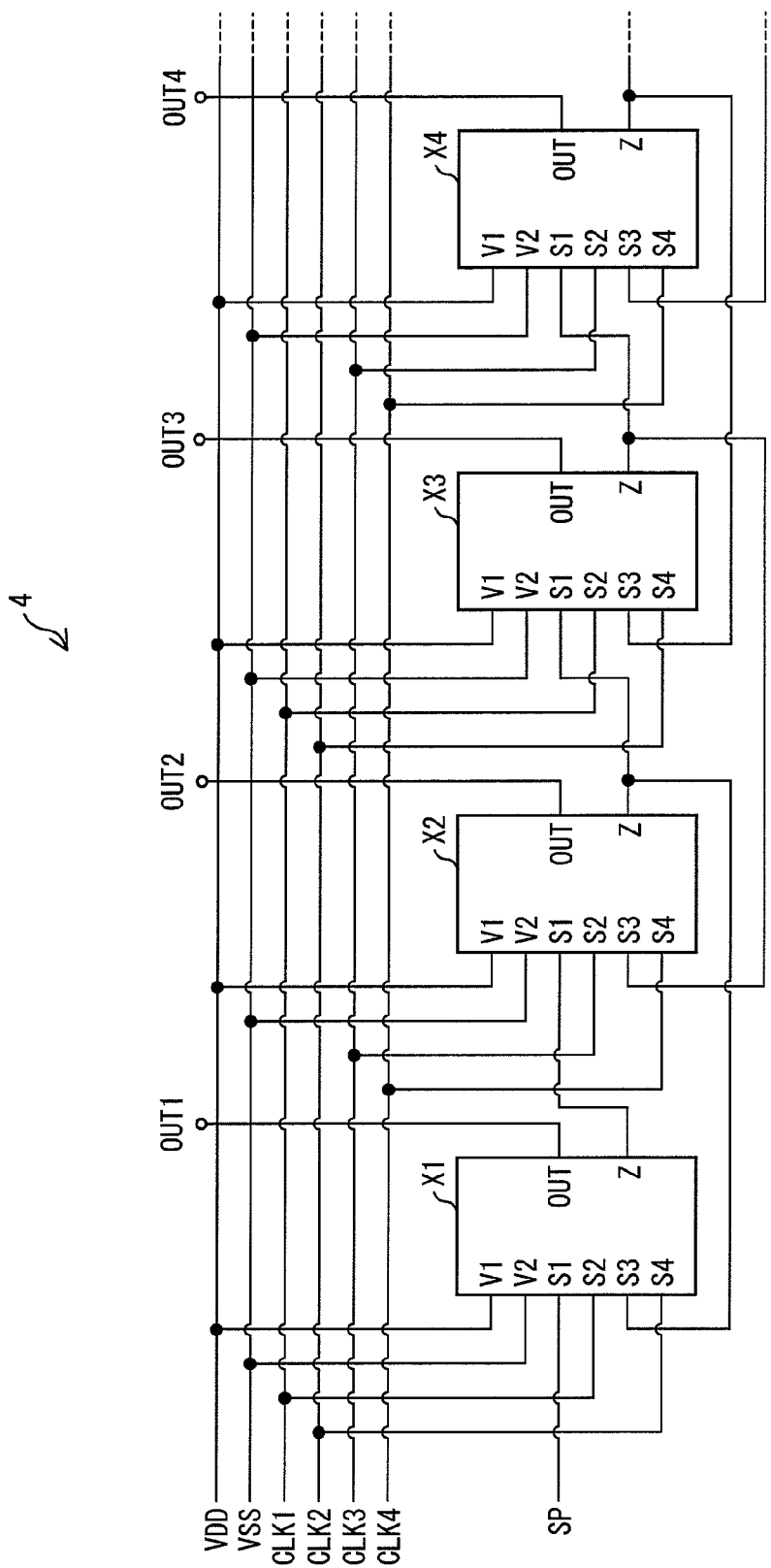
FIG. 16 is a block diagram showing a first configuration example of the shift register in accordance with Tenth Embodiment.

FIG. 16 shows a configuration of the shift register 4.

The shift register 4 is configured such that a plurality of stages Xi (i is an natural number) corresponding to gate bus lines GL, respectively, are series-connected with one another.

In each odd-numbered stage Xi (i=1, 3, 5, . . . ), a power source voltage (first direct voltage) VDD which is a High level (i.e. gate pulse level) of a gate drive voltage is inputted to the terminal V1, a power source voltage (second direct voltage) VSS which is a Low level of the gate drive voltage is inputted to the terminal V2, an output signal from a terminal Z of a previous stage Xi−1 is inputted to the terminal S1, a clock signal (first clock signal) CLK1 is inputted to the terminal S2, an output signal from a terminal Z of a next stage Xi+1 is inputted to the terminal S3, and a clock signal (first conduction and blocking control signal, second conduction and blocking control signal, second clock signal) CLK2 is inputted to the terminal S4. An output signal OUTi of the stage Xi is outputted from the terminal OUT. However, a gate start pulse SP instead of the output signal OUTi−1 is inputted to the terminal S1 of the stage X1.

In each even-numbered stage Xi (i=2, 4, 6, . . . ), a power source voltage (first direct voltage) VDD which is a High level (i.e. gate pulse level) of a gate drive voltage is inputted to the terminal V1, a power source voltage (second direct voltage) VSS which is a Low level of the gate drive voltage is inputted to the terminal V2, an output signal from a terminal Z of a previous stage Xi−1 is inputted to the terminal S1, a clock signal (first clock signal) CLK3 is inputted to the terminal S2, an output signal from a terminal Z of a next stage Xi+1 is inputted to the terminal S3, and a clock signal (first conduction and blocking control signal, second conduction and blocking control signal, second clock signal) CLK4 is inputted to the terminal S4. An output signal OUTi of the stage Xi is outputted from the terminal OUT.

The second direct voltage is lower than the first direct voltage.

Figure 17:
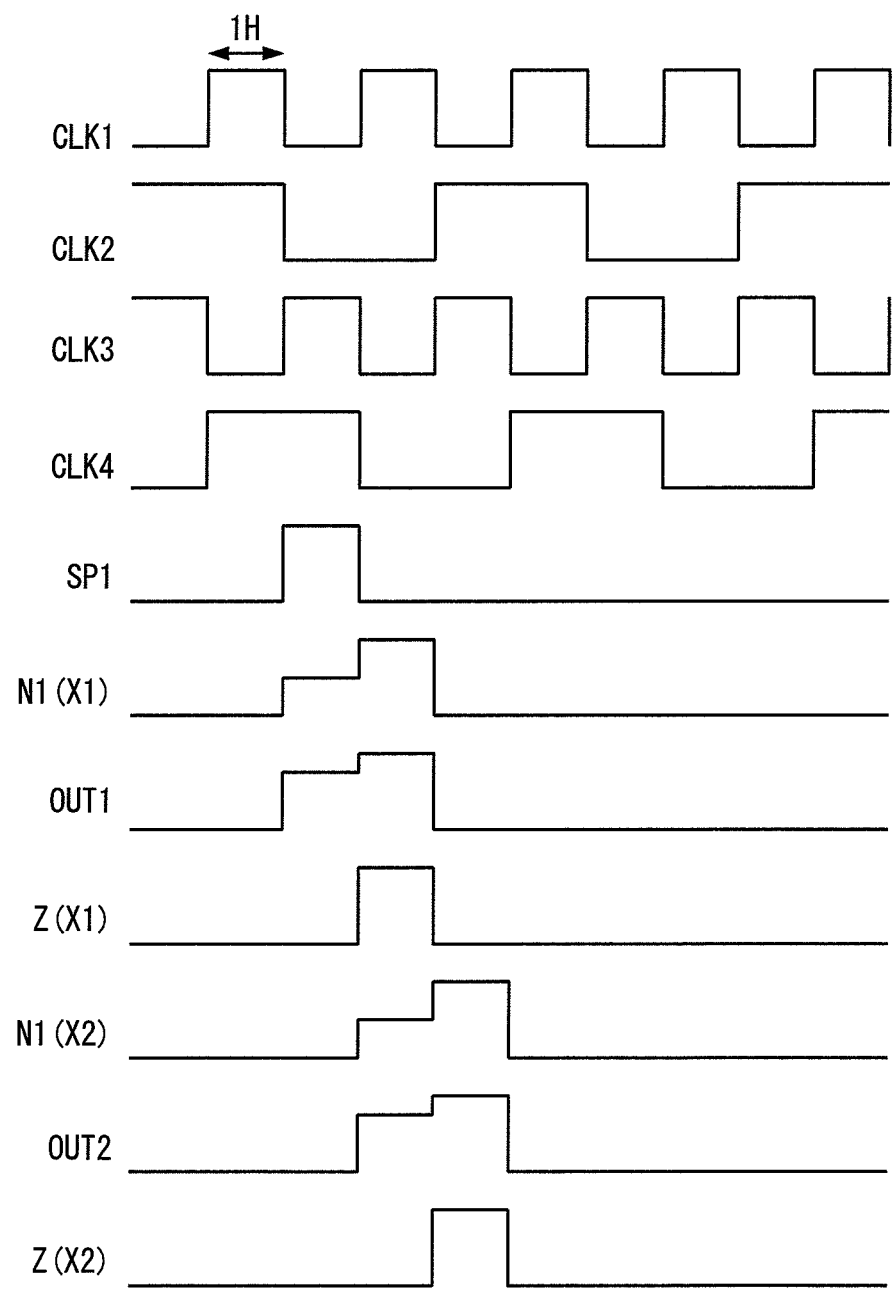
FIG. 17 is a waveform chart showing an operation of the first configuration example of the shift register in accordance with Tenth Embodiment.

FIG. 17 shows operation waveforms of the shift register 4.

A clock signal CK2 has a pulse width twice of a pulse width (1H) of a clock signal CK1, and a length of each of a High level period (active period) and a Low level period (non-active period) of the clock signal CK2 is equal to a length of continuous two periods of the clock signal CK1a former of which is a Low level period (non-active period) and a latter of which is a High level period (active period).

A clock signal CK4 has a pulse width twice of a pulse width (1H) of a clock signal CK3, and a length of each of a High level period (active period) and a Low level period (non-active period) of the clock signal CK4 is equal to a length of continuous two periods of the clock signal CK3 a former of which is a Low level period (non-active period) and a latter of which is a High level period (active period).

The clock signal CK1 has a phase reverse to that of the clock signal CK3. The gate start pulse SP corresponds to one clock pulse of the clock signal CK3.

In this case, in a case where a shift pulse is inputted to the terminal S1 so that the transistor M5 is brought into an ON state by a potential VDD−Vth of the node N1, a gate pulse outputted from the terminal OUT is outputted only during a period corresponding to two clock pulses during which a potential increases in a step-like manner as shown by the waveforms of the output signals OUT1, OUT2, . . . . Meanwhile, a shift pulse outputted from the terminal Z is outputted only during a period corresponding to one clock pulse of the clock signals CLK1 and CLK2 which period corresponds to a latter period of a gate pulse of the stage X1 as shown by the waveforms of the output signals Z(X1), Z(X2), . . . . Accordingly, during a former period of the gate pulse, pre-charging of a picture element is carried out, and during the latter period, main writing of a data signal is carried out and a shift pulse can be transmitted to the next stage Xi+1.

According to the shift register 4, it is possible to reduce the number of gate start pulses which are input signals necessary for obtaining equivalent output signals for pre-charging, as compared with the shift register 2 of FIG. 4.

Figure 18:
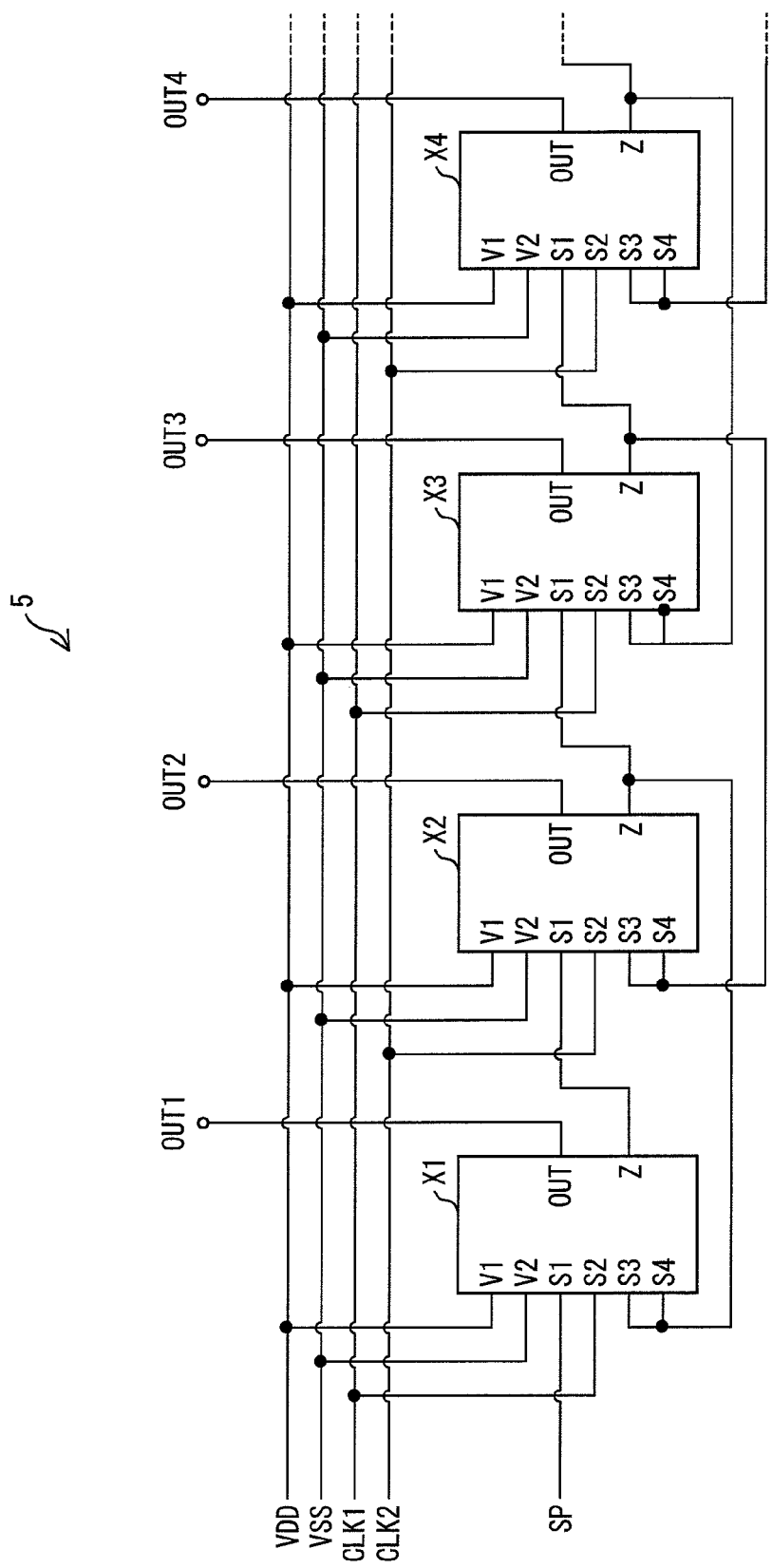
FIG. 18 is a block diagram showing a second configuration example of the shift register in accordance with Tenth Embodiment.

FIG. 18 shows a configuration of a shift register 5.

The shift register 5 is configured such that a plurality of stages Xi (i is a natural number) corresponding to gate bus lines GL, respectively, are series-connected with one another.

In each odd-numbered stage Xi (i=1, 3, 5, . . . ), a power source voltage (first direct voltage) VDD which is a High level (i.e. gate pulse level) of a gate drive voltage is inputted to the terminal V1, a power source voltage (second direct voltage) VSS which is a Low level of the gate drive voltage is inputted to the terminal V2, an output signal from a terminal Z of a previous stage Xi−1 is inputted to the terminal S1, a clock signal (first clock signal) CLK1 is inputted to the terminal S2, an output signal from a terminal Z of a next stage Xi+1 is inputted to each of the terminals S3 and S4, and an output signal OUTi of the stage Xi is outputted from the terminal OUT. However, a gate start pulse SP instead of the output signal OUTi−1 is inputted to the terminal S1 of the stage X1.

In each even-numbered stage Xi (i=2, 4, 6, . . . ), a power source voltage (first direct voltage) VDD which is a High level (i.e. gate pulse level) of a gate drive voltage is inputted to the terminal V1, a power source voltage (second direct voltage) VSS which is a Low level of the gate drive voltage is inputted to the terminal V2, an output signal from a terminal Z of a previous stage Xi−1 is inputted to the terminal S1, a clock signal (first clock signal) CLK2 is inputted to the terminal S2, an output signal from a terminal Z of a next stage Xi+1 is inputted to the terminals S3 and S4, and an output signal OUTi of the stage Xi is outputted from the terminal OUT.

The second direct voltage is lower than the first direct voltage.

FIG. 19 shows operation waveforms of the shift register 5.

Each of the clock signal CK1 and the clock signal CK2 has a pulse width of 1H, and the clock signal CK1 has a phase reverse to that of the clock signal CK2. The gate start pulse SP corresponds to one clock pulse of the clock signal CK2.

In this case, in a case where a shift pulse is inputted to the terminal S1 so that the transistor M5 is brought into an ON state by a potential VDD−Vth of the node N1, a gate pulse outputted from the terminal OUT is outputted only during a period corresponding to two clock pulses during which a potential increases in a step-like manner as shown by the waveforms of the output signals OUT1, OUT2, . . . . Meanwhile, a shift pulse outputted from the terminal Z is outputted only during a period corresponding to one clock pulse of the clock signals CLK1 and CLK2 which period corresponds to the latter half of a period of a gate pulse of the stage X1 as shown by the waveforms of the output signals Z(X1), Z(X2), . . . . Accordingly, during the former half of a period of the gate pulse, pre-charging of a picture element can be carried out, and during the latter half of the period, main writing of a data signal can be carried out and a shift pulse can be transmitted to the next stage Xi+1.

Use of the shift register 5 enables reducing the number of clock signals which are input signals necessary for obtaining equivalent output signals for pre-charging, as compared with the shift register 2 of FIG. 4.

With the present Embodiment, it is possible to prevent a rise in the potential V (N1) of the node N1 due to capacitive coupling and prevent a rise in an output from the terminal Z during an unnecessary period, thereby preventing malfunction of the shift register. Further, it is possible to reduce the number of required input signals externally supplied to the shift register.

Note that another embodiment can be combined with the stage Xi of FIG. 15. For example, it is possible to combine, with the stage Xi of FIG. 15, the transistor M91 of FIG. 9, the transistor M101 of FIG. 10, the transistor M111 of FIG. 11, the transistor M121 of FIG. 12, and the transistor M11 of FIG. 13. In a case where a stage which outputs a set signal to be supplied to another stage Xi and a stage which outputs a reset signal are separate from each other, it is possible to cause the shift register to operate more stably.

Eleventh Embodiment

The following describes Eleventh Embodiment of a shift register with reference to FIG. 20.

FIG. 20 shows a configuration of a stage Xi included in a shift register of the present embodiment.

The stage Xi of FIG. 20 has a configuration obtained by adding, to the stage Xi of FIG. 1, a transistor (second output transistor) M141 and a transistor (eighth switching element) M142.

A gate of the transistor M141 is connected with a node N1, a drain of the transistor M141 is connected with a terminal V3, and a source of the transistor M141 is connected with a terminal (second output terminal) Z. Independently of a power source voltage VDD, a third direct voltage which can be arbitrarily set to be larger than a power source voltage VSS is supplied and applied to the terminal V3. That is, the third direct voltage is applied to the drain of the transistor M141, and the source of the transistor M141 serves as a second output terminal which is an output terminal of the stage Xi that is different from a first output terminal. A continuous stage group including another output terminal in addition to the first output terminal as above is referred to as a plural output continuous stage group. A gate of the transistor M142 is connected with a terminal S4, a drain of the transistor M142 is connected with the terminal Z, and a source of the transistor M142 is connected with a terminal V2.

A signal inputted to the gate of the transistor M142 is a second conduction and blocking control signal. The second conduction and blocking control signal is a signal whose active period does not overlap that of the first clock signal. In the present embodiment, the second conduction and blocking control signal is identical to a first conduction and blocking control signal inputted to a gate of a transistor M6. Further, in the present embodiment, the seqond conduction and blocking control signal is a clock signal whose phase is reverse to that of the first clock signal (i.e., a clock signal identical to a second clock signal). The second conduction and blocking control signal is not necessarily identical to the first conduction and blocking control signal.

The terminal Z is connected with a terminal S1 of another stage Xi to which a shift pulse from the stage Xi is inputted, and the transistor M141 outputs the shift pulse. The transistor M142 resets the terminal Z to a Low level.

As described earlier, in the present embodiment, a stage which outputs a gate pulse and a stage which outputs control signals such as a set signal (shift pulse) and a reset signal for setting/resetting another stage Xi are separate from each other. Note that any number of stages which are similarly separate from each other may be further provided.

In a case where the stage which outputs the control signals is further separated into a stage which outputs the set signal (shift pulse) for the another stage and a stage which outputs the reset signal for the another stage, it is possible to avoid an interference between the output of the set signal and the output of the reset signal and to cause the shift register to operate more stably. In this case, for example, a third output transistor which is similar to the transistor M141 and a ninth switching element which is similar to the transistor M142 are added to the configuration of FIG. 20. A source of the third output transistor is a third output terminal which is an output terminal of the stage Xi that is different from each of the first output terminal and the second output terminal. For example, the second output terminal (terminal Z) outputs the set signal (shift pulse), and the third output terminal outputs the reset signal.

A signal inputted to a conduction and blocking control terminal of the ninth switching element is a third conduction and blocking control signal. The third conduction and blocking control signal is a signal whose active period does not overlap that of the first clock signal. In the present embodiment, the third conduction and blocking control signal is identical to the first conduction and blocking control signal inputted to the gate of the transistor M6. Further, in the present embodiment, the second conduction and blocking control signal is a clock signal whose phase is reverse to that of the first clock signal (i.e., a clock signal identical to the second clock signal). The third conduction and blocking control signal is not necessarily identical to each of the first conduction and blocking control signal and the second conduction and blocking control signal.

As described earlier, since the drain of the transistor M141 which outputs the control signals for setting/resetting a previous stage Xi or a next stage Xi is connected with the terminal V3, it is possible to prevent a rise in the potential V (N1) of the node N1 due to capacitive coupling and prevent a rise in potential of the terminal Z.

Since the drain of the transistor M141 which is a transistor that outputs control signals for setting/resetting another stage Xi is connected with the terminal V3, it is possible to set an amplitude of the control signals. This improves on-current and off-leak characteristics of the transistor M141, and enables the shift register to operate more stably while preventing a malfunction in the shift register. Further, in a case where the third direct voltage to be applied to the terminal V3 is set to prevent a variation in the threshold voltage Vth due to a shift phenomenon caused by a difference among a gate potential, a source potential, and a drain potential of the transistor M141, it is possible to make a more reliable shift register.

The stage Xi of FIG. 20 can be used for any of the shift register 1 of FIG. 2, the shift register 2 of FIG. 4, and the shift register 3 of FIG. 6. Note that another embodiment can be combined with the stage Xi of FIG. 20. For example, it is possible to combine, with the stage Xi of FIG. 20, the transistor M91 of FIG. 9, the transistor M101 of FIG. 10, the transistor M111 of FIG. 11, the transistor M121 of FIG. 12, and the transistor M11 of FIG. 13.

Twelfth Embodiment

The following describes Twelfth Embodiment of a shift register with reference to FIG. 21.

FIG. 21 shows a configuration of a stage Xi included in a shift register of the present embodiment.

A configuration of the stage Xi of FIG. 21 is different from that of the stage Xi of FIG. 1 in that sources of transistors M3 and M4 are connected with a terminal V4 instead of a terminal V2 and a transistor (second output transistor) M141 and a transistor (eighth switching element) M142 are added.

A gate of the transistor M141 is connected with a node N1, a drain of the transistor M141 is connected with a terminal V1, and a source of the transistor M141 is connected with a terminal (second output terminal) Z. That is, a first direct voltage which is a power source voltage VDD is applied to the drain of the transistor M141, and the source of the transistor M141 serves as a second output terminal which is an output terminal of the stage Xi that is different from a first output terminal. A continuous stage group including another output terminal in addition to the first output terminal as above is referred to as a plural output continuous stage group. A gate of the transistor M142 is connected with a terminal S4, a drain of the transistor M142 is connected with the terminal Z, and a source of the transistor M142 is connected with the terminals V2 and V4. Independently of a power source voltage VSS, a fourth direct voltage which can be arbitrarily set to be smaller than the power source voltage VDD is supplied and applied to the terminal V4.

A signal inputted to the gate of the transistor M142 is a second conduction and blocking control signal. The second conduction and blocking control signal is a signal whose active period does not overlap that of the first clock signal. In the present embodiment, the second conduction and blocking control signal is identical to a first conduction and blocking control signal inputted to a gate of a transistor M6. Further, in the present embodiment, the second conduction and blocking control signal is a clock signal whose phase is reverse to that of the first clock signal (i.e., a clock signal identical to a second clock signal). The second conduction and blocking control signal is not necessarily identical to the first conduction and blocking control signal.

The terminal Z is connected with a terminal S1 of another stage Xi to which a shift pulse from the stage Xi is inputted, and the transistor M141 outputs the shift pulse. The transistor M142 resets the terminal Z to a Low level.

As described earlier, in the present embodiment, a stage which outputs a gate pulse and a stage which outputs control signals such as a set signal (shift pulse) and a reset signal for setting/resetting another stage Xi are separate from each other. Note that any number of stages which are similarly separate from each other may be further provided.

In a case where the stage which outputs the control signals is further separated into a stage which outputs the set signal (shift pulse) for the another stage and a stage which outputs the reset signal for the another stage, it is possible to avoid an interference between the output of the set signal and the output of the reset signal and to cause the shift register to operate more stably. In this case, for example, a third output transistor which is similar to the transistor M141 and a ninth switching element which is similar to the transistor M142 are added to the configuration of FIG. 21. A source of the third output transistor is a third output terminal which is an output terminal of the stage Xi that is different from each of the first output terminal and the second output terminal. For example, the second output terminal (terminal Z) outputs the set signal (shift pulse), and the third output terminal outputs the reset signal.

A signal inputted to a conduction and blocking control terminal of the ninth switching element is a third conduction and blocking control signal. The third conduction and blocking control signal is a signal whose active period does not overlap that of the first clock signal. In the present embodiment, the third conduction and blocking control signal is identical to the first conduction and blocking control signal inputted to the gate of the transistor M6. Further, in the present embodiment, the second conduction and blocking control signal is a clock signal whose phase is reverse to that of the first clock signal (i.e., a clock signal identical to the second clock signal). The third conduction and blocking control signal is not necessarily identical to each of the first conduction and blocking control signal and the second conduction and blocking control signal.

As described earlier, since the drain of the transistor M141 which outputs the control signals for setting/resetting a previous stage Xi or a next stage Xi is connected with the terminal V1, it is possible to prevent a rise in the potential V (N1) of the node N1 due to capacitive coupling, thereby preventing a rise in potential of the terminal Z.

In a case where a drain of the transistor M3, the source of the transistor M4, and a source of the transistor M142 are connected with the terminal V4 and a voltage to be applied to the terminal V4 is adjusted, it is possible to change an amplitude of control signals for setting/resetting a shift register of a previous or next stage and to reduce an off-leak occurring in a transistor M1 and a transistor M5. Further, in a case where a voltage of the terminal V4 is set so that a threshold voltage of a transistor is less likely to change, it is possible to prevent a change over time in performance of the shift register.

Note that another embodiment can be combined with the stage Xi of FIG. 21. For example, it is possible to combine, with the stage Xi of FIG. 21, the transistor M91 of FIG. 9, the transistor M101 of FIG. 10, the transistor M111 of FIG. 11, the transistor M121 of FIG. 12, the transistor M11 of FIG. 13, the separate output stages of FIG. 15, and the transistor M141 of FIG. 20.

Thirteenth Embodiment

Figure 22:
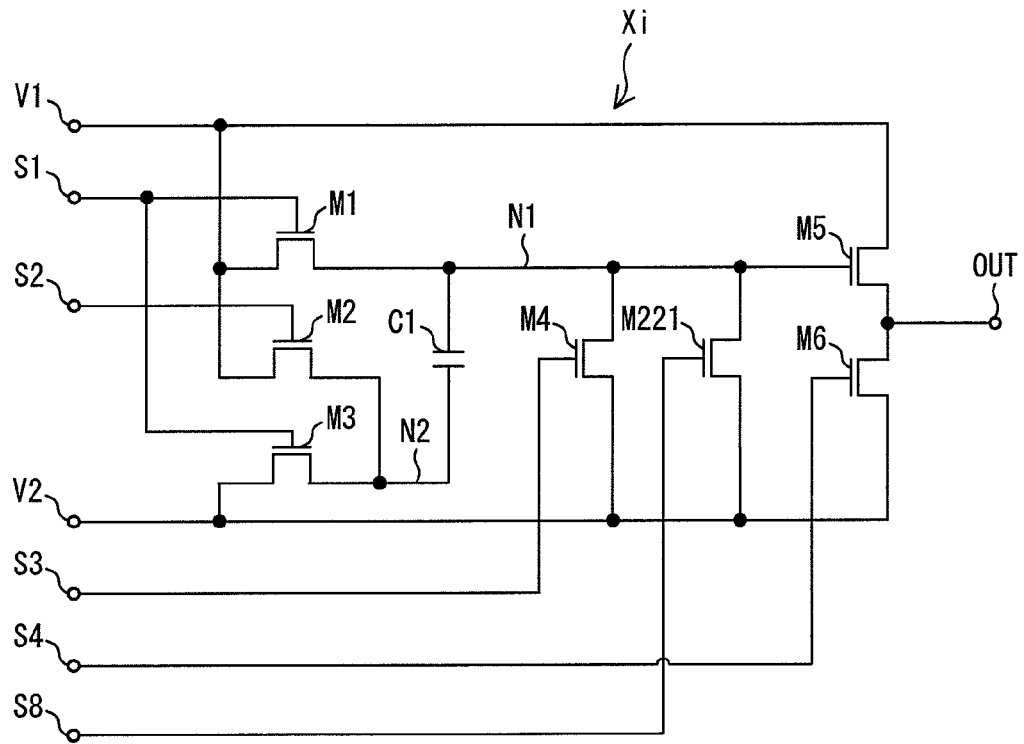
FIG. 22 is a circuit diagram showing a configuration of a stage included in a shift register in accordance with Thirteenth Embodiment of the present invention.

The following describes Thirteenth Embodiment of a shift register with reference to FIG. 22.

FIG. 22 shows a configuration of a stage Xi included in a shift register of the present embodiment.

The stage Xi of FIG. 22 has a configuration obtained by adding a transistor (tenth switching element) M221 to the stage Xi of FIG. 1.

A gate of the transistor M221 is connected with a terminal S8, a drain of the transistor M221 is connected with a node N1, and a source of the transistor M221 is connected with a terminal V2. A clear signal which gets in a High level (an active level) with predetermined timing is inputted to the terminal S8.

Input of the High level to the terminal S8 causes the node N1 and the terminal V2 to be electrically connected with each other and allows forcing a potential of the node N1 to be fixed to a voltage which is applied to the terminal V2. This enables the shift register to have a clear function of arbitrarily clearing the node N1.

Note that another embodiment can be combined with the stage Xi of FIG. 22. For example, it is possible to combine, with the stage Xi of FIG. 22, the transistor M91 of FIG. 9, the transistor M101 of FIG. 10, the transistor M111 of FIG. 11, the transistor M121 of FIG. 12, the transistor M11 of FIG. 13, the separate output stages of FIG. 15, the transistor M141 of FIG. 20, and the separate VSS of FIG. 21.

Fourteenth Embodiment

Figure 23:
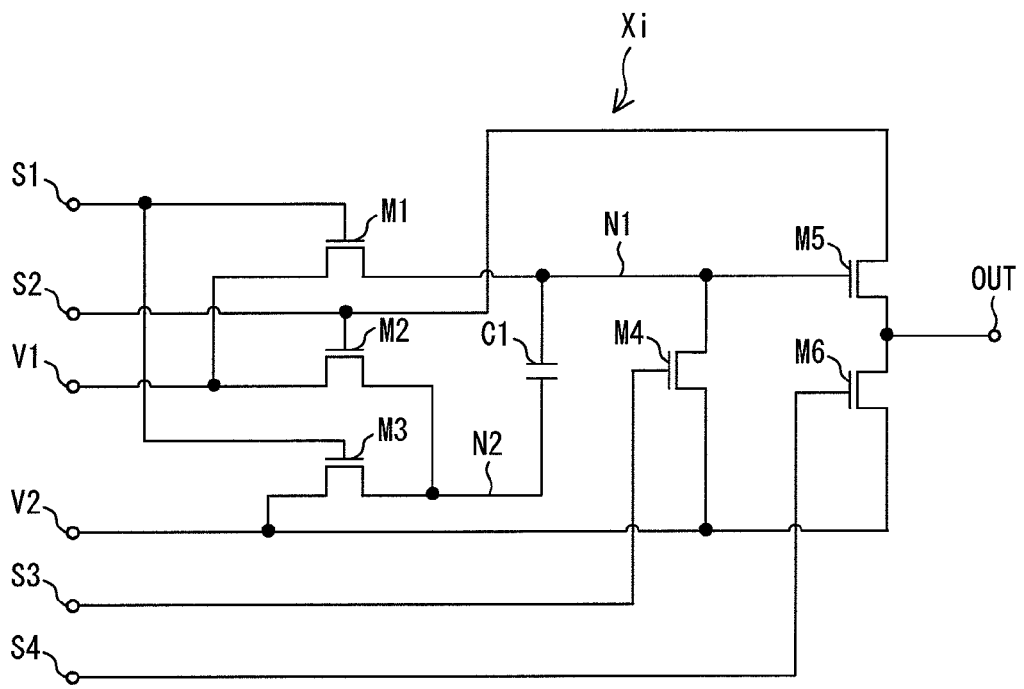
FIG. 23 is a circuit diagram showing a configuration of a stage included in a shift register in accordance with Fourteenth Embodiment of the present invention.

The following describes Fourteenth Embodiment of a shift register with reference to FIG. 23.

FIG. 23 shows a configuration of a stage Xi included in a shift register of the present embodiment.

The stage Xi includes transistors M1, M2, M3, M4, M5, and M6 and a capacitor C1. All of the transistors M1, M2, M3, M4, M5, and M6 are N-channel TFTs, but they may be P-channel TFTs. A gate of each switching element explained below is a conduction and blocking control terminal in the switching element.

A gate of the transistor (input gate, fifth switching element, first transistor) M1 is connected with a terminal S1, a drain of the transistor M1 is connected with a terminal V1, and a source of the transistor M1 is connected with a node N1 connected with a gate of the transistor M5. One end of the capacitor (first capacitor) C1 is connected with the node N1. A voltage applied to each terminal and a signal inputted to the each terminal are similar to those described in First Embodiment.

A gate of the transistor (first switching element) M2 is connected with a terminal S2, a drain of the transistor M2 is connected with the terminal V1, and a source of the transistor M2 is connected with the other end of the capacitor C1 which end is farther from the node N1. The other end of the capacitor C1 is connected with a node N2.

A gate of the transistor (second switching element) M3 is connected with the terminal S1, a drain of the transistor M3 is connected with the node N2, and a source of the transistor M3 is connected with a terminal V2.

A gate of the transistor (third switching element) M4 is connected with a terminal S3, a drain of the transistor M4 is connected with the node N1, and a source of the transistor M4 is connected with the terminal V2.

A drain of the transistor (first output transistor) M5 is connected with the terminal S2, and a source of the transistor M5 is connected with a terminal OUT. That is, a power source voltage VDD which is a direct voltage is applied to the drain of the transistor M5, and the source of the transistor M5 serves as a first output terminal.

A gate of the transistor (fourth switching element) M6 is connected with the terminal S4, a drain of the transistor M6 is connected with the terminal OUT, and a source of the transistor M6 is connected with the terminal V2.

In a case where a first clock signal is inputted to the drain of the transistor M5 and the first clock signal is at a LOW level, no variation due to a noise and/or a coupling of the node N1 is generated with respect to an output of a Low level of a gate pulse.

This prevents a rise in potential of the terminal OUT due to variation in a signal and/or leakage occurring when a gate driving output is at a Low level, thereby preventing charge leakage from a liquid crystal picture element electrode and/or a malfunction in the shift register occurring due to the rise in potential of the terminal OUT.

Note that another embodiment can be combined with the stage Xi of FIG. 23. For example, it is possible to combine, with the stage Xi of FIG. 23, the transistor M91 of FIG. 9, the transistor M101 of FIG. 10, the transistor M111 of FIG. 11, the transistor M121 of FIG. 12, and the transistor M11 of FIG. 13.

Fifteenth Embodiment

The following describes a shift register of Fifteenth Embodiment with reference to FIG. 24.

FIG. 24 shows a size relationship between the power source voltage VDD and the threshold voltage Vth in the stage Xi of FIG. 1, the size relationship being designed such that in a case where the node N1 is charged in response to an input of a shift pulse, an electric potential of the node N1 reaches such a level at a time point before the electric potential of the node N1 is raised by the node N2 that a voltage between a gate and a source of the transistor M5 is greater than the threshold voltage Vth.

With this arrangement, the transistor M5 is made ON during a period T11 from start of charging the node N1 to the raise caused at the node N1 by the node N2 and a period T12 from the raise caused at the node N1 by the node N2 to reset at the node N1. During the periods T11 and T12, a gate pulse is outputted to the terminal OUT in response to the ON state of the transistor M5. Meanwhile, the gate pulse outputted during the period T11 is set to be not more than the threshold voltage Vth of the transistor M1 so as not to reach a following set signal. That is, the gate pulse outputted during the period T11 is set such that a voltage drop appears at a channel of the transistor M5 to some extent.

On this account, in a case where a panel is driven by a driving method such as a source bus line reversal driving in which data signals having an identical polarity are supplied to a data signal line during one frame period, a picture element connected to a current gate bus line GL is precharged during the period T11 by use of a data signal of a picture element connected to a previous gate bus line GL, and the picture element connected to the current gate bus line GL has written therein during the period T12. This is attained by employing no bootstrap effect for raising the electric potential of the node N1 in the present embodiment.

Sixteenth Embodiment

Figure 33:
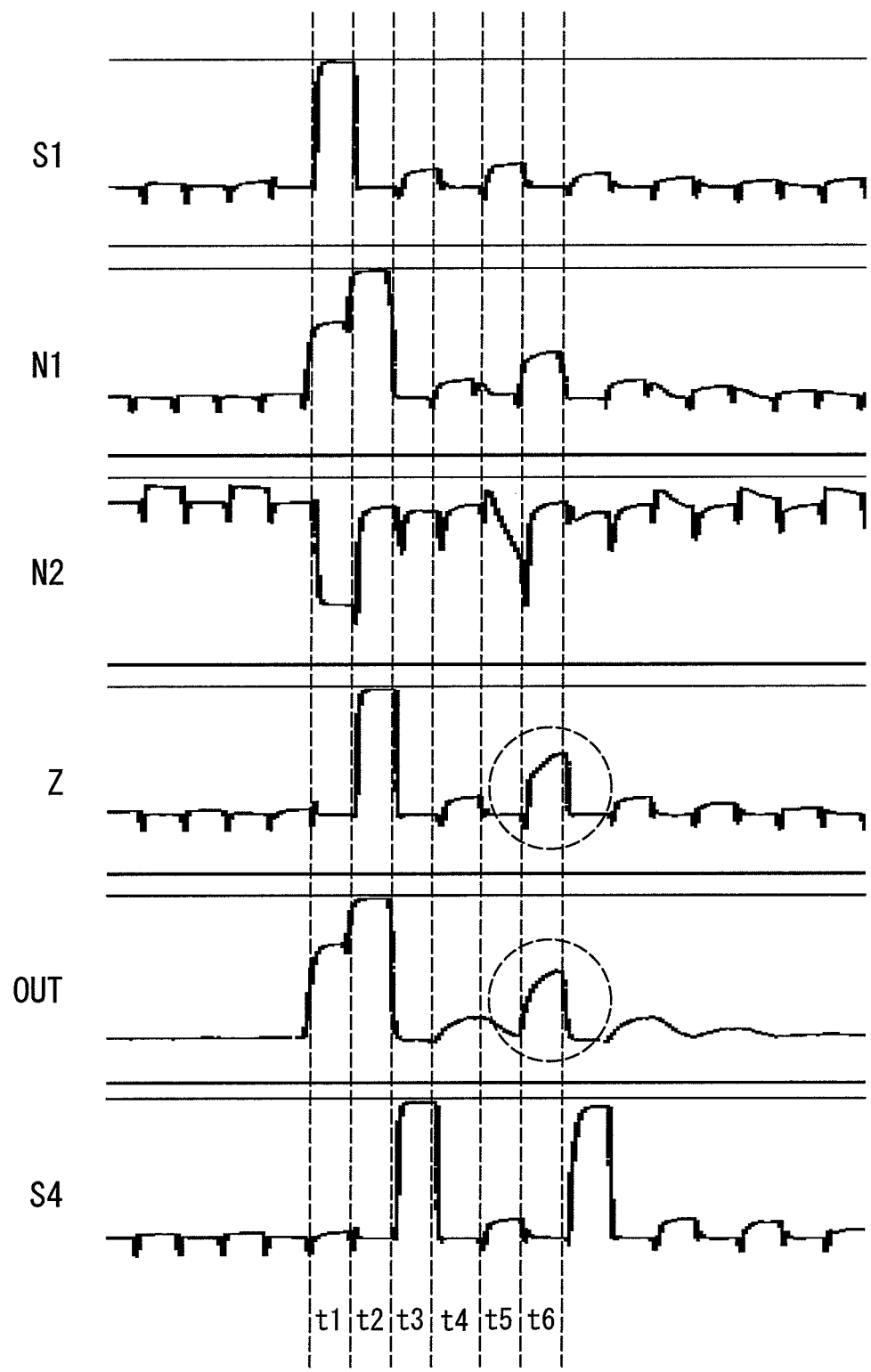
FIG. 33 is a waveform chart showing an operation waveform in accordance with a Comparative Embodiment to be compared with the operation of the stage shown in FIG. 32.

The following describes a shift register of Sixteenth Embodiment with reference to FIGS. 32 to 34.

The shift register of the present Embodiment is more effective in preventing malfunction due to leakage in the transistor M3 than the shift registers described above.

In a circuit of a shift register, the following different states (1) and (2) possibly occur:

(1) A high-temperature initial state where electric current is most easily flown and leakage current is great; and (2) A low-temperature aging state where electric current is hardest to be flown and leakage current is not great. A property of the circuit in the state (1) is greatly different from that of the circuit in the state (2). It is therefore difficult to cause the circuit having a single configuration to operate suitably for both states (1) and (2).

The following describes the reason why.

In order to meet a condition suitable for the state (2), the transistor M3 should be increased in its size (channel width). However, such an increased size of transistor M3 causes leakage in a case where the circuit is in the state (1). The leakage causes a voltage drop at the node N2. As a result, the node N2 has difficulty in retaining a high voltage during no output period of the stage Xi though the node N2 should originally retain the high voltage during no output period of the stage Xi. Therefore, in a case where the circuit is in the state (1), when a clock signal is supplied to the terminal S2 during no output period of the stage Xi, the voltage at the node N2 is changed from the voltage drop state to a high voltage state whereby the voltage of the node N1 is increased by the raise caused by the capacitor C1.

On this account, the stage Xi outputs erroneously at a timing where the stage Xi should not output. An output signal OUTi outputted from the stage Xi is a set signal for a following stage. Therefore, the output signal OUTi outputted from the stage Xi by the erroneous output becomes greater at further following stages. In the end, oscillation is caused.

Meanwhile, in order to meet a condition suitable for the state (1), the transistor M3 should be decreased in its size (channel width) so that leakage is reduced. However, as a result of such a decreased size of transistor M3, the change in the electric potential of the node N2 via the transistor M3 is slowed down in a case where the circuit is in the state (2). This fails to provide a potential difference necessary for the capacitor C1 when the stage Xi outputs. As a result, the stage Xi would possibly fail to operate.

In order to solve the problem, the stage Xi of the resent Embodiment is arranged as shown in FIG. 32 such that the drain and source connection of a transistor M9 (sixth transistor) is positioned within a connection between the node N1 and the output terminal OUT, that is, within a connection between the gate and the source of the transistor M5. Further, a gate of the transistor M9 is connected to a terminal V1. This arrangement makes it possible to decrease the electric potential of the node N1 by connecting the node N1 to a low electric potential side via the transistor M9 in a case where an increased voltage is applied to the node N1 during no output period of the stage Xi. Note that other reference signs in FIG. 32 are equal to those in the above-described Embodiments.

The drain and the source of the transistor M9 may be connected respectively with a gate and a source of the transistor M141 (respectively with the gate of the transistor M141 and an output terminal Z). The transistor M9 can be added to all arrangements of the above-described Embodiments. That is, the transistor M9 can be arranged such that the drain and the source of the transistor M9 are respectively connected with a gate and a source of an output transistor, and such that a voltage equal to that to be applied to the drain of the output transistor with which the drain and the source of the transistor M9 are connected is applied to the gate of the transistor M9. The transistor M9 can also be arranged such that the drain and the source of the transistor M9 are respectively connected with the gate of the output transistor and a terminal to which a second direct voltage is applied, and such that a voltage equal to that to be applied to the drain of the output transistor with which the drain and the source of the transistor M9 are connected is applied to the gate of the transistor M9.

Meanwhile, a High level is consistently inputted to the gate of the transistor M9. It is therefore preferable that the size (channel width) of the transistor M9 is decreased so as to cause drain current to be reduced, so that the electric potential of the node N1 is not greatly decreased while the stage Xi outputs.

Further, all the arrangements of the above-described Embodiments are applicable to the present Embodiment as to how to connect the stages to each other, and an operation timing between the stages.

The following describes an effect of the present Embodiment with reference to FIGS. 33 and 34.

FIG. 33 shows operating waveforms in a case where the transistor M9 is not provided in, for example, FIG. 32. During a period t1, the node N1 is charged in response to inputting to the terminal S1 the output signal OUTi−1 of the stage Xi−1, which is a previous stage. Further, during the period t1, the node N2 is decreased to a Low level due to ON state of the transistor M3. Furthermore, during the period t1, the electric potential of the node N1 is great enough to turn ON the transistor M5. This leads to a slight output to the output terminal OUT. During a period t2, the transistor M2 is made ON. This causes the node N2 to become a High whereby the electric potential of the node N1 is raised. As a result, the output terminals OUT and Z have outputted thereto. Thereafter, during a period t3, the electric potential of the node N1 is reset, and the stage Xi enters a non-output period. Meanwhile, from the period t3, an active level of a clock signal is supplied to the terminal S4 in a cycle of the clock signal CLK2. Therefore, the output terminals OUT and Z are periodically forced to be a Low level. From a period t6, the transistor M2 is made ON in a cycle of the clock signal CLK1. Meanwhile, during a period t5, the electric potential of the node N2 is slightly decreased due to leakage in the transistor M3. During the period t6 following immediately after the period t5, the node N2 is caused to be a High level. This leads to a slight raise of the electric potential of the node N1. That is, as shown in dashed circles of FIG. 33, the output terminals OUT and Z perform an unnecessary output.

However, the arrangement shown in FIG. 32 makes it possible to prevent raise in the electric potential of the node N1 during no output period of the stage Xi whereby the output terminals OUT and Z do not perform an unnecessary output as shown in FIG. 34.

Seventeenth Embodiment

Figure 35:
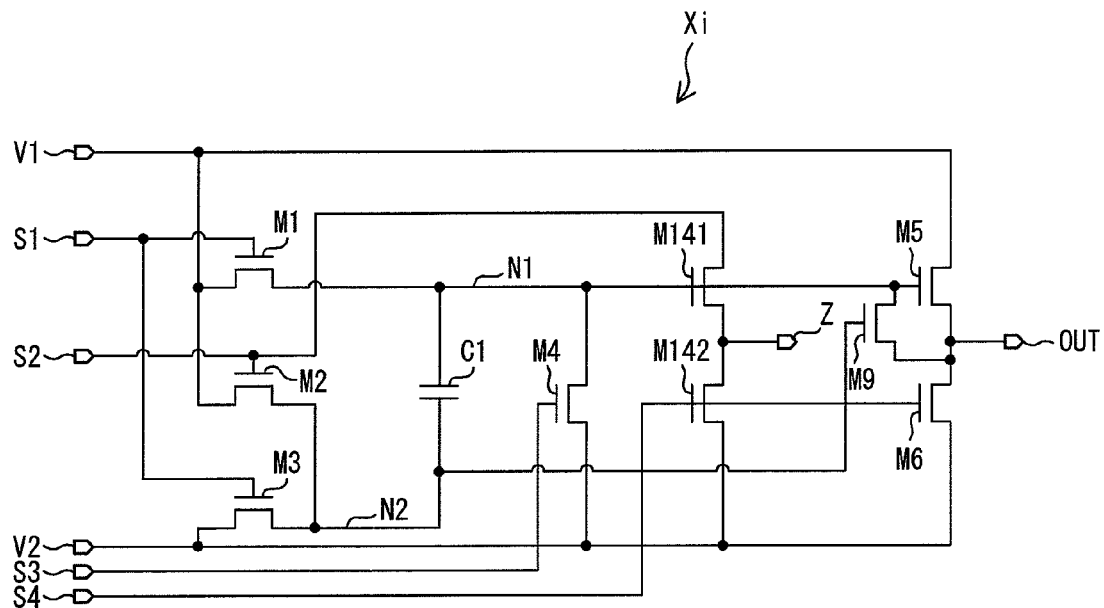
FIG. 35 is a circuit diagram showing a configuration of a stage included in a shift register in accordance with Seventeenth Embodiment of the present invention.

The following describes a shift register of Seventeenth Embodiment with reference to FIG. 35.

The stage Xi of the shift register of the present Embodiment is different from the stage Xi shown in FIG. 32 in that the stage Xi of the shift register of the present Embodiment is arranged such that a gate of a transistor M9 is connected to a node N2, that is, an end of a capacitor C1.

The arrangement of FIG. 35 makes it possible to further suppress deterioration in the transistor M9 by causing a voltage Vgs between the gate and the source of the transistor M9 to be a voltage less than VDD−VSS, in addition to yielding the effect obtained in Sixteenth Embodiment. In Sixteenth Embodiment, a DC voltage of VDD−VSS is consistently applied to the gate of the transistor M9. This causes easy deterioration in the transistor M9. In order to compensate for such deterioration, the transistor M9 should be increased in its size. However, according to the present Embodiment, it is unnecessary to increase the transistor M9 in its size. Further, according to the arrangement of FIG. 32, the voltage Vgs between the gate and source becomes zero during one horizontal period during which the node N2 becomes a Low level. This makes it possible to reduce direct current bias components to be applied to the gate of the transistor M9 whereby deterioration in the transistor M9 is further suppressed compared to the transistor M9 of Sixteenth Embodiment.

The drain and the source of the transistor M9 may be respectively connected with the gate and the source of the transistor M141 (respectively with the gate of the transistor M141 and the output terminal Z). The transistor M9 can be added to all the arrangements of the above-described Embodiments. That is, the transistor M9 can be arranged such that the drain and the source of the transistor M9 are connected respectively with the gate and the source of the output transistor, and such that the gate of the transistor M9 is connected to one end of the capacitor C1 connected to node N1 at the other end thereof. The transistor M9 can also be arranged such that the drain and the source of the transistor M9 are connected respectively with the gate of the output transistor and the terminal to which the second direct voltage is applied, and such that the gate of the transistor M9 is connected to the end of the capacitor C1.

Eighteenth Embodiment

Figure 36:
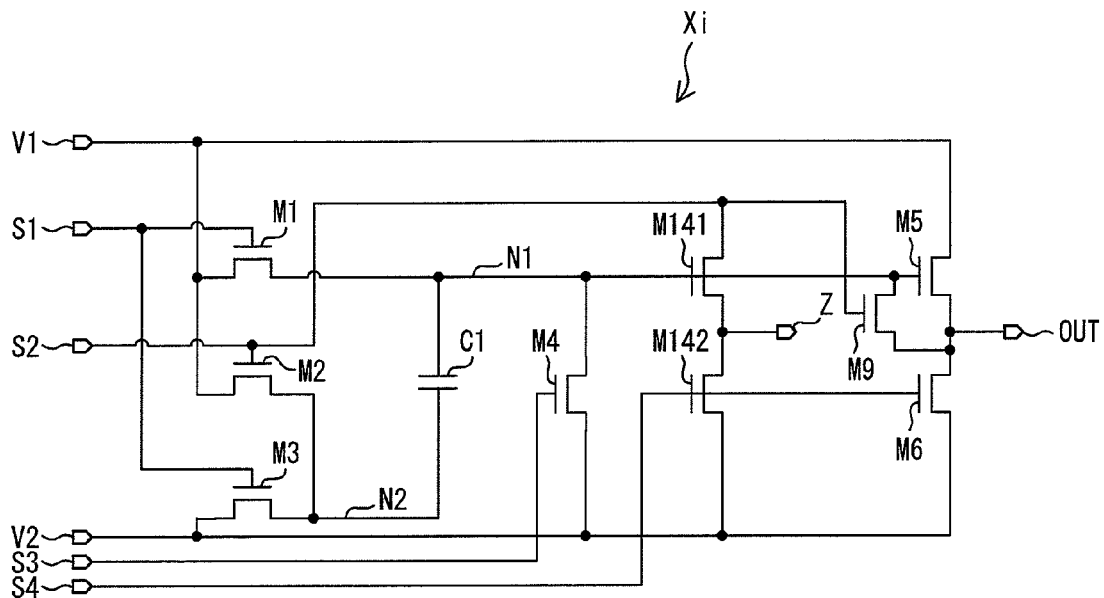
FIG. 36 is a circuit diagram showing a configuration of a stage included in a shift register in accordance with Eighteenth Embodiment of the present invention.

The following describes a shift register of Eighteenth Embodiment with reference to FIG. 36.

The stage Xi of the shift register of the present Embodiment is different from the stage Xi shown in FIG. 32 in that the stage Xi of the shift register of the present Embodiment is arranged such that the gate of transistor M9 is connected to the terminal S2.

The arrangement of FIG. 35 causes the gate voltage Vgs of a High (active) of the transistor M9 to be ½ duty of the clock signal CLK1 in addition to yielding the effect obtained in Sixteenth Embodiment whereby the direct current bias components to be applied to the gate of the transistor M9 are further reduced compared to Seventeenth Embodiment. This further reduces deterioration in the transistor M9. As a result, the transistor M9 can be further decreased in its size.

The drain and the source of the transistor M9 may be connected respectively with the gate and the source of the transistor M141 (connected respectively with the gate of the transistor M141 and the output terminal Z). The transistor M9 can be added to all the arrangements of the above-described Embodiments. That is, the transistor M9 can be arranged such that the drain and the source of the transistor M9 are connected respectively with the gate and the source of the output transistor, and such that the first clock signal is supplied to the gate of the transistor M9. The transistor M9 can also be arranged such that the drain and the source of the transistor M9 are connected respectively with the gate of the output transistor and the terminal to which the second direct voltage is applied, and such that the first clock signal is supplied to the gate of the transistor M9.

Nineteenth Embodiment

The following describes a shift register of Nineteenth Embodiment with reference to FIGS. 37 to 40.

Figure 37:
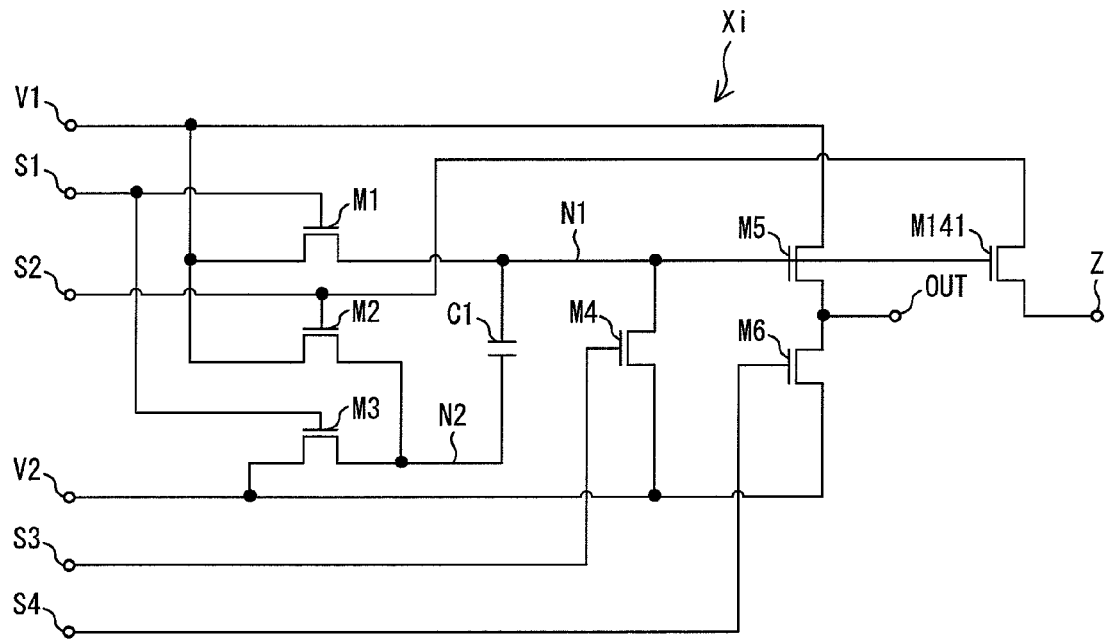
FIG. 37 is a circuit diagram showing a first configuration of a stage included in a shift register in accordance with Nineteenth Embodiment of the present invention.

The stage Xi of the shift register of the present Embodiment shown in FIG. 37 is not provided with the transistor M142 that is provided in the stage Xi of FIG. 15. However, the output terminal OUT can be reset to a Low level with employing no transistor M142 in the stage Xi of the present Embodiment in a case where an active level (that is, a High level) of a clock signal and then an inactive level (that is, a Low level) of the clock signal are supplied to the output terminal OUT through the drain of the transistor M141 while the clock signal is supplied from the terminal S2 to the drain of the transistor M141.

This arrangement makes it possible to reduce the number of transistors, that is, the number of switching elements (that is, eighth switching element) whereby a circuit area surface can be reduced.

Figure 38:
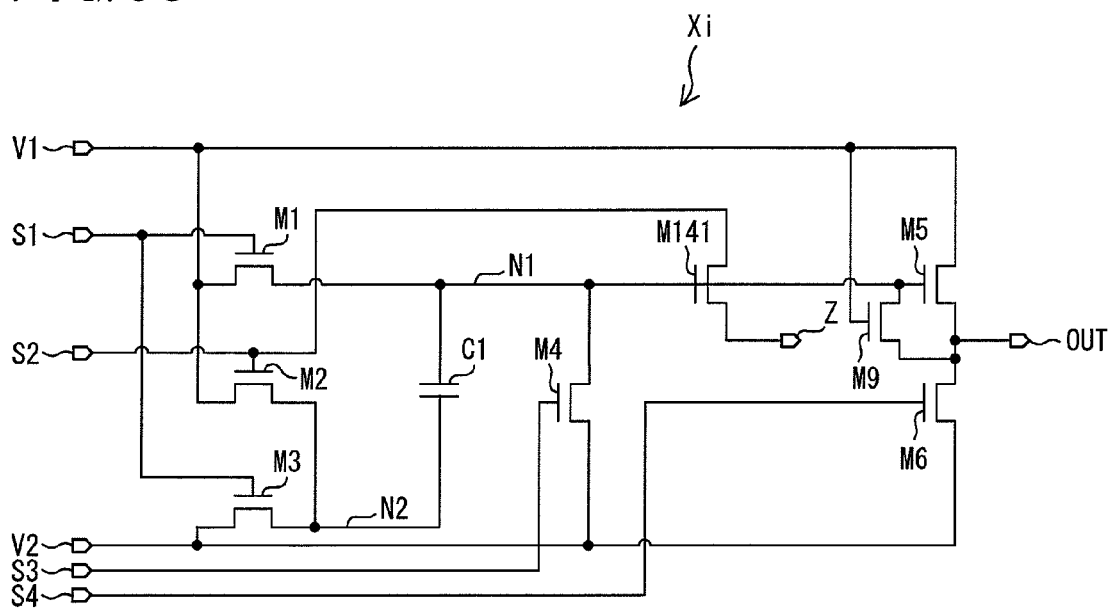
FIG. 38 is a circuit diagram showing a second configuration of the stage included in the shift register in accordance with Nineteenth Embodiment of the present invention.
Figure 39:
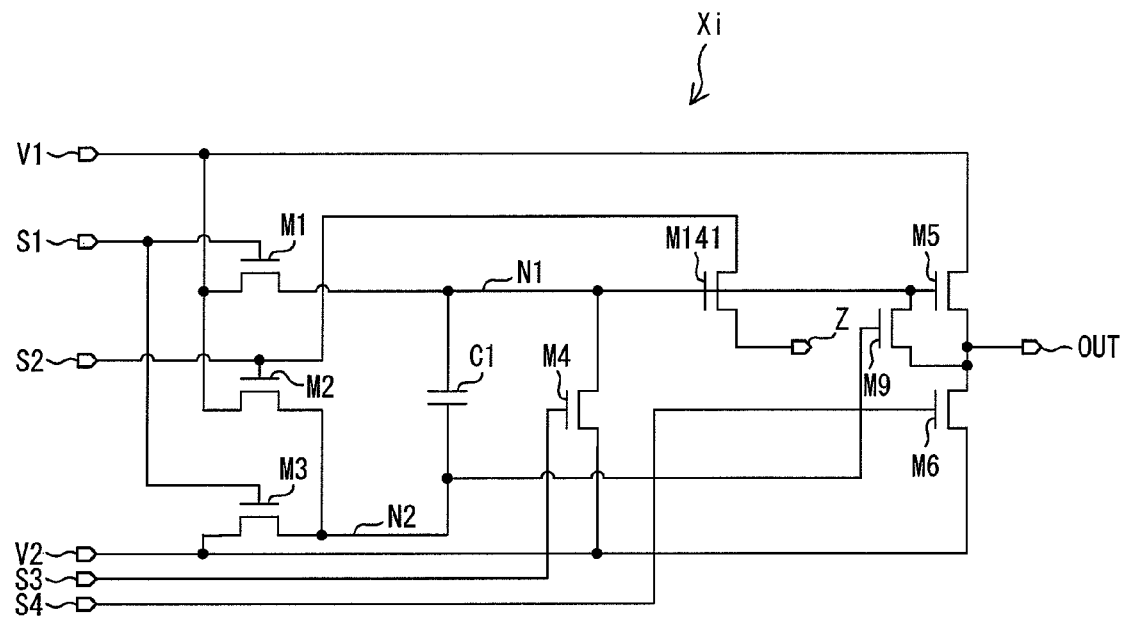
FIG. 39 is a circuit diagram showing a third configuration of the stage included in the shift register in accordance with Nineteenth Embodiment of the present invention.
Figure 40:
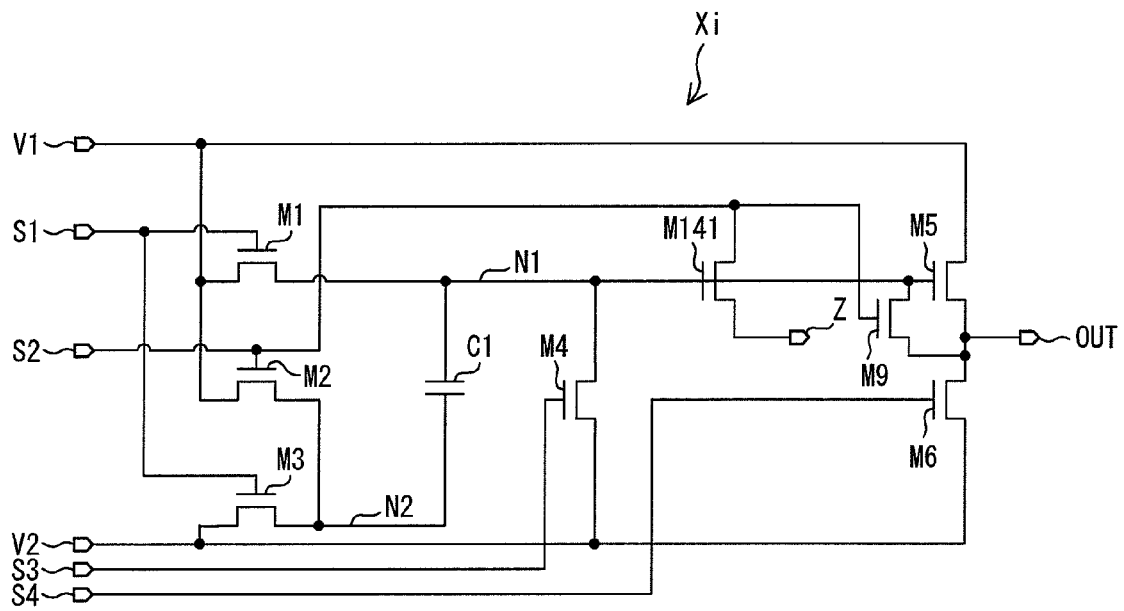
FIG. 40 is a circuit diagram showing a fourth configuration of the stage included in the shift register in accordance with Nineteenth Embodiment of the present invention.

Similarly, the stage Xi of the shift register of the present Embodiment shown in FIG. 38 is not provided with the transistor M142 that is provided in the stage Xi of FIG. 32. The stage Xi of the shift register of the present Embodiment shown in FIG. 39 is not provided with the transistor M142 that is provided in the stage Xi of FIG. 35. The stage Xi of the shift register of the present Embodiment shown in FIG. 40 is not provided with the transistor M142 that is provided in the stage Xi of FIG. 36.

Further, in consideration of this way of thinking, the stage Xi including the third output transistor for outputting the clock signal, which is described in Tenth Embodiment with reference to FIG. 15, can be arranged without the ninth switching element in a case where an active level of the clock signal and then an inactive level of the clock signal are supplied to the output terminal through the third output transistor.

Further, in consideration of this way of thinking, the stage Xi including the first output transistor for outputting the clock signal, which is described in Fourteenth Embodiment with reference to FIG. 23, can be arranged without the fourth switching element in a case where the active level of the clock signal and then the inactive level of the clock signal are supplied to the output terminal through the first output transistor.

The above described the Embodiments.

Figure 26:
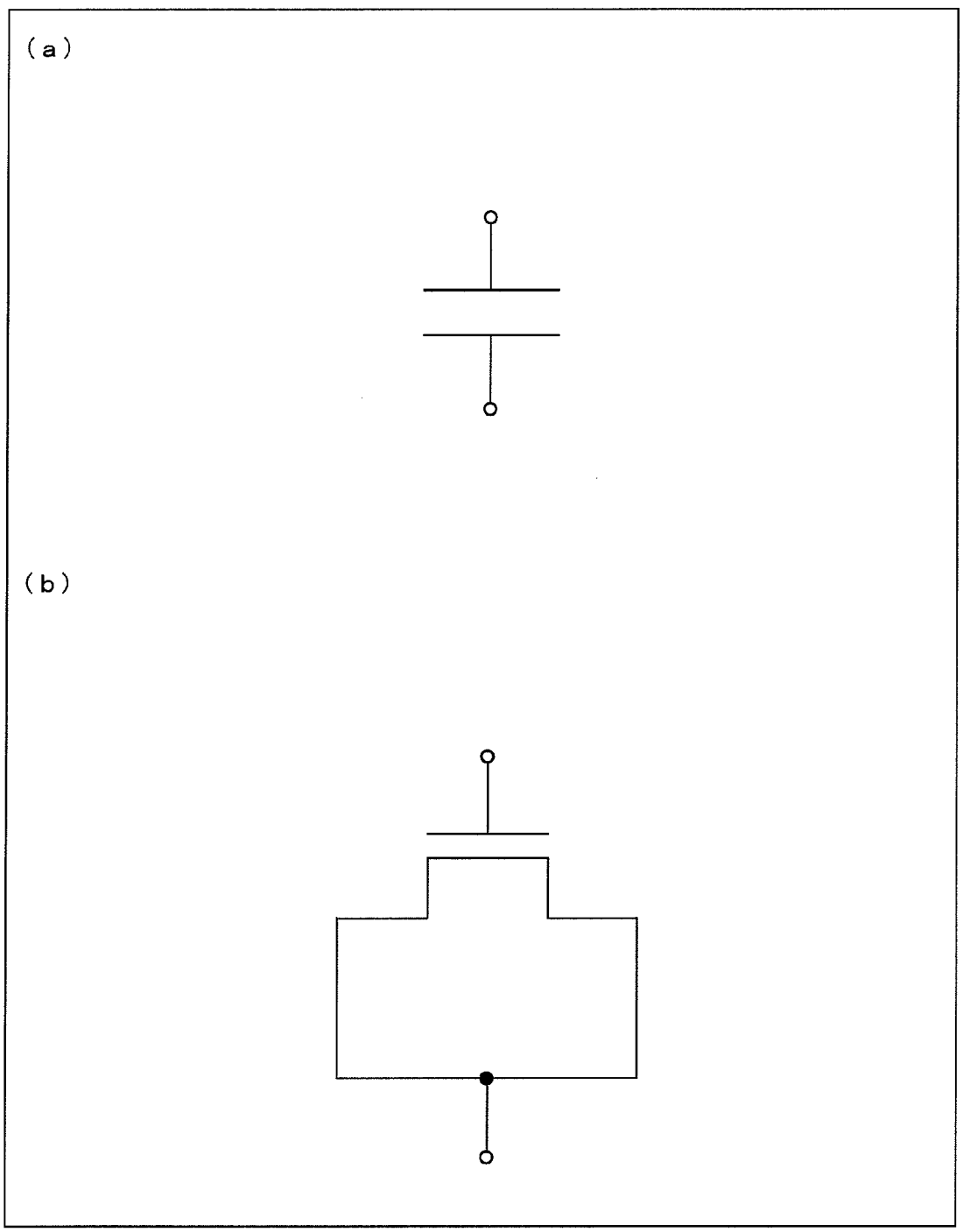
FIG. 26 is a drawing explaining embodiments of a capacitor in accordance with an embodiment of the present invention. (a) of FIG. 26 is a circuit diagram showing a first embodiment of the capacitor. (b) of FIG. 26 is a circuit diagram showing a second embodiment of the capacitor.
Figure 27:
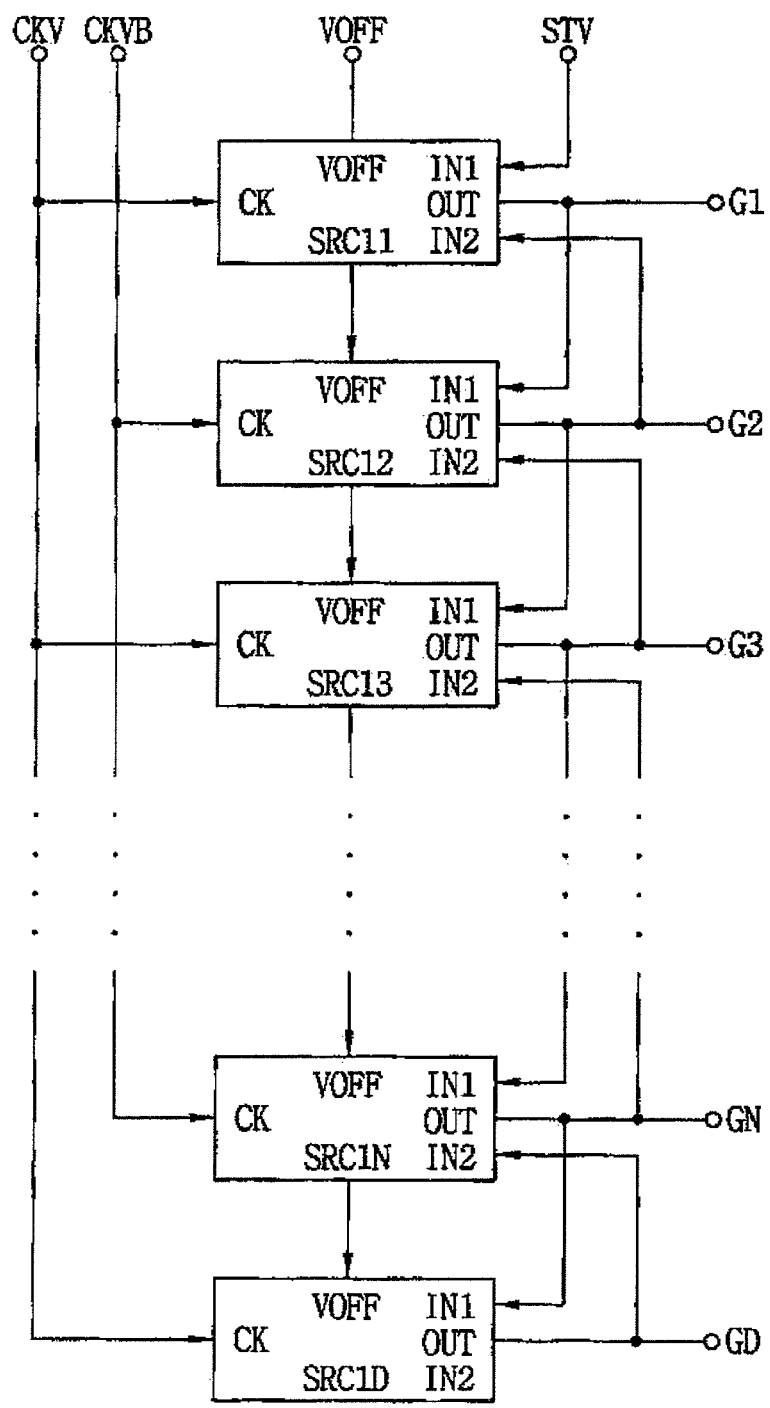
FIG. 27 is a block diagram showing a configuration of a shift register of a conventional art.

Examples of the capacitors C1 and C101 of the Embodiments encompass (i) a parallel-plate capacitor, which is shown in (a) of FIG. 26, arranged such that an electrically insulating member is sandwiched between two guide plates facing each other and (ii) an MOS capacitor, which is shown in (b) of FIG. 26, arranged by short-circuiting a drain and a source of an MOS transistor.

In order to solve the foregoing problems, a shift register of the present invention includes one or more series-connection circuits in each of which stages are series-connected with each other to transmit a shift pulse, at least one of said one or more series-connection circuits including, among all stages thereof, a continuous stage group consisting of a plurality of continuous stages, each stage of the continuous stage group comprising: a first output transistor, having (i) a drain to which a first direct voltage is applied and (ii) a source serving as a first output terminal which is an output terminal of said each stage; a first capacitor, having one end connected with a gate of the first output transistor; an input gate, to which a shift pulse for said each stage is input and via which a potential to be supplied to said one end of the first capacitor is transmitted during a pulse period of the shift pulse for said each stage; a first switching element, having (i) one end connected with the other end of the first capacitor, (ii) the other end to which the first direct voltage is applied, and (iii) a conduction and blocking control terminal, to which a first clock signal corresponding to said each stage is input, an active clock pulse period of the first clock signal not overlapping the pulse period of the shift pulse for said each stage; a second switching element, having (i) one end connected with the other end of the first capacitor, (ii) the other end to which a second direct voltage lower than the first direct voltage is applied, and (iii) a conduction and blocking control terminal to which a shift pulse for said each stage is input; a third switching element, having (i) one end connected with said one end of the first capacitor, (ii) the other end to which the second direct voltage is applied, and (iii) a conduction and blocking control terminal to which a pulse signal from an output terminal of a first predetermined other stage included in one of said one or more series-connection circuits is input, a phase of the pulse signal being retarded with respect to that of a shift pulse outputted from said each stage; and a fourth switching element, having (i) one end connected with the first output terminal, (ii) the other end to which the second direct voltage is applied, and (iii) a conduction and blocking control terminal to which a first conduction and blocking control signal corresponding to said each stage is input, an active period of the first conduction and blocking control signal not overlapping the active clock pulse period of the first clock signal.

With the invention, the first direct voltage is applied to the drain of the first output transistor, and the switched capacitor operation using the first switching element, the second switching element, and the first capacitor are carried out. This enables avoiding a feed-through phenomenon due to the drain parasitic capacitor and the source parasitic capacitor of the first output transistor. Consequently, it is possible to prevent (i) a variation in output voltage when a clock signal is inputted to the drain of the first output transistor and (ii) leakage of a potential from a picture element electrode caused by the variation in output voltage. Therefore, it is unnecessary to provide an additional circuit for frequently connecting the first output terminal of the stage to the Low power source.

As described above, the above configuration enables realizing a shift register capable of satisfactorily subduing noises of individual stage outputs, without increasing the area of a circuit.

Further, since the direct voltage is applied to the drain of the first output transistor, it is possible to drive a gate bus line using a direct power source. This enables greatly reducing a load on an external level shifter which generates a shift register control signal, compared with a case where a clock signal is inputted to the drain of the first output transistor so as to drive a gate bus line using the clock signal.

Since the direct voltage is applied to the drain of the first output transistor, a negative bias is applied over the gate and the drain of the first output transistor for a longer time, enabling reduction in the increase in a threshold voltage. This enables preventing performance of a shift register from being deteriorated.

In order to solve the foregoing problems, a shift register of the present invention includes one or more series-connection circuits in each of which stages are series-connected with each other to transmit a shift pulse, at least one of said one or more series-connection circuits including, among all stages thereof, a continuous stage group consisting of a plurality of continuous stages, each stage of the continuous stage group comprising: a first output transistor, having (i) a drain to which a first direct voltage is applied and (ii) a source serving as a first output terminal which is an output terminal of said each stage; a first capacitor, having one end connected with a gate of the first output transistor; an input gate, to which a shift pulse for said each stage is input and via which a potential to be supplied to said one end of the first capacitor is transmitted during a pulse period of the shift pulse for said each stage; a first switching element, having (i) one end connected with the other end of the first capacitor, (ii) the other end to which the first direct voltage is applied, and (iii) a conduction and blocking control terminal, to which a first clock signal corresponding to said each stage is input, an active clock pulse period of the first clock signal not overlapping the pulse period of the shift pulse for said each stage; a second switching element, having (i) one end connected with the other end of the first capacitor, (ii) the other end to which a fourth direct voltage lower than the first direct voltage is applied, and (iii) a conduction and blocking control terminal to which a shift pulse for said each stage is input; a third switching element, having (i) one end connected with said one end of the first capacitor, (ii) the other end to which the fourth direct voltage is applied, and (iii) a conduction and blocking control terminal to which a pulse signal from an output terminal of a first predetermined other stage included in one of said one or more series-connection circuits is input, a phase of the pulse signal being retarded with respect to that of a shift pulse outputted from said each stage; and a fourth switching element, having (i) one end connected with the first output terminal, (ii) the other end to which a second direct voltage which is lower than the first direct voltage and which is supplied independently of the fourth direct voltage is applied, and (iii) a conduction and blocking control terminal to which a first conduction and blocking control signal corresponding to said each stage is input, an active period of the first conduction and blocking control signal not overlapping the active clock pulse period of the first clock signal.

With the invention, the first direct voltage is applied to the drain of the first output transistor, and the switched capacitor operation using the first switching element, the second switching element, and the first capacitor are carried out. This enables avoiding a feed-through phenomenon due to the drain parasitic capacitor and the source parasitic capacitor of the first output transistor. Consequently, it is possible to prevent (i) a variation in output voltage when a clock signal is inputted to the drain of the first output transistor and (ii) leakage of a potential from a picture element electrode caused by the variation in output voltage. Therefore, it is unnecessary to provide an additional circuit for frequently connecting the first output terminal of the stage to the Low power source.

As described above, the above configuration enables realizing a shift register capable of satisfactorily subduing noises of individual stage outputs, without increasing the area of a circuit.

Further, since the direct voltage is applied to the drain of the first output transistor, it is possible to drive a gate bus line using a direct power source. This enables greatly reducing a load on an external level shifter which generates a shift register control signal, compared with a case where a clock signal is inputted to the drain of the first output transistor so as to drive a gate bus line using the clock signal.

Since the direct voltage is applied to the drain of the first output transistor, a negative bias is applied over the gate and the drain of the first output transistor for a longer time, enabling reduction in the increase in a threshold voltage. This enables preventing performance of a shift register from being deteriorated.

Further, since the fourth direct voltage which is supplied independently of the second direct voltage is applied to the other end of the second switching element and the other end of the third switching element, adjustment of the fourth direct voltage enables changing the amplitude of a control signal for setting/resetting a shift register in a previous/subsequent stage, thereby reducing OFF leakage of the input gate and the first output transistor. Further, by setting the fourth voltage such that a threshold voltage of a transistor is less likely to change, it is possible to subdue a change with time of the performance of the transistor.

In order to solve the foregoing problems, a shift register of the present invention includes one or more series-connection circuits in each of which stages are series-connected with each other to transmit a shift pulse, at least one of said one or more series-connection circuits including, among all stages thereof, a continuous stage group consisting of a plurality of continuous stages, each stage of the continuous stage group comprising: a first output transistor, having (i) a drain to which a first clock signal corresponding to said each stage is applied and (ii) a source serving as a first output terminal which is an output terminal of said each stage, an active clock pulse period of the first clock signal not overlapping a pulse period of a shift pulse for said each stage; a first capacitor, having one end connected with a gate of the first output transistor; an input gate, to which a shift pulse for said each stage is input and via which a potential to be supplied to said one end of the first capacitor is transmitted during a pulse period of the shift pulse for said each stage; a first switching element, having (i) one end connected with the other end of the first capacitor, (ii) the other end to which a first direct voltage is applied, and (iii) a conduction and blocking control terminal, to which the first clock signal is input; a second switching element, having (i) one end connected with the other end of the first capacitor, (ii) the other end to which a second direct voltage lower than the first direct voltage is applied, and (iii) a conduction and blocking control terminal to which a shift pulse for said each stage is input; a third switching element, having (i) one end connected with said one end of the first capacitor, (ii) the other end to which the second direct voltage is applied, and (iii) a conduction and blocking control terminal to which a pulse signal from an output terminal of a first predetermined other stage included in one of said one or more series-connection circuits is input, a phase of the pulse signal being retarded with respect to that of a shift pulse outputted from said each stage; and a fourth switching element, having (i) one end connected with the first output terminal, (ii) the other end to which the second direct voltage is applied, and (iii) a conduction and blocking control terminal to which a first conduction and blocking control signal corresponding to said each stage is input, an active period of the first conduction and blocking control signal not overlapping the active clock pulse period of the first clock signal.

With the invention, the first clock signal is inputted to the drain of the first output transistor, and a switched capacitor operation using the first switching element, the second switching element, and the first capacitor is carried out. Thus, in the case where the first clock signal is in a Low level, a variation in Low level signal from the first output terminal due to a noise, coupling etc. at one end of the first capacitor is less likely to appear.

Consequently, it is possible to prevent the increase in potential of the first output terminal due to variation in signal or leakage of signal when the output of the first output terminal is in a Low level. This prevents leakage of a potential from a picture element electrode and malfunction of a shift register due to the variation in signal or the increase in potential.

In order to solve the foregoing problems, a shift register of the present invention includes one or more series-connection circuits in each of which stages are series-connected with each other to transmit a shift pulse, at least one of said one or more series-connection circuits including, among all stages thereof, a continuous stage group consisting of a plurality of continuous stages, each stage of the continuous stage group comprising: a first output transistor, having (i) a drain to which a first clock signal corresponding to said each stage is applied and (ii) a source serving as a first output terminal which is an output terminal of said each stage, an active clock pulse period of the first clock signal not overlapping a pulse period of a shift pulse for said each stage; a first capacitor, having one end connected with a gate of the first output transistor; an input gate, to which a shift pulse for said each stage is input and via which a potential to be supplied to said one end of the first capacitor is transmitted during a pulse period of the shift pulse for said each stage; a first switching element, having (i) one end connected with the other end of the first capacitor, (ii) the other end to which a first direct voltage is applied, and (iii) a conduction and blocking control terminal, to which the first clock signal is input; a second switching element, having (i) one end connected with the other end of the first capacitor, (ii) the other end to which a fourth direct voltage lower than the first direct voltage is applied, and (iii) a conduction and blocking control terminal to which a shift pulse for said each stage is input; a third switching element, having (i) one end connected with said one end of the first capacitor, (ii) the other end to which the fourth direct voltage is applied, and (iii) a conduction and blocking control terminal to which a pulse signal from an output terminal of a first predetermined other stage included in one of said one or more series-connection circuits is input, a phase of the pulse signal being retarded with respect to that of a shift pulse outputted from said each stage; and a fourth switching element, having (i) one end connected with the first output terminal, (ii) the other end to which a second direct voltage which is lower than the first direct voltage and which is supplied independently of the fourth direct voltage is applied, and (iii) a conduction and blocking control terminal to which a first conduction and blocking control signal corresponding to said each stage is input, an active period of the first conduction and blocking control signal not overlapping the active clock pulse period of the first clock signal.

With the invention, the first clock signal is inputted to the drain of the first output transistor, and a switched capacitor operation using the first switching element, the second switching element, and the first capacitor is carried out. Thus, in the case where the first clock signal is in a Low level, a variation in Low level signal from the first output terminal due to a noise, coupling etc. at one end of the first capacitor is less likely to appear.

Consequently, it is possible to prevent the increase in potential of the first output terminal due to variation in signal or leakage of signal when the output of the first output terminal is in a Low level. This prevents leakage of a potential from a picture element electrode and malfunction of a shift register due to the variation in signal or the increase in potential.

Further, since the fourth direct voltage which is supplied independently of the second direct voltage is applied to the other end of the second switching element and the other end of the third switching element, adjustment of the fourth direct voltage enables changing the amplitude of a control signal for setting/resetting a shift register in a previous/subsequent stage, thereby reducing OFF leakage of the input gate and the first output transistor. Further, by setting the fourth voltage such that a threshold voltage of a transistor is less likely to change, it is possible to subdue a change with time of the performance of the transistor.

In order to solve the foregoing problems, the shift register of the present invention is arranged such that a phase of the first clock signal inputted to an odd-numbered stage of the continuous stage group is reverse to a phase of the first clock signal inputted to an even-numbered stage of the continues stage group, and a phase of a shift pulse inputted to a first stage of the continuous stage group is shifted by one-second cycle with respect to a phase of the first clock signal inputted to the odd-numbered stage of the continuous stage group.

With the invention, it is possible to easily cause a shift register to operate normally.

In order to solve the foregoing problems, the shift register of the present invention is arranged such that there are provided a first shift register including the series-connection circuit including at least one first continuous stage group including the continuous stage group and a second shift register including the series-connection circuit including at least one second continuous stage group including the continuous stage group different from said at least one first continuous stage group, said at least one second continuous stage group corresponding to said at least one first continuous stage group, respectively, with respect to each set of said at least one first continuous stage group and said corresponding at least one second continuous stage group, the following relations are met, a phase of the first clock signal inputted to an odd-numbered stage of said at least one first continuous stage group is reverse to a phase of the first clock signal inputted to an even-numbered stage of said at least one first continuous stage group, and a phase of the first clock signal inputted to an odd-numbered stage of said corresponding at least one second continuous stage group is reverse to a phase of the first clock signal inputted to an even-numbered stage of said corresponding at least one second continuous stage group, a phase of the first clock signal inputted to an odd-numbered stage of said corresponding at least one second continuous stage group is retarded by one-fourth cycle with respect to the phase of the first clock signal inputted to an odd-numbered stage of said at least one first continuous stage group, and a phase of the first clock signal inputted to an even-numbered stage of said corresponding at least one second continuous stage group is retarded by one-fourth cycle with respect to the phase of the first clock signal inputted to an even-numbered stage of said at least one first continuous stage group, a phase of a shift pulse inputted to a first stage of said at least one first continuous stage group is shifted by one-second cycle with respect to the phase of the first clock signal inputted to an odd-numbered stage of said at least one first continuous stage group, and a phase of a shift pulse inputted to a first stage of said corresponding at least one second continuous stage group is shifted by one-fourth cycle of the first clock signal with respect to the phase of the first clock signal inputted to a first stage of said at least one first continuous stage group.

With the invention, a picture element connected with a gate bus line in a display device can be precharged (i) during a horizontal period right before a horizontal period during which the gate bus line is selected for writing a data signal and (ii) by using a data signal for the horizontal period.

Consequently, in a case of source line reversal driving in which the polarity of a data signal in one data signal line is maintained during one frame period, it is possible to sufficiently charge picture elements to have a desired voltage by charging the picture elements for a long time. This increases a charging ratio of the picture elements, thereby improving display quality.

In order to solve the foregoing problems, the shift register of the present invention is arranged such that with respect to each set of said at least one first continuous stage group and said corresponding at least one second continuous stage group, the following relations are further met, a conduction and blocking control terminal of the third switching element included in j-th (j is a natural number) stage of said at least one first continuous stage group is connected with the first output terminal of j-th stage of said corresponding at least one second continuous stage group, and a conduction and blocking control terminal of the third switching element included in k-th (k is a natural number) stage of said corresponding at least one second continuous stage group is connected with the first output terminal of k+1-th stage of said at least one first continuous stage group.

With the invention, If the potential of one end of the first capacitor is reset, the first switching element is in an ON state, so that the other end of the first capacitor is not floating and therefore does not fall due to the potential from the one end of the first capacitor. For this reason, at any point of time after completion of output of the pulse from the first output terminal, the potential of the one end of the first capacitor in the stage can be prevented from being raised to cause a rise in the potential of the first output terminal.

This makes it possible to prevent a rise in the potential of the first output terminal from occurring due to the variation in the potential of one end of the first capacitor through capacitive coupling and to suppress leakage of charges from a liquid crystal picture element electrode and malfunction of a shift register.

In order to solve the foregoing problems, the shift register of the present invention is be arranged such that the input gate is a fifth switching element having (i) one end to which the first direct voltage is applied, (ii) the other end connected with said one end of the first capacitor, and (iii) a conduction and blocking control terminal to which the shift pulse for said each stage is input.

With the invention, it is possible to easily constitute an input gate.

In order to solve the foregoing problems, the shift register of the present invention is arranged such that the input gate is a fifth switching element having (i) one end to which a fifth direct voltage is applied, (ii) the other end connected with said one end of the first capacitor, and (iii) a conduction and blocking control terminal to which the shift pulse for said each stage is input.

With the invention, a potential supplied to one end of the first capacitor is set to the fifth direct voltage which is any voltage different from the first direct voltage. Thus, it is possible to prevent malfunction of a shift register.

In order to solve the foregoing problems, the shift register of the present invention is arranged such that the fifth switching element is a first transistor whose gate is a conduction and blocking control terminal, whose drain is one end of the fifth switching element, and whose source is connected with said one end of the first capacitor.

With the invention, it is possible to easily constitute the fifth switching element.

In order to solve the foregoing problems, the shift register of the present invention is arranged such that the input gate is a fifth switching element having (i) one end to which the shift pulse for said each stage is input, (ii) a conduction and blocking control terminal to which the shift pulse for said each stage is input, and (iii) the other end connected with said one end of the first capacitor.

With the invention, a shift pulse for the stage is inputted to one end of the fifth switching element and the conduction and blocking control terminal, and accordingly it is possible to reduce leakage of a current to one end of the first capacitor through an input gate. This enables subduing leakage of a current through the input gate, and preventing leakage of charges from a picture element electrode and malfunction of a shift register.

In order to solve the foregoing problems, the shift register of the present invention is arranged such that the fifth switching element is a first transistor whose drain and gate are connected with each other in such a manner that the first direct voltage is applied to the drain and the gate, and whose source is connected with said one end of the first capacitor.

With the invention, in a case where the first transistor is an amorphous silicon TFT, when the gate potential is lower than the source-drain potential, the threshold voltage gradually decreases due to a shift phenomenon, so that there is an increase in leak current from the first transistor. The occurrence of such a leak causes a rise in the potential of one end of the first capacitor, thus inviting leakage of charges from a liquid crystal picture element and malfunction of the shift register. However, since the same shift pulse as that inputted to the gate of the first transistor is inputted to the drain of the first transistor, the gate potential can be prevented from becoming lower than the drain potential. This makes it possible to suppress a decrease in the threshold voltage of the first transistor.

This enables subduing more amount of leakage of a current, thereby more satisfactorily preventing leakage of a potential from a picture element electrode and malfunction of a shift register.

In order to solve the foregoing problems, the shift register of the present invention is arranged such that the continuous stage group includes a continuous stage group in which each stage includes a sixth switching element having (i) one end connected with the other end of the first capacitor, (ii) the other end to which the first direct voltage is applied, and (iii) a conduction and blocking control terminal to which a same pulse signal as a pulse signal inputted to the conduction and blocking control terminal of the third switching element is input.

With the invention, the sixth switching element is put in an ON state at the same time as the third switching element is put in an ON state and the potential of one end of the first capacitor is reset. Therefore, the potential of the other end of the first capacitor is kept at a constant value of (the first direct voltage−the threshold voltage), so that the potential of the other end of the first capacitor can be prevented from falling due to capacitive coupling through the first capacitor. Therefore, it is possible to prevent a rise in the potential of the first output terminal from occurring due to the variation in the potential of one end of the first capacitor through capacitive coupling and to suppress leakage of charges from a liquid crystal picture element electrode and malfunction of the shift register.

In order to solve the foregoing problems, the shift register of the present invention is arranged such that the continuous stage group includes a continuous stage group in which the first switching element is a second transistor having (i) a gate serving as a conduction and blocking control terminal, (ii) a drain to which the first direct voltage is applied, and (iii) a source connected with the other side of the first capacitor, and each stage of the continuous stage group includes a third transistor having (i) a gate to which a signal with a phase opposite to that of the signal inputted to the gate of the second transistor is input, (ii) a drain connected with the other end of the first capacitor, and (iii) a source connected with the other end of the first capacitor.

With the invention, by inputting a signal whose phase is opposite to that inputted to the gate of the second transistor to the gate of the third transistor, the influence of charges that flows into one end of the first capacitor due to the gate-source capacitance of the second transistor can be offset by the charges of the gate-source and gate-drain capacitances of the third transistor thus taken in and sent out. Thus, it is possible to prevent a rise in the potential of the first output terminal from occurring due to the variation in the potential of the other end of the first capacitor through charge injection from the first switching element and to suppress leakage of charges from a liquid crystal picture element electrode and malfunction of the shift register.

In order to solve the foregoing problems, the shift register of the present invention is arranged such that a channel width of the third transistor is one-second of a channel width of the second transistor.

With the invention, the influence of charges that flows into one end of the first capacitor due to the gate-source capacitance of the second transistor can be offset by the charges of the gate-source and gate-drain capacitances of the third transistor thus taken in and sent out.

In order to solve the foregoing problems, the shift register of the present invention is arranged such that the continuous stage group includes a continuous stage group in which each stage includes a second capacitor connected between the gate of the third transistor and the other end of the first capacitor.

With the invention, when a signal inputted to the gate of the third transistor falls to a Low level, the potential of the other end of the first capacitor falls through the first capacitor and, further, the potential of one end of the first capacitor falls through the first capacitor. This makes it possible to surely put the first output transistor in an OFF state when the first output terminal is to be kept at a Low level, and to satisfactorily suppress a threshold-voltage shift phenomenon by reducing a direct-current voltage component that is applied to the gate of the first output transistor.

In order to solve the foregoing problems, the shift register of the present invention is arranged such that the continuous stage group includes a continuous stage group in which each stage includes a seventh switching element having (i) a conduction and blocking control terminal to which a signal having a High level period within a second active clock pulse period of the first clock signal after input of the shift pulse into said each stage, (ii) one end connected with said one end of the first capacitor, and (iii) the other end to which the second direct voltage is applied.

With the invention, it is possible to prevent a rise in the potential of the first output terminal from occurring due to the variation in the potential of one end of the first capacitor through capacitive coupling and to suppress leakage of charges from a liquid crystal picture element electrode and malfunction of a shift register.

In order to solve the foregoing problems, the shift register of the present invention is arranged such that the fourth switching element is a fourth transistor having (i) a gate serving as a conduction and blocking control terminal, (ii) a drain connected with the first output terminal, and (iii) a source to which the second direct voltage is applied, and the continuous stage group includes a continuous stage group in which each stage includes a fifth transistor having (i) a gate to which a shift pulse outputted from a stage different from said each stage firstly after said each stage has completely output the shift pulse is inputted, (ii) a drain connected with the first output terminal of said each stage, and (iii) a source to which the second direct voltage is applied.

With the invention, it is possible to achieve a sharp fall in waveform of a pulse outputted from the first output terminal. This can prevent an unnecessary lengthening of the charging time from causing data that is supposed to be written into a picture element connected to the gate bus line of the next stage to be written into a picture element connected to the gate bus line of the present stage and thereby improve display quality.

In order to solve the foregoing problems, the shift register of the present invention is arranged such that the first conduction and blocking control signal is a second clock signal whose phase is reverse to that of the first clock signal.

With the invention, every time the second clock signal is in an active period, the second direct voltage is applied to the first output terminal. This prevents a variation in the potential of the first output terminal.

In order to solve the foregoing problems, the shift register of the present invention is arranged such that the first conduction and blocking control signal is a pulse signal from an output terminal of a second predetermined other stage included in one of said one or more series-connection circuits, a phase of the pulse signal being retarded with respect to that of the shift pulse outputted from said each stage.

With the invention, the output from the second predetermined other stage is inputted to the conduction and blocking control terminal of the fourth switching element, so that there is no possibility that a clock feed through or a threshold voltage shift phenomenon due to input of a clock signal into the conduction and blocking control terminal occurs. Accordingly, it is possible to satisfactory prevent a variation in the potential of the first output terminal until a time when a next output of a stage is made from the first output terminal.

In order to solve the foregoing problems, the shift register of the present invention is arranged such that the continuous stage group includes a continuous stage group in which a shift pulse transmitted between stages is outputted from the source of the first output transistor.

With the invention, it is possible cause a shift register to operate properly.

In order to solve the foregoing problems, the shift register of the present invention is arranged such that the continuous stage group includes a plural output continuous stage group in which each stage includes a second output transistor which is an output transistor having (i) a gate connected with said one end of the first capacitor, (ii) a drain to which the first clock signal is input, and (iii) a source serving as a second output terminal different from the first output terminal of said each stage, and a shift pulse transmitted between stages is outputted from the second output transistor.

The shift register of the present invention may be arranged so as to further include an eighth switching element having (i) one end connected with the second output terminal, (ii) the other end to which the second direct voltage is applied, and (iii) a conduction and blocking control terminal to which a second conduction and blocking control signal corresponding to said each stage is input, an active period of the second conduction and blocking control signal not overlapping that of the first clock signal.

With the invention, it is possible to prevent a rise in the potential of one end of the first capacitor due to capacitive coupling and prevent a rise in an output from the second output terminal during an unnecessary period, thereby preventing malfunction of the shift register. Further, it is possible to reduce the number of required input signals externally supplied to the shift register.

Further, since the second output transistor is used for outputting a shift pulse transmitted between the stages, the second output transistor can be greatly downsized compared with the first output transistor used for outputting a signal to the outside of the shift register. Consequently, the drain parasitic capacitor of the second output transistor is sufficiently smaller than the drain parasitic capacitor and the source parasitic capacitor of the first output transistor and the first capacitor. Therefore, even when the first clock signal is inputted to the drain of the second output transistor, it is possible to lessen as small as possible the influence of a rise in the potential of one end of the first capacitor due to capacitive coupling.

Further, a load driven by the second output terminal is sufficiently smaller than a load driven by the first output terminal. Therefore, the amount of a variation in the load of an external level shifter that generates a control signal for the shift register can be made insignificantly small.

In order to solve the foregoing problems, the shift register of the present invention is arranged such that the continuous stage group includes a plural output continuous stage group in which each stage includes a second output transistor which is an output transistor having (i) a gate connected with said one end of the first capacitor, (ii) a drain to which the first clock signal is input, and (iii) a source serving as a second output terminal different from the first output terminal of said each stage, and a shift pulse transmitted between stages is outputted from the second output transistor.

Further, the shift register of the present invention may be arranged so as to further include an eighth switching element having (i) one end connected with the second output terminal, (ii) the other end to which a fourth direct voltage which is lower than the first direct voltage and which is supplied independently of the second direct voltage is applied, and (iii) a conduction and blocking control terminal to which a second conduction and blocking control signal corresponding to said each stage is input, an active period of the second conduction and blocking control signal not overlapping that of the first clock signal.

With the invention, it is possible to prevent a rise in the potential of one end of the first capacitor due to capacitive coupling and prevent a rise in an output from the second output terminal during an unnecessary period, thereby preventing malfunction of the shift register. Further, it is possible to reduce the number of required input signals externally supplied to the shift register.

In order to solve the foregoing problems, the shift register of the present invention is arranged such that the continuous stage group includes a plural output continuous stage group in which each stage includes a second output transistor which is an output transistor having (i) a gate connected with said one end of the first capacitor, (ii) a drain to which the first clock signal is input, and (iii) a source serving as a second output terminal different from the first output terminal of said each stage, an output from the second output terminal of a stage subsequent to said each stage is inputted to the conduction and blocking control terminal of the third switching element, a shift pulse transmitted between stages is outputted from the source of the second output transistor, a phase of the first clock signal inputted to an odd-numbered stage of the continuous stage group is reverse to a phase of the first clock signal inputted to an even-numbered stage of the continues stage group, in the odd-numbered stage and the even-numbered stage in the continuous stage group, the first conduction and blocking control signal is a second clock signal whose phase is reverse to that of the first clock signal and whose pulse width is twice of that of the first clock signal, and a length of each of an active period and a non-active period of the second clock signal is equal to a length of continuous two periods of the first clock signal a former of which is a non-active period and a latter of which is an active period, and a shift pulse inputted to a first stage of the continuous stage group corresponds to one clock pulse of the first clock signal inputted to the even-numbered stage.

The shift register of the present invention may be arranged so as to further include an eighth switching element having (i) one end connected with the second output terminal, (ii) the other end to which the second direct voltage is applied, and (iii) a conduction and blocking control terminal to which a second conduction and blocking control signal corresponding to said each stage is input, an active period of the second conduction and blocking control signal not overlapping that of the first clock signal.

With the invention, in a case where a shift pulse is inputted to the stage so that the first output transistor is brought into an ON state by a potential of one end of the first capacitor (first direct voltage−threshold voltage), a pulse outputted from the first output terminal is outputted only during a period corresponding to two clock pulses during which a potential increases in a step-like manner. Meanwhile, a shift pulse outputted from the second output terminal is outputted only during a period corresponding to one clock pulse of the first clock signal and the second clock signal which period corresponds to a latter period of a pulse outputted from the first output terminal of the stage. Accordingly, during a former period of the pulse outputted from the first output terminal, pre-charging of a picture element is carried out, and during the latter period, main writing of a data signal is carried out and a shift pulse can be transmitted to the next stage.

Further, it is possible to reduce the number of shift pulses which are input signals necessary for obtaining a precharge output signal.

In order to solve the foregoing problems, the shift register of the present invention is arranged such that the continuous stage group includes a plural output continuous stage group in which each stage includes a second output transistor which is an output transistor having (i) a gate connected with said one end of the first capacitor, (ii) a drain to which the first clock signal is input, and (iii) a source serving as a second output terminal different from the first output terminal of said each stage, an output from the second output terminal of a stage subsequent to said each stage is inputted to the conduction and blocking control terminal of the third switching element, a shift pulse transmitted between stages is outputted from the source of the second output transistor, a phase of the first clock signal inputted to an odd-numbered stage of the continuous stage group is reverse to a phase of the first clock signal inputted to an even-numbered stage of the continues stage group, and a shift pulse inputted to a first stage of the continuous stage group corresponds to one clock pulse of the first clock signal inputted to the even-numbered stage.

Further, the shift register of the present invention may be arranged so as to further include an eighth switching element having (i) one end connected with the second output terminal, (ii) the other end to which the second direct voltage is applied, and (iii) a conduction and blocking control terminal to which a signal from the second output terminal of a stage subsequent to said each stage is input.

With the invention, in a case where a shift pulse is inputted to the stage so that the first output transistor is brought into an ON state by a potential of one end of the first capacitor (first direct voltage–threshold voltage), a pulse outputted from the first output terminal is outputted only during a period corresponding to two clock pulses during which a potential increases in a step-like manner. Meanwhile, a shift pulse outputted from the second output terminal is outputted only during a period corresponding to one clock pulse of the first clock signal which period corresponds to a latter period of a pulse outputted from the first output terminal of the stage. Accordingly, during a former period of the pulse outputted from the first output terminal, pre-charging of a picture element is carried out, and during the latter period, main writing of a data signal is carried out and a shift pulse can be transmitted to the next stage.

Further, it is possible to reduce the number of shift pulses which are input signals necessary for obtaining a precharge output signal.

In order to solve the foregoing problems, the shift register of the present invention may be arranged such that the plural output continuous stage group includes a plural output continuous stage group in which each stage includes a third output transistor having (i) a gate connected with said one of the first capacitor, (ii) a drain to which the first clock signal is input, and (iii) a source serving as a third output terminal different from the first output terminal and the second output terminal of said each stage, and a signal outputted from the third output transistor is inputted to the conduction and blocking control terminal of the third switching element of a stage with respect to which said each stage including the third output transistor serves as the first predetermined other stage.

Further, the shift register of the present invention may be arranged so as to further include a ninth switching element having (i) one end connected with the third output terminal, (ii) the other end to which the second direct voltage is applied, and (iii) a conduction and blocking control terminal to which a third conduction and blocking control signal corresponding to said each stage is input, an active period of the third conduction and blocking control signal not overlapping that of the first clock signal.

With the invention, a set signal to be outputted from one stage to other stage and a reset signal are separated from each other, so that interference between the set signal and the reset signal can be avoided.

In order to solve the foregoing problems, the shift register of the present invention is arranged such that the plural output continuous stage group includes a plural output continuous stage group in which each stage includes a third output transistor having (i) a gate connected with said one of the first capacitor, (ii) a drain to which the first clock signal is input, and (iii) a source serving as a third output terminal different from the first output terminal and the second output terminal of said each stage, and a signal outputted from the third output transistor is inputted to the conduction and blocking control terminal of the third switching element of a stage with respect to which said each stage including the third output transistor serves as the first predetermined other stage.

Further, the shift register of the present invention may be arranged so as to further include a ninth switching element having (i) one end connected with the second output terminal, (ii) the other end to which a sixth direct voltage which is lower than the first direct voltage and which is supplied independently of the second direct voltage is applied, and (iii) a conduction and blocking control terminal to which a third conduction and blocking control signal corresponding to said each stage is input, an active period of the third conduction and blocking control signal not overlapping that of the first clock signal.

With the invention, a set signal to be outputted from one stage to other stage and a reset signal are separated from each other, so that an interference between the set signal and the reset signal can be avoided.

In order to solve the foregoing problems, the shift register of the present invention is arranged such that the continuous stage group includes a plural output continuous stage group in which each stage includes a second output transistor which is an output transistor having (i) a gate connected with said one end of the first capacitor, (ii) a drain to which the first direct voltage is applied, and (iii) a source serving as a second output terminal different from the first output terminal of said each stage, and an eighth switching element having (i) one end connected with the second output terminal, (ii) the other end to which the second direct voltage is applied, and (iii) a conduction and blocking control terminal to which a second conduction and blocking control signal corresponding to said each stage is input, an active period of the second conduction and blocking control signal not overlapping that of the first clock signal, and a shift pulse transmitted between stages is outputted from the source of the second output transistor.

With the invention, output from a stage to the outside of the shift register and output of control signals for setting/resetting another stage such as a previous stage and a next stage are separate from each other. This makes it possible to avoid interference between these outputs. Therefore, it is possible to prevent malfunction of the shift register or deterioration in performance of the shift register due to the interference between the output to the outside of the shift register and the output of the control signals for setting/resetting another stage.

In order to solve the foregoing problems, the shift register of the present invention is arranged such that the continuous stage group includes a plural output continuous stage group in which each stage includes a second output transistor which is an output transistor having (i) a gate connected with said one end of the first capacitor, (ii) a drain to which the first direct voltage is applied, and (iii) a source serving as a second output terminal different from the first output terminal of said each stage, and an eighth switching element having (i) one end connected with the second output terminal, (ii) the other end to which a fourth direct voltage which is lower than the first direct voltage and which is supplied independently of the second direct voltage is applied, and (iii) a conduction and blocking control terminal to which a second conduction and blocking control signal corresponding to said each stage is input, an active period of the second conduction and blocking control signal not overlapping that of the first clock signal, and a shift pulse transmitted between stages is outputted from the source of the second output transistor.

With the invention, output from a stage to the outside of the shift register and output of control signals for setting/resetting another stage such as a previous stage and a next stage are separate from each other. This makes it possible to avoid interference between these outputs. Therefore, it is possible to prevent malfunction of the shift register or deterioration in performance of the shift register due to the interference between the output to the outside of the shift register and the output of the control signals for setting/resetting another stage.

In order to solve the foregoing problems, the shift register of the present invention is arranged such that the plural output continuous stage group includes a plural output continuous stage group in which each stage includes a third output transistor having (i) a gate connected with said one end of the first capacitor, (ii) a drain to which the first direct voltage is applied, and (iii) a source serving as a third output terminal different from the first output terminal and the second output terminal of said each stage, and a ninth switching element having (i) one end connected with the third output terminal, (ii) the other end to which the second direct voltage is applied, and (iii) a conduction and blocking control terminal to which a third conduction and blocking control signal corresponding to said each stage is input, an active period of the third conduction and blocking control signal not overlapping that of the first clock signal, and a signal outputted from the source of the third output transistor is inputted to the conduction and blocking control terminal of the third switching element of a stage with respect to which said each stage including the third output transistor serves as the first predetermined other stage.

With the invention, a set signal to be outputted from one stage to other stage and a reset signal are separated from each other, so that interference between the set signal and the reset signal can be avoided.

In order to solve the foregoing problems, the shift register of the present invention is arranged such that the plural output continuous stage group includes a plural output continuous stage group in which each stage includes a third output transistor having (i) a gate connected with said one end of the first capacitor, (ii) a drain to which the first direct voltage is applied, and (iii) a source serving as a third output terminal different from the first output terminal and the second output terminal of said each stage, and a ninth switching element having (i) one end connected with the second output terminal, (ii) the other end to which a sixth direct voltage which is lower than the first direct voltage and which is supplied independently of the second direct voltage is applied, and (iii) a conduction and blocking control terminal to which a third conduction and blocking control signal corresponding to said each stage is input, an active period of the third conduction and blocking control signal not overlapping that of the first clock signal, and a signal outputted from the source of the third output transistor is inputted to the conduction and blocking control terminal of the third switching element of a stage with respect to which said each stage including the third output transistor serves as the first predetermined other stage.

With the invention, a set signal to be outputted from one stage to other stage and a reset signal are separated from each other, so that interference between the set signal and the reset signal can be avoided.

In order to solve the foregoing problems, the shift register of the present invention is arranged such that the continuous stage group includes a plural output continuous stage group in which each stage includes a second output transistor which is an output transistor having (i) a gate connected with said one end of the first capacitor, (ii) a drain to which a third direct voltage which is higher than the second direct voltage and which is supplied independently of the first direct voltage is applied, and (iii) a source serving as a second output terminal different from the first output terminal of said each stage, and an eighth switching element having (i) one end connected with the second output terminal, (ii) the other end to which the second direct voltage is applied, and (iii) a conduction and blocking control terminal to which a second conduction and blocking control signal corresponding to said each stage is input, an active period of the second conduction and blocking control signal not overlapping that of the first clock signal, and a shift pulse transmitted between stages is outputted from the source of the second output transistor.

With the invention, output from a stage to the outside of the shift register and output of control signals for setting/resetting another stage such as a previous stage and a next stage are separate from each other. This makes it possible to avoid interference between these outputs. Therefore, it is possible to prevent malfunction of the shift register or deterioration in performance of the shift register due to the interference between the output to the outside of the shift register and the output of the control signals for setting/resetting another stage.

Since the third direct voltage is applied to the drain of the second output transistor which is a transistor that outputs control signals for setting/resetting another stage, it is possible to set an amplitude of the control signals. This improves ON-current and OFF-leak characteristics of the second output transistor, and enables the shift register to operate more stably while preventing a malfunction in the shift register. Further, in a case where the third direct voltage is set to prevent a variation in the threshold voltage due to a shift phenomenon caused by a difference among a gate potential, a source potential, and a drain potential of the second output transistor, it is possible to make a more reliable shift register.

In order to solve the foregoing problems, the shift register of the present invention is arranged such that the continuous stage group includes a plural output continuous stage group in which each stage includes a second output transistor which is an output transistor having (i) a gate connected with said one end of the first capacitor, (ii) a drain to which a third direct voltage which is higher than the second direct voltage and which is supplied independently of the first direct voltage is applied, and (iii) a source serving as a second output terminal different from the first output terminal of said each stage, and an eighth switching element having (i) one end connected with the second output terminal, (ii) the other end to which a fourth direct voltage which is lower than the first direct voltage and which is supplied independently of the second direct voltage is applied, and (iii) a conduction and blocking control terminal to which a second conduction and blocking control signal corresponding to said each stage is input, an active period of the second conduction and blocking control signal not overlapping that of the first clock signal, and a shift pulse transmitted between stages is outputted from the source of the second output transistor.

With the invention, output from a stage to the outside of the shift register and output of control signals for setting/resetting another stage such as a previous stage and a next stage are separate from each other. This makes it possible to avoid interference between these outputs. Therefore, it is possible to prevent malfunction of the shift register or deterioration in performance of the shift register due to the interference between the output to the outside of the shift register and the output of the control signals for setting/resetting another stage.

In order to solve the foregoing problems, the shift register of the present invention may be arranged such that the plural output continuous stage group includes a plural output continuous stage group in which each stage includes a third output transistor having (i) a gate connected with said one end of the first capacitor, (ii) a drain to which the third direct voltage is applied, and (iii) a source serving as a third output terminal different from the first output terminal and the second output terminal of said each stage, and a ninth switching element having (i) one end connected with the third output terminal, (ii) the other end to which the second direct voltage is applied, and (iii) a conduction and blocking control terminal to which a third conduction and blocking control signal corresponding to said each stage is input, an active period of the third conduction and blocking control signal not overlapping that of the first clock signal, and a signal outputted from the source of the third output transistor is inputted to the conduction and blocking control terminal of the third switching element of a stage with respect to which said each stage including the third output transistor serves as the first predetermined other stage.

With the invention, a set signal to be outputted from one stage to other stage and a reset signal are separated from each other, so that interference between the set signal and the reset signal can be avoided.

The shift register of the present invention is arranged such that the plural output continuous stage group includes a plural output continuous stage group in which each stage includes a third output transistor having (i) a gate connected with said one end of the first capacitor, (ii) a drain to which the third direct voltage is applied, and (iii) a source serving as a third output terminal different from the first output terminal and the second output terminal of said each stage, and a ninth switching element having (i) one end connected with the second output terminal, (ii) the other end to which a sixth direct voltage which is lower than the first direct voltage and which is supplied independently of the second direct voltage is applied, and (iii) a conduction and blocking control terminal to which a third conduction and blocking control signal corresponding to said each stage is input, an active period of the third conduction and blocking control signal not overlapping that of the first clock signal, and a signal outputted from the source of the third output transistor is inputted to the conduction and blocking control terminal of the third switching element of a stage with respect to which said each stage including the third output transistor serves as the first predetermined other stage.

With the invention, a set signal to be outputted from one stage to other stage and a reset signal are separated from each other, so that interference between the set signal and the reset signal can be avoided.

In order to solve the foregoing problems, the shift register of the present invention may be arranged such that the second conduction and blocking control signal is a second clock signal whose phase is reverse to that of the first clock signal.

With the invention, a clock signal for other stage also serves as the second conduction and blocking control signal.

In order to solve the foregoing problems, the shift register of the present invention is arranged such that the second conduction and blocking control signal is a pulse signal outputted from an output terminal of a third predetermined other stage included in one of said one or more series-connection circuits, and a phase of the second conduction and blocking control signal is retarded with respect to that of the shift pulse outputted from said each stage.

With the invention, the second conduction and blocking control signal is made active only at minimum number of resetting, so that the conduction and blocking control signal of the eighth switching element is as free as possible from deterioration factors such as a shift phenomenon of a threshold voltage.

In order to solve the foregoing problems, the shift register of the present invention is arranged such that the third conduction and blocking control signal is a second clock signal whose phase is reverse to that of the first clock signal.

With the invention, a clock signal for other stage also serves as the second conduction and blocking control signal.

In order to solve the foregoing problems, the shift register of the present invention is arranged such that the third conduction and blocking control signal is a pulse signal outputted from an output terminal of a third predetermined other stage included in one of said one or more series-connection circuits, and a phase of the third conduction and blocking control signal is retarded with respect to that of the shift pulse outputted from said each stage.

With the invention, the second conduction and blocking control signal is made active only at minimum number of resetting, so that the conduction and blocking control signal of the eighth switching element is as free as possible from deterioration factors such as a shift phenomenon of a threshold voltage.

In order to solve the foregoing problems, the shift register of the present invention is arranged such that the continuous stage group includes a continuous stage group in which each stage further includes a tenth switching element having (i) one end connected with said one end of the first capacitor, (ii) the other end to which the second direct voltage is applied, and (iii) a conduction and blocking control terminal to which a signal which gets in an active level with predetermined timing is input.

With the invention, input of the active level signal to the conduction and blocking control terminal of the tenth switching element allows forcing a potential of one end of the first capacitor to be fixed to the second direct voltage. This enables the shift register to have a clear function of arbitrarily clearing one end of the first capacitor.

In order to solve the foregoing problems, the shift register of the present invention is arranged such that the continuous stage group includes a continuous stage group in which each stage further includes a tenth switching element having (i) one end connected with said one end of the first capacitor, (ii) the other end to which a fourth direct voltage which is lower than the first direct voltage and which is supplied independently of the second direct voltage is applied, and (iii) a conduction and blocking control terminal to which a signal which gets in an active level with predetermined timing is input.

With the invention, input of the active level signal to the conduction and blocking control terminal of the tenth switching element allows forcing a potential of one end of the first capacitor to be fixed to the fourth direct voltage. This enables the shift register to have a clear function of arbitrarily clearing one end of the first capacitor.

In order to solve the foregoing problems, the shift register of the present invention is arranged so as to further include a sixth transistor whose drain and source connection is positioned within a connection between a gate and a source of the output transistor, a voltage equal to that applied to the drain of the output transistor with which the drain and source connection of the sixth transistor is connected being applied to a gate of the sixth transistor.

With the invention, when an increased voltage is applied to one end of the first capacitor during no output period of the stage, the potential of the one end is decreased by connecting the one end to a low potential side via the sixth transistor.

Therefore, even if leakage occurs in the second switching element, it is possible to prevent an increased voltage from being applied to the one end of the first capacitor during no output period, so that unnecessary output is not made from the stage.

In order to solve the foregoing problems, the shift register of the present invention is arranged so as to further include a sixth transistor whose drain and source connection is positioned within a connection between a gate of the output transistor and a terminal to which the second direct voltage is applied, a voltage equal to that applied to the drain of the output transistor with which the drain and source connection of the sixth transistor is connected being applied to a gate of the sixth transistor.

With the invention, when an increased voltage is applied to one end of the first capacitor during no output period of the stage, the potential of the one end is decreased by connecting the one end to a low potential side via the sixth transistor.

Therefore, even if leakage occurs in the second switching element, it is possible to prevent an increased voltage from being applied to the one end of the first capacitor during no output period, so that unnecessary output is not made from the stage.

In order to solve the foregoing problems, the shift register of the present invention may be arranged so as to further include a sixth transistor whose drain and source connection is positioned within a connection between a gate and a source of the output transistor, and whose gate is connected with the other end of the first capacitor.

With the invention, when an increased voltage is applied to one end of the first capacitor during no output period of the stage, the potential of the one end is decreased by connecting the one end to a low potential side via the sixth transistor.

Therefore, even if leakage occurs in the second switching element, it is possible to prevent an increased voltage from being applied to one end of the first capacitor during no output period, so that unnecessary output is not made from the stage.

Further, by causing a voltage between the gate and the source of the sixth transistor to be a voltage less than the first direct voltage, it is possible to further suppress deterioration in the sixth transistor. Further, this makes it unnecessary to increase the sixth transistor in its size in order to compensate for the deterioration. Further, the voltage between the gate and the source of the sixth transistor becomes small during a period when the other end of the first capacitor is put in a Low level by the second direct voltage. This makes it possible to reduce direct current bias components to be applied to the gate of the sixth transistor whereby deterioration in the sixth transistor is further suppressed.

In order to solve the foregoing problems, the shift register of the present invention is arranged so as to further include a sixth transistor whose drain and source connection is positioned within a connection between a gate of the output transistor and a terminal to which the second direct voltage is applied, and whose gate is connected with the other end of the first capacitor.

With the invention, when an increased voltage is applied to one end of the first capacitor during no output period of the stage, the potential of the one end is decreased by connecting the one end to a low potential side via the sixth transistor.

Therefore, even if leakage occurs in the second switching element, it is possible to prevent an increased voltage from being applied to the one end of the first capacitor during no output period, so that unnecessary output is not made from the stage.

Further, by causing a voltage between the gate and the source of the sixth transistor to be a voltage less than the first direct voltage, it is possible to further suppress deterioration in the sixth transistor. Further, this makes it unnecessary to increase the sixth transistor in its size in order to compensate for the deterioration. Further, the voltage between the gate and the source of the sixth transistor becomes small during a period when the other end of the first capacitor is put in a Low level by the second direct voltage. This makes it possible to reduce direct current bias components to be applied to the gate of the sixth transistor whereby deterioration in the sixth transistor is further suppressed.

In order to solve the foregoing problems, the shift register of the present invention is arranged so as to further include a sixth transistor whose drain and a source connection is positioned within a connection between a gate and a source of the output transistor, the first clock signal being input to a gate of the sixth transistor.

With the invention, when an increased voltage is applied to one end of the first capacitor during no output period of the stage, the potential of the one end is decreased by connecting the one end to a low potential side via the sixth transistor.

Therefore, even if leakage occurs in the second switching element, it is possible to prevent an increased voltage from being applied to one end of the first capacitor during no output period, so that unnecessary output is not made from the stage.

Further, the active gate voltage of the sixth transistor is ½ duty of the first clock signal. Consequently, the direct current bias components to be applied to the gate of the sixth transistor are greatly reduced, and deterioration in the sixth transistor is further reduced. As a result, the sixth transistor can be further decreased in its size.

In order to solve the foregoing problems, the shift register of the present invention is arranged so as to further include a sixth transistor whose drain and source connection is positioned within a connection between a gate of the output transistor and a terminal to which the second direct voltage is applied, the first clock signal being input to a gate of the sixth transistor.

With the invention, when an increased voltage is applied to one end of the first capacitor during no output period of the stage, the potential of the one end is decreased by connecting the one end to a low potential side via the sixth transistor.

Therefore, even if leakage occurs in the second switching element, it is possible to prevent an increased voltage from being applied to one end of the first capacitor during no output period, so that unnecessary output is not made from the stage.

Further, the active gate voltage of the sixth transistor is ½ duty of the first clock signal. Consequently, the direct current bias components to be applied to the gate of the sixth transistor are greatly reduced, and deterioration in the sixth transistor is further reduced. As a result, the sixth transistor can be further decreased in its size.

In order to solve the foregoing problems, a shift register of the present invention includes one or more series-connection circuits in each of which stages are series-connected with each other to transmit a shift pulse, at least one of said one or more series-connection circuits including, among all stages thereof, a continuous stage group consisting of a plurality of continuous stages, each stage of the continuous stage group comprising: a first output transistor, having (i) a drain to which a first clock signal corresponding to said each stage is applied, an active clock pulse period of the first clock signal not overlapping a period of a shift pulse of said each stage, and (ii) a source serving as a first output terminal which is an output terminal of said each stage; a first capacitor, having one end connected with a gate of the first output transistor; an input gate, to which a shift pulse for said each stage is input and via which a potential to be supplied to said one end of the first capacitor is transmitted during a pulse period of the shift pulse for said each stage; a first switching element, having (i) one end connected with the other end of the first capacitor, (ii) the other end to which the first direct voltage is applied, and (iii) a conduction and blocking control terminal to which the first clock signal is input; a second switching element, having (i) one end connected with the other end of the first capacitor, (ii) the other end to which a second direct voltage lower than the first direct voltage is applied, and (iii) a conduction and blocking control terminal to which a shift pulse for said each stage is input; and a third switching element, having (i) one end connected with said one end of the first capacitor, (ii) the other end to which the second direct voltage is applied, and (iii) a conduction and blocking control terminal to which a pulse signal from an output terminal of a first predetermined other stage included in one of said one or more series-connection circuits is input, a phase of the pulse signal being retarded with respect to that of a shift pulse outputted from said each stage.

With the invention, it is possible to reduce the number of switching elements. This enables reducing the area of a circuit.

A shift register of the present invention includes one or more series-connection circuits in each of which stages are series-connected with each other to transmit a shift pulse, at least one of said one or more series-connection circuits including, among all stages thereof, a continuous stage group consisting of a plurality of continuous stages, each stage of the continuous stage group comprising: a first output transistor, having (i) a drain to which a first clock signal corresponding to said each stage is applied, an active clock pulse period of the first clock signal not overlapping a period of a shift pulse of said each stage, and (ii) a source serving as a first output terminal which is an output terminal of said each stage; a first capacitor, having one end connected with a gate of the first output transistor; an input gate, to which a shift pulse for said each stage is input and via which a potential to be supplied to said one end of the first capacitor is transmitted during a pulse period of the shift pulse for said each stage; a first switching element, having (i) one end connected with the other end of the first capacitor, (ii) the other end to which the first direct voltage is applied, and (iii) a conduction and blocking control terminal to which the first clock signal is input; a second switching element, having (i) one end connected with the other end of the first capacitor, (ii) the other end to which a fourth direct voltage lower than the first direct voltage is applied, and (iii) a conduction and blocking control terminal to which a shift pulse for said each stage is input; and a third switching element, having (i) one end connected with said one end of the first capacitor, (ii) the other end to which the fourth direct voltage is applied, and (iii) a conduction and blocking control terminal to which a pulse signal from an output terminal of a first predetermined other stage included in one of said one or more series-connection circuits is input, a phase of the pulse signal being retarded with respect to that of a shift pulse outputted from said each stage.

With the invention, it is possible to reduce the number of switching elements. This enables reducing the area of a circuit.

In order to solve the foregoing problems, a display device of the present invention includes the aforementioned shift register.

With the invention, it is possible to realize a display device capable of satisfactorily subduing noises in outputs from individual stages, without increasing the area of a circuit.

The present invention is not limited to the description of the embodiments above, but may be altered by a skilled person within the scope of the claims. An embodiment based on a proper combination of technical means disclosed in different embodiments is encompassed in the technical scope of the present invention.

INDUSTRIAL APPLICABILITY

The present invention can be preferably used in an active matrix display device.

REFERENCE SIGNS LIST

C1: capacitor (first capacitor)
C101: capacitor (second capacitor)
M1, M11: transistor (input gate, fifth switching element, first transistor)
M2: transistor (first switching element, second transistor)
M3: transistor (second switching element)
M4: transistor (third switching element)
M5: transistor (first output transistor)
M6: transistor (fourth switching element, fourth transistor)
M9: transistor (sixth transistor)
M91: transistor (sixth switching element)
M101: transistor (third transistor)
M111: transistor (seventh switching element)
M121: transistor (fifth transistor)
M141: transistor (second output transistor)
M142: transistor (eighth switching element)
M221: transistor (tenth switching element)
OUT: terminal (output terminal)
Z: terminal (output terminal, second output terminal)
VDD: power source voltage (first direct voltage)
VSS: power source voltage (second direct voltage)
Xi: stage
CLK1: clock signal (first clock signal of odd-numbered stage, first conduction and blocking control signal of even-numbered stage, second conduction and blocking control signal, second clock signal)
CLK2: clock signal (first conduction and blocking control signal of odd-numbered stage, second conduction and blocking control signal, second clock signal, first clock signal of even-numbered stage)

The invention claimed is:
1. A shift register, including one or more series-connection circuits in each of which stages are series-connected with each other to transmit a shift pulse,
at least one of said one or more series-connection circuits including, among all stages thereof, a continuous stage group consisting of a plurality of continuous stages, each stage of the continuous stage group comprising:
- a first output transistor, having (i) a drain to which a first direct voltage is applied and (ii) a source serving as a first output terminal which is an output terminal of said each stage;
- a first capacitor, having one end connected with a gate of the first output transistor;
- an input gate, to which a shift pulse for said each stage is input and via which a potential to be supplied to said one end of the first capacitor is transmitted during a pulse period of the shift Pulse for said each stage;
- a first switching element, having (i) one end connected with the other end of the first capacitor, (ii) the other end to which the first direct voltage is applied, and (iii) a conduction and blocking control terminal, to which a first clock signal corresponding to said each stage is input, an active clock pulse period of the first clock signal not overlapping the pulse period of the shift pulse for said each stage;
- a second switching element, having (i) one end connected with the other end of the first capacitor, (ii) the other end to which a second direct voltage lower than the first direct voltage is applied, and (iii) a conduction and blocking control terminal to which a shift pulse for said each stage is input;
- a third switching element, having (i) one end connected with said one end of the first capacitor, (ii) the other end to which the second direct voltage is applied, and (iii) a conduction and blocking control terminal to which a pulse signal from an output terminal of a first predetermined other stage included in one of said one or more series-connection circuits is input, a phase of the pulse signal being retarded with respect to that of a shift pulse outputted from said each stage; and
- a fourth switching element, having (i) one end connected with the first output terminal, (ii) the other end to which the second direct voltage is applied, and (iii) a conduction and blocking control terminal to which a first conduction and blocking control signal corresponding to said each stage is input, an active period of the first conduction and blocking control signal not overlapping the active clock pulse period of the first clock signal.

2. The shift register as set forth in claim 1, further comprising a sixth transistor whose drain and source connection is positioned within a connection between a gate and a source of the output transistor, a voltage equal to that applied to the drain of the output transistor with which the drain and source connection of the sixth transistor is connected being applied to a gate of the sixth transistor.

3. The shift register as set forth in claim 1, further comprising a sixth transistor whose drain and source connection is positioned within a connection between a gate of the output transistor and a terminal to which the second direct voltage is applied, a voltage equal to that applied to the drain of the output transistor with which the drain and source connection of the sixth transistor is connected being applied to a gate of the sixth transistor.

4. A display device, comprising a shift register as set forth in claim 1.

* * * * *